United States Patent
Ahn et al.

(10) Patent No.: US 12,329,012 B2
(45) Date of Patent: Jun. 10, 2025

(54) COLOR CONVERSION SUBSTRATE, METHOD OF MANUFACTURING COLOR CONVERSION SUBSTRATE, AND DISPLAY DEVICE

(71) Applicant: Samsung Display Co., LTD., Yongin-si (KR)

(72) Inventors: Jea Heon Ahn, Hwaseong-si (KR); Jang Il Kim, Anyang-si (KR); Jeong Ki Kim, Hwaseong-si (KR); Yeo Geon Yoon, Suwon-si (KR); Myoung Jong Lee, Cheonan-si (KR); Seok Joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 379 days.

(21) Appl. No.: 17/788,854

(22) PCT Filed: May 13, 2020

(86) PCT No.: PCT/KR2020/006285
§ 371 (c)(1),
(2) Date: Jun. 24, 2022

(87) PCT Pub. No.: WO2021/132814
PCT Pub. Date: Jul. 1, 2021

(65) Prior Publication Data
US 2023/0050227 A1    Feb. 16, 2023

(30) Foreign Application Priority Data

Dec. 24, 2019  (KR) .......................... 10-2019-0173759

(51) Int. Cl.
*H10K 59/38*    (2023.01)
*H10K 50/86*    (2023.01)
(Continued)

(52) U.S. Cl.
CPC ............ *H10K 59/38* (2023.02); *H10K 50/865* (2023.02); *G02B 5/201* (2013.01); *H10K 59/12* (2023.02)

(58) Field of Classification Search
CPC ...... H10K 59/38; H10K 50/865; H10K 59/12; H10K 59/879; H10K 50/86; H10K 59/35;
(Continued)

(56) References Cited

U.S. PATENT DOCUMENTS 9,431,463 B2   8/2016   Choi
10,361,259 B2  7/2019   Choi et al.
(Continued)

FOREIGN PATENT DOCUMENTS

CN    107957640 A      4/2018
KR    1020150129551 A  11/2015
(Continued)

OTHER PUBLICATIONS

Iternational Search Report—PCT/KR2020/006285 dated Sep. 24, 2020.

*Primary Examiner* — Elias Ullah
(74) *Attorney, Agent, or Firm* — CANTOR COLBURN LLP

(57) ABSTRACT

A color conversion substrate includes: a base part in which a first light-transmitting area and a second light-transmitting area are defined; a first stack disposed on the base part and a second stack disposed on the first stack; a first wavelength conversion pattern overlapping the second light-transmitting area, and disposed on the second stack, where the first wavelength conversion pattern converts light of a first color into light of a second color; and a light-transmitting pattern overlapping the first light-transmitting area and disposed between the first stack and the second stack, where portions of the first stack and the second stack in the second light-transmitting area are in direct contact with each other to constitute a blue light reflective layer.

23 Claims, 44 Drawing Sheets

(51) Int. Cl.
  *G02B 5/20* (2006.01)
  *H10K 59/12* (2023.01)
(58) Field of Classification Search
  CPC ............ H10K 59/8731; H10K 59/877; H10K 59/878; H10K 59/8792; G02B 5/201; G02B 5/206; G02B 5/223
  See application file for complete search history.

(56) References Cited

U.S. PATENT DOCUMENTS

| | | |
|---|---|---|
| 10,852,580 B2 | 12/2020 | Jung et al. |
| 10,948,777 B2 | 3/2021 | Ahn et al. |
| 11,029,544 B2 | 6/2021 | Jung et al. |
| 11,029,563 B2 | 6/2021 | Chu et al. |
| 11,650,441 B2 | 5/2023 | Jung et al. |
| 11,726,354 B2 | 8/2023 | Jung et al. |
| 2020/0381670 A1 | 12/2020 | Kim et al. |

FOREIGN PATENT DOCUMENTS

| | | |
|---|---|---|
| KR | 1020180018969 A | 2/2018 |
| KR | 1020180041809 | 4/2018 |
| KR | 1020180064616 | 6/2018 |
| KR | 1020190016631 | 2/2019 |
| KR | 1020190027006 A | 3/2019 |
| KR | 1020190047592 | 5/2019 |
| KR | 1020190055859 | 5/2019 |
| KR | 1020190090112 A | 8/2019 |
| KR | 1020190118224 A | 10/2019 |

【FIG. 1】
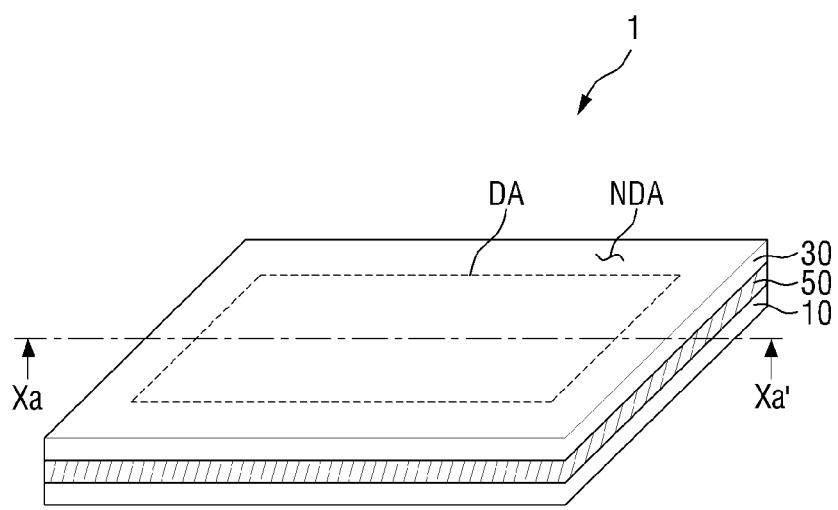
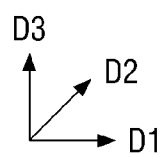

[FIG. 2]
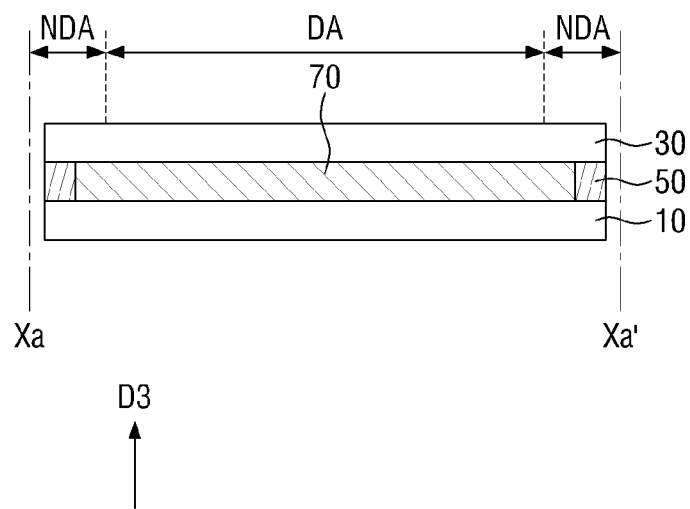

[FIG. 3]
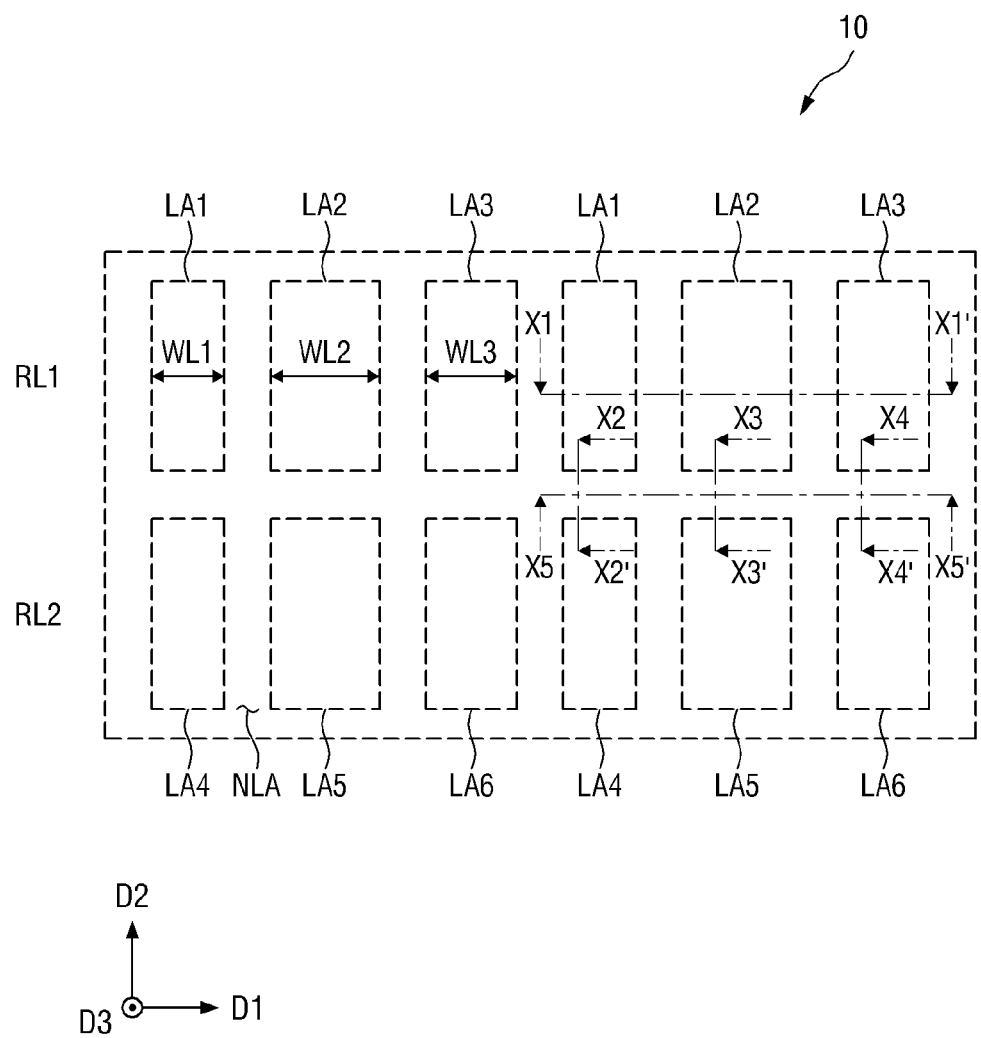

[FIG. 4]
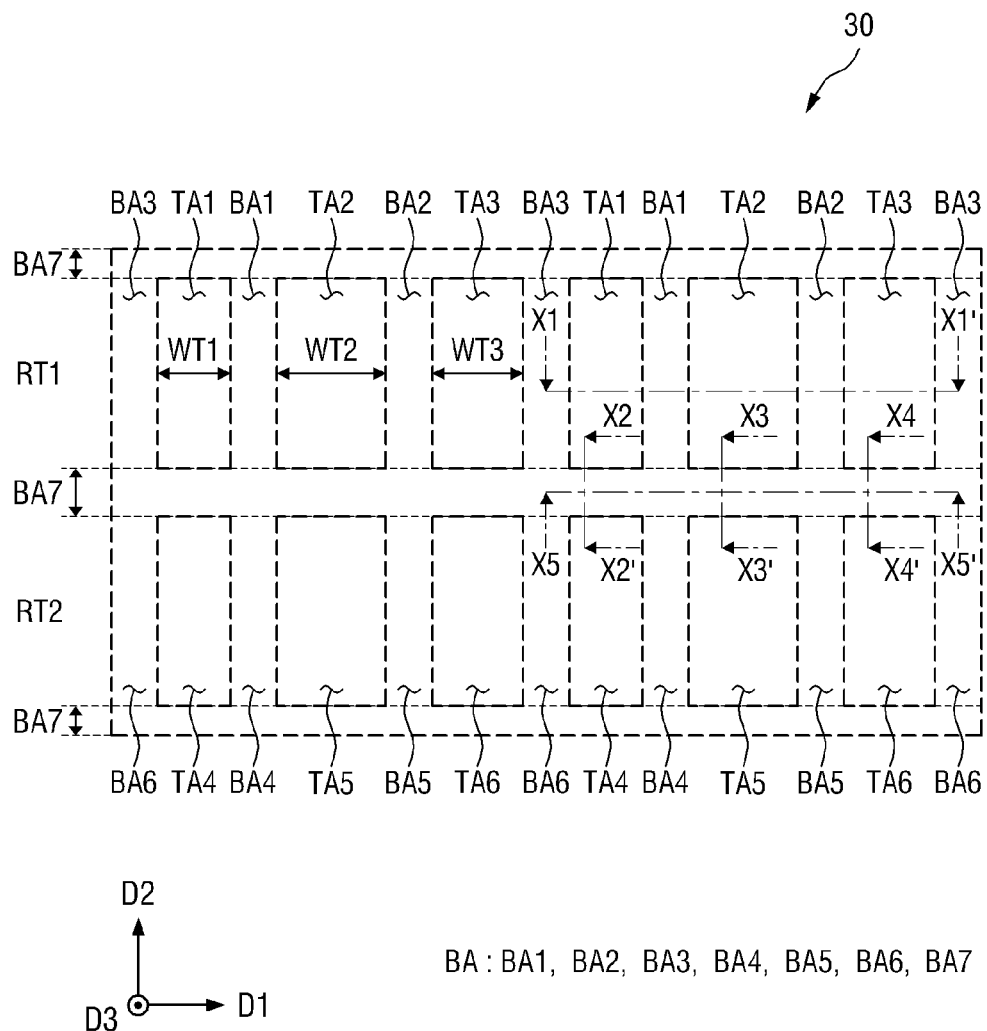

[FIG. 6]
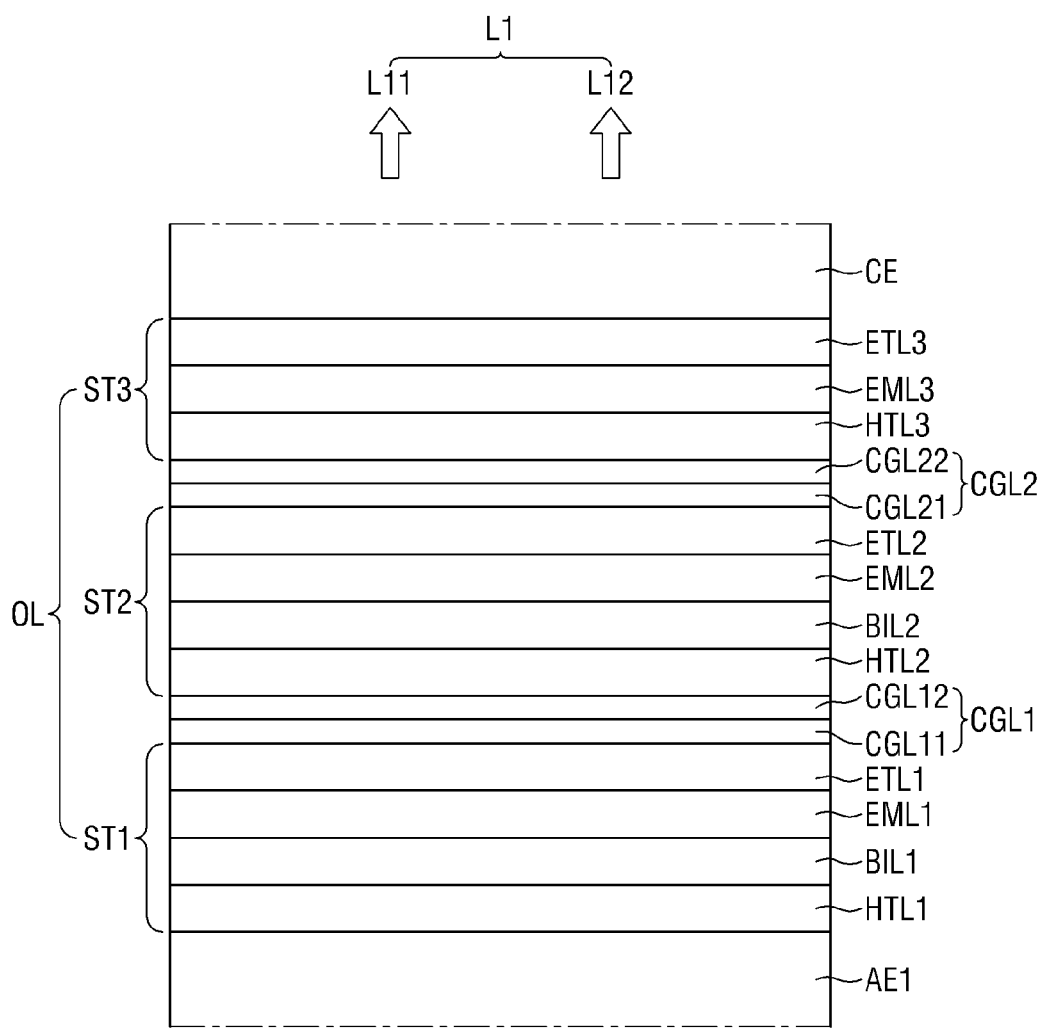

[FIG. 7]
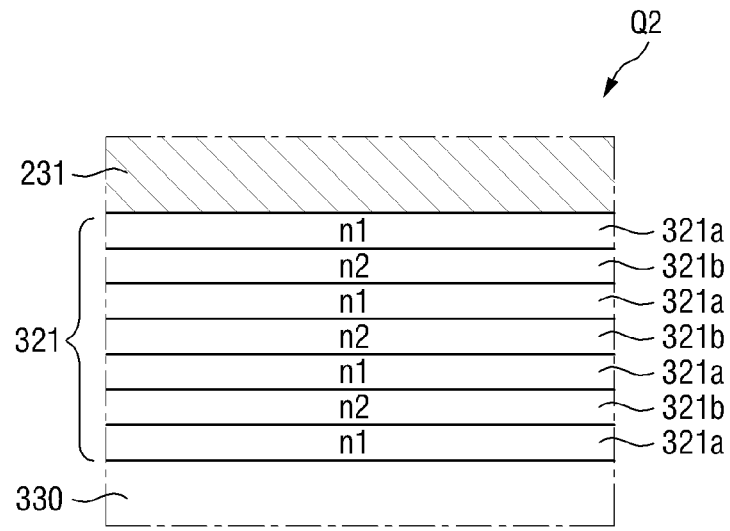
[FIG. 8]
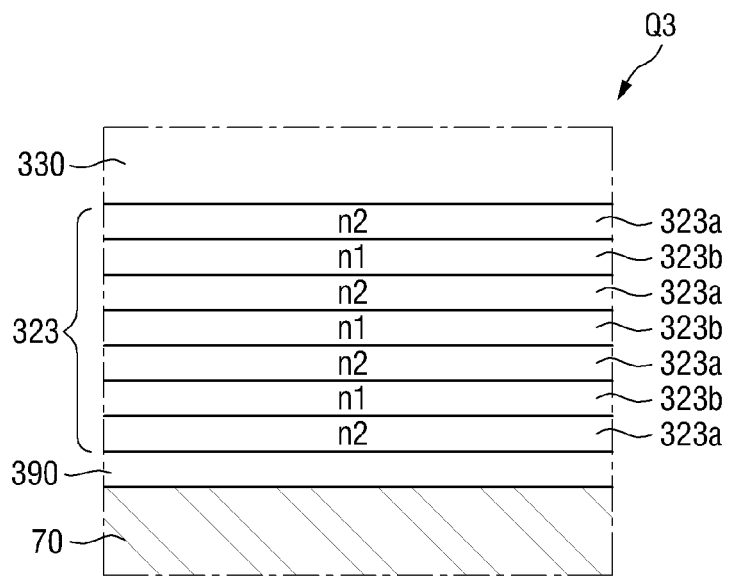

[FIG. 9]
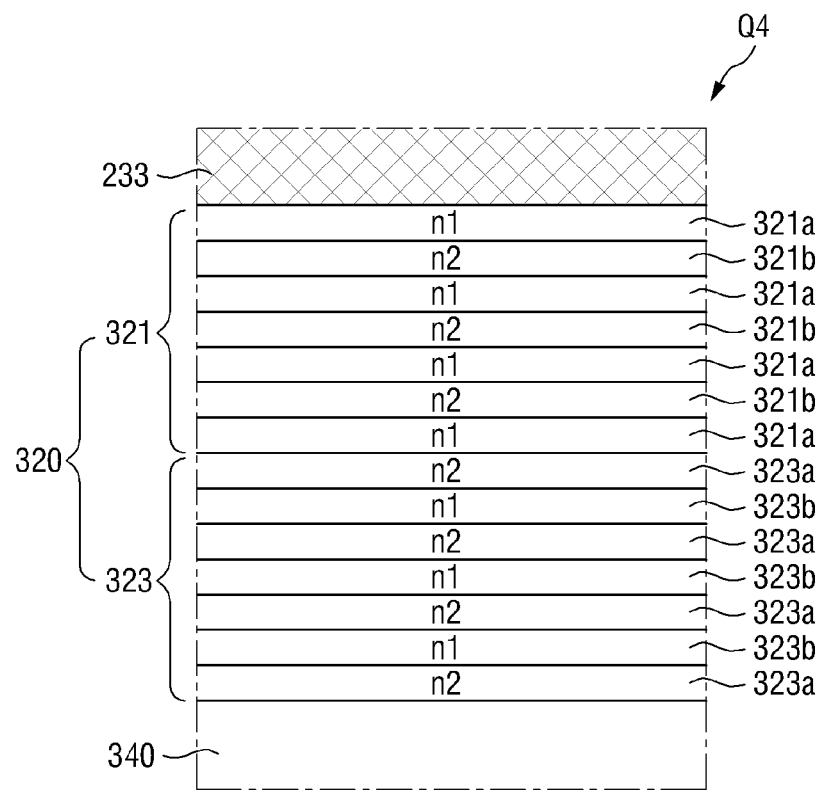
[FIG. 10]
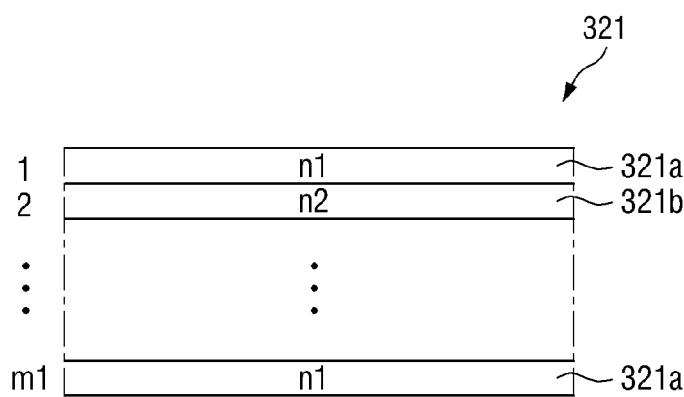

[FIG. 11]
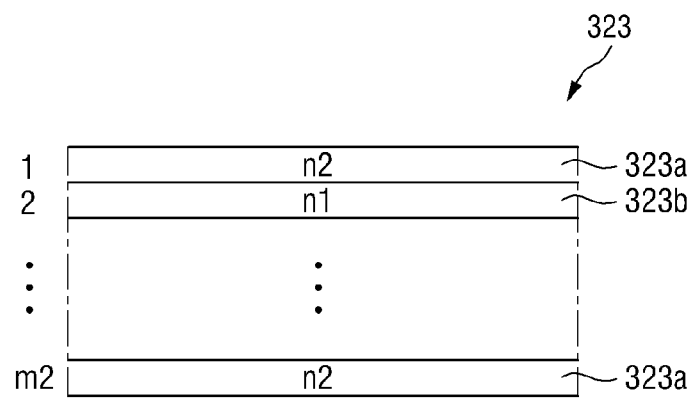
[FIG. 12]
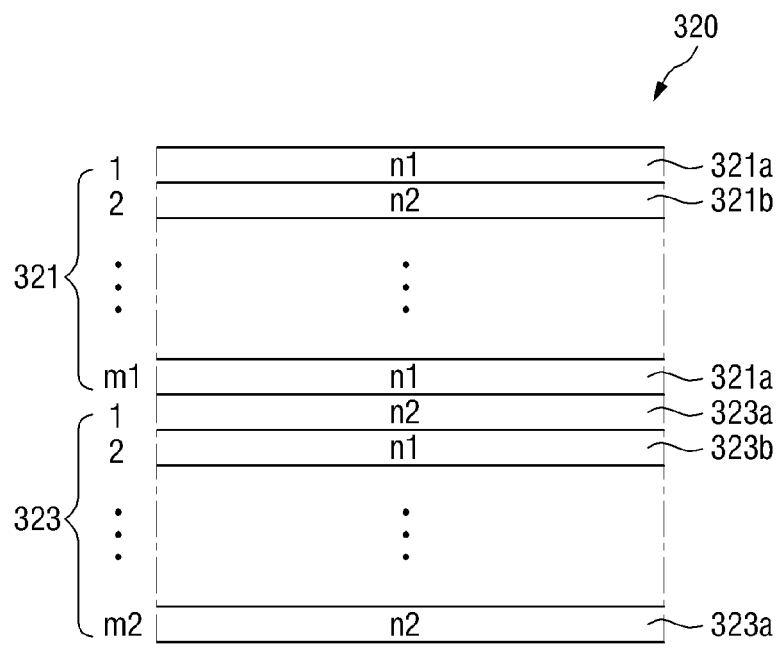

【FIG. 13】
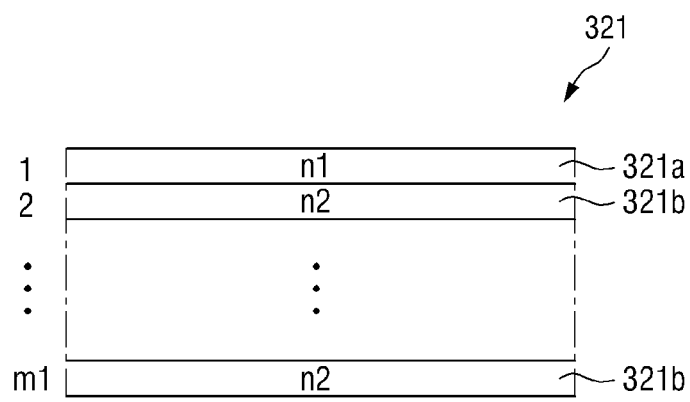
【FIG. 14】
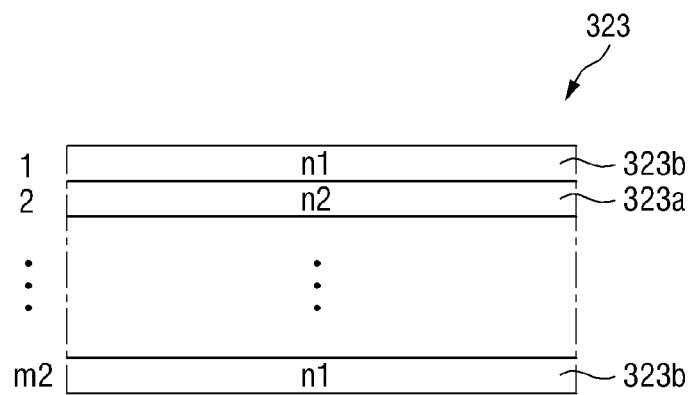

[FIG. 15]
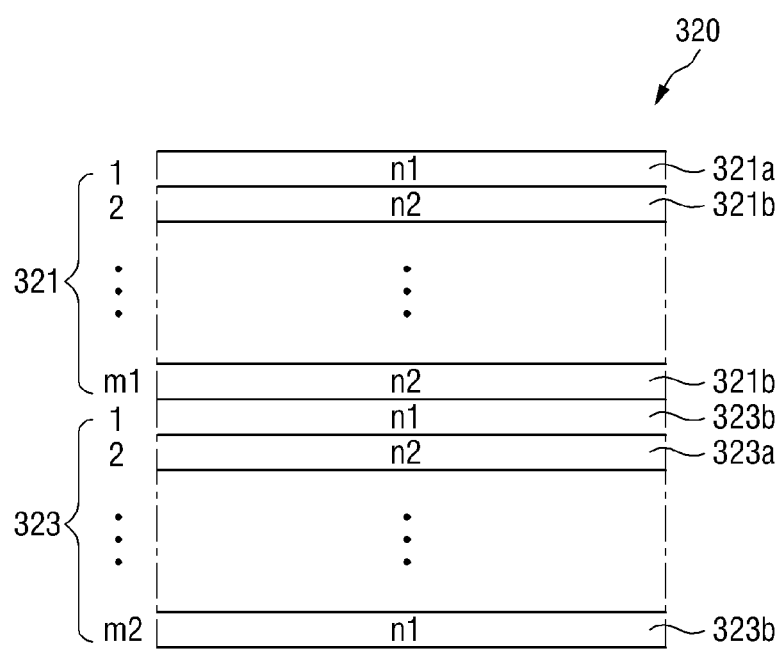

[FIG. 16]
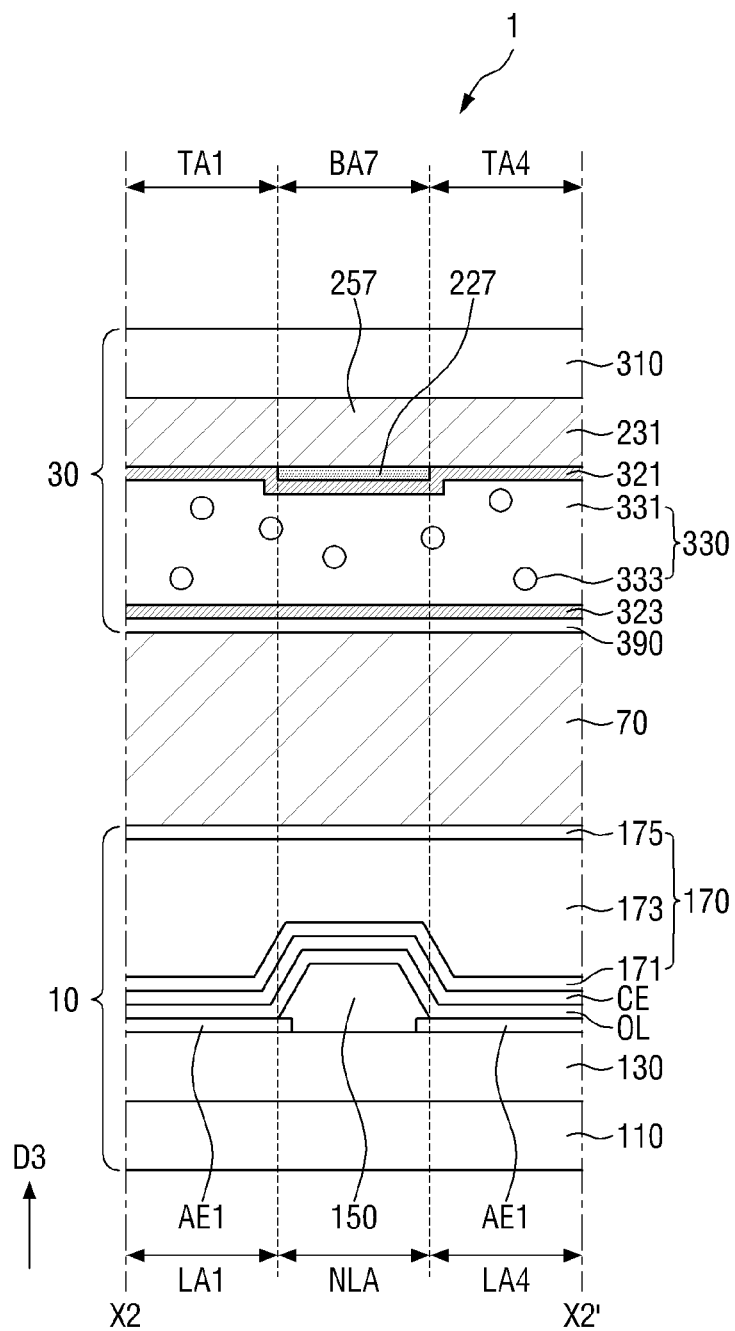

[FIG. 17]
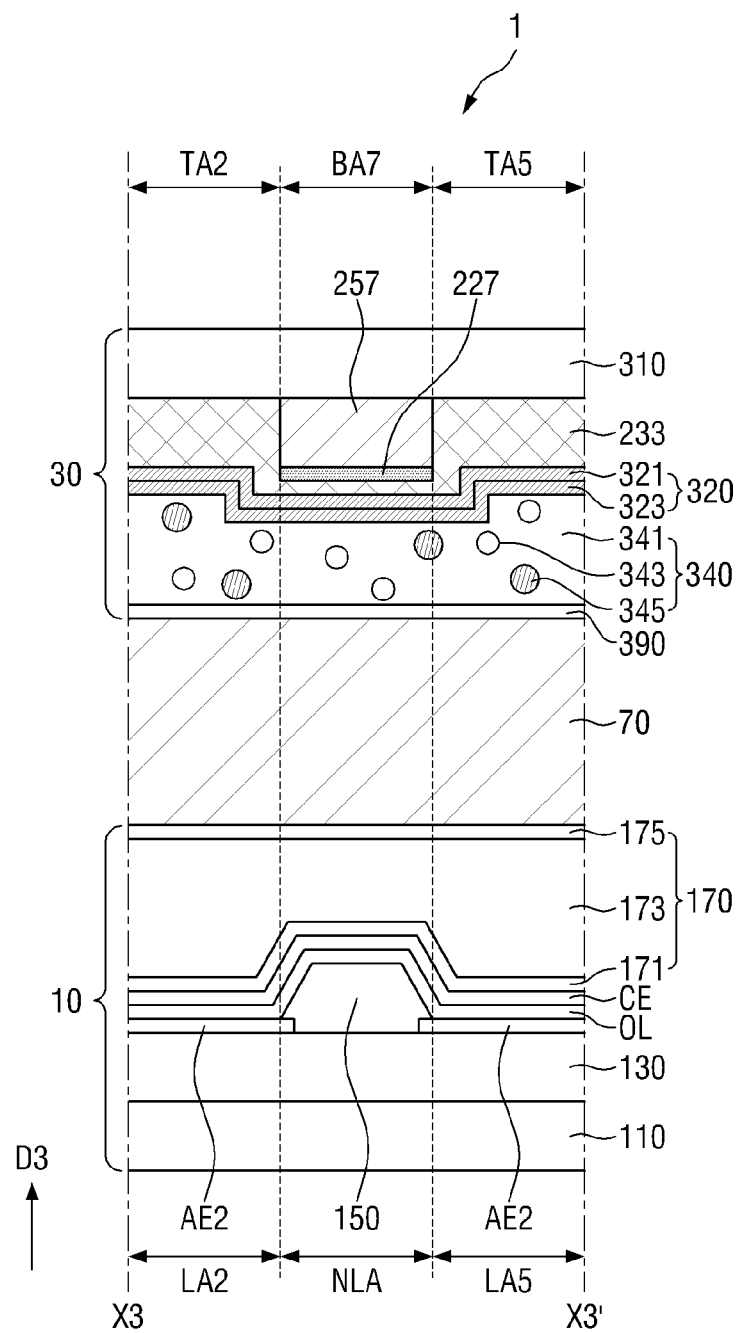

[FIG. 18]
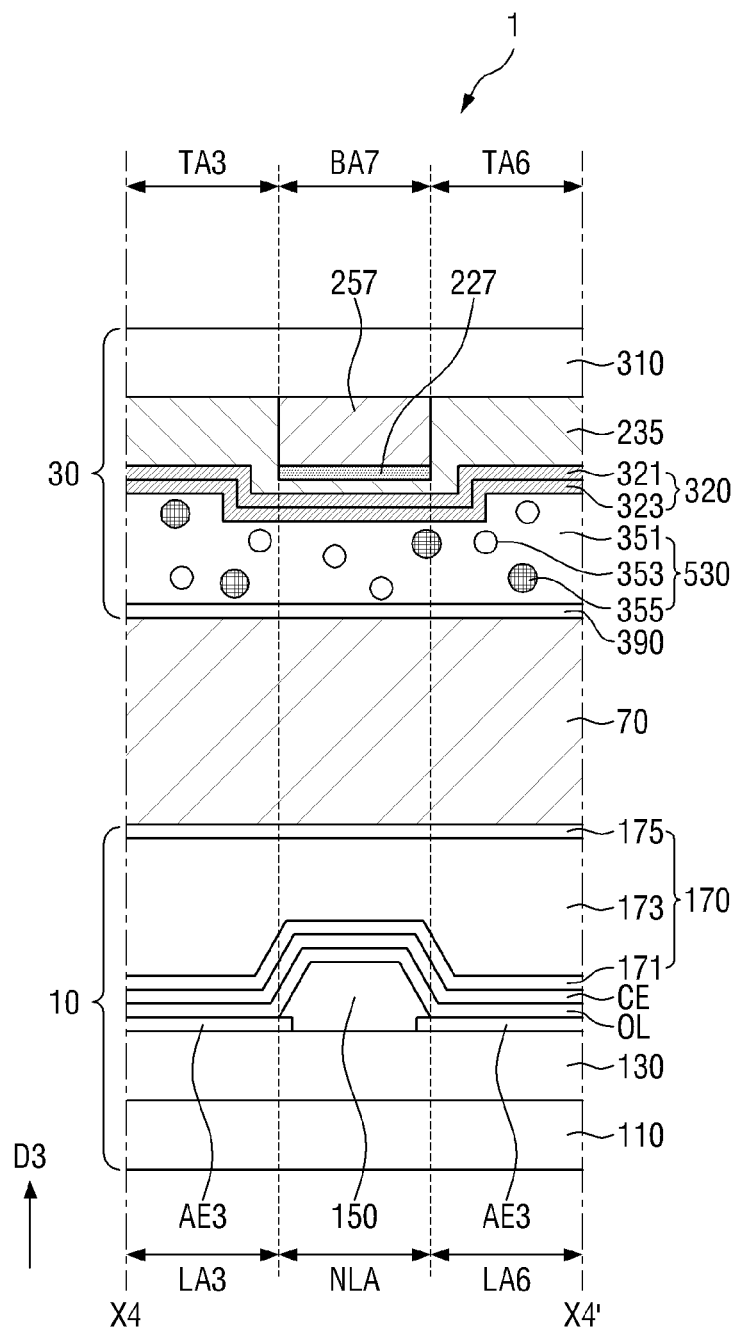

[FIG. 20]
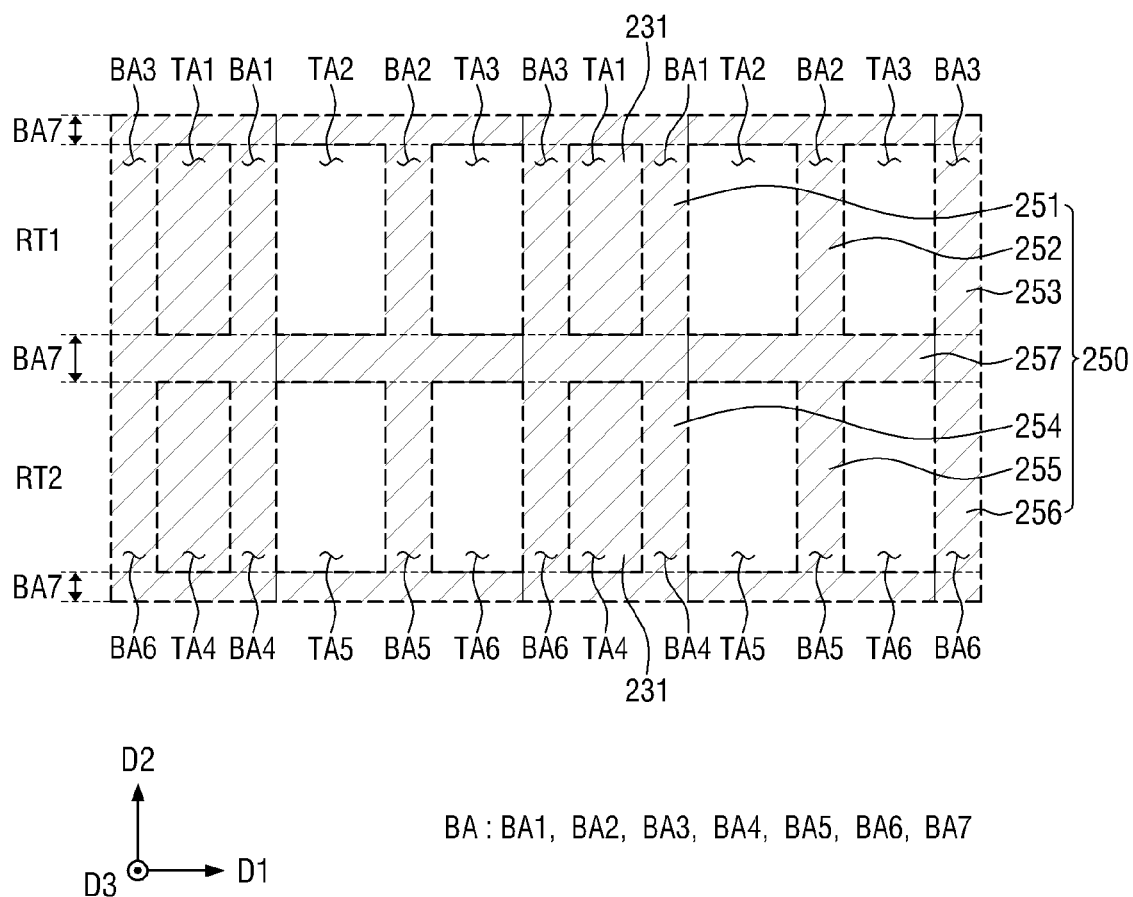

[FIG. 21]
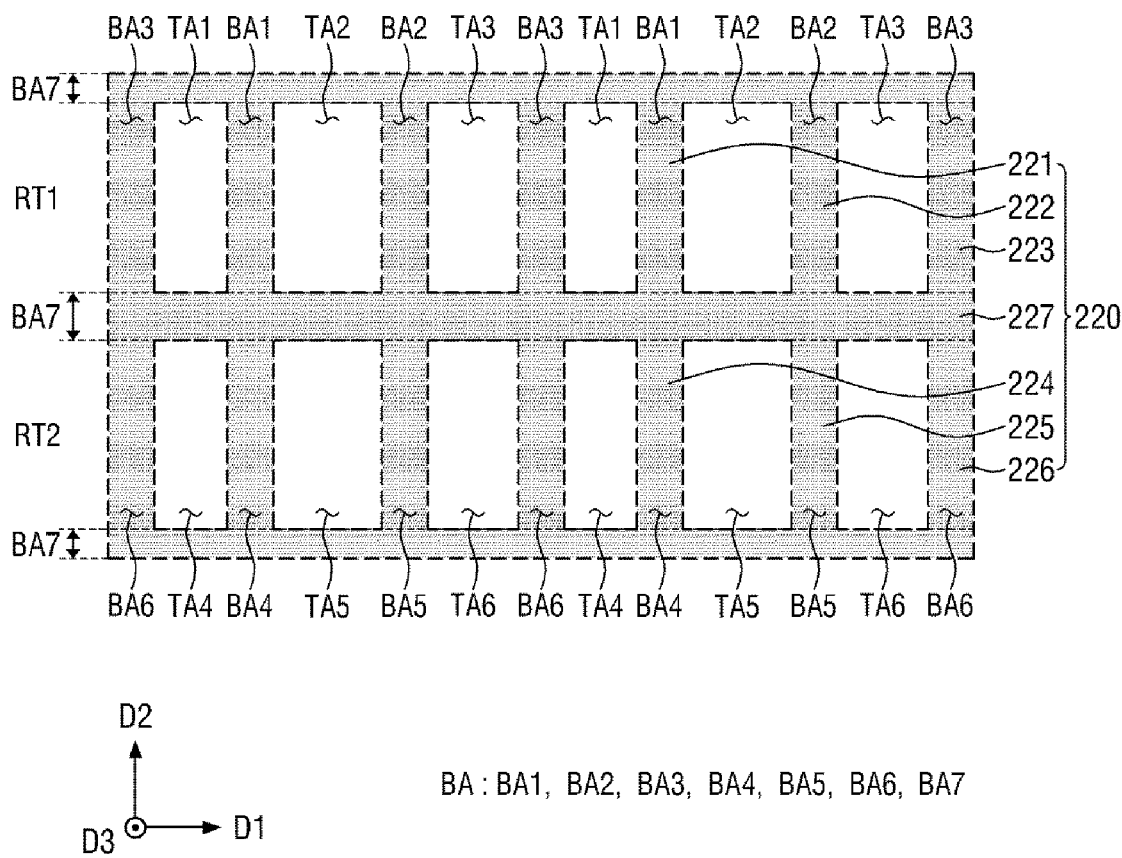

[FIG. 22]
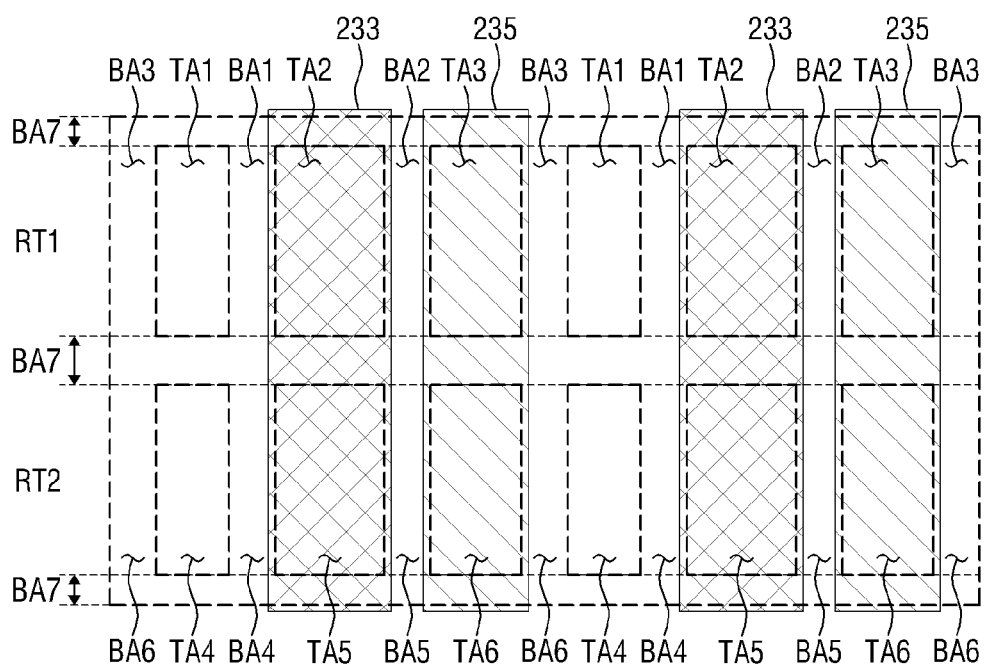
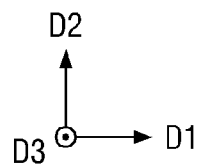
BA : BA1, BA2, BA3, BA4, BA5, BA6, BA7

[FIG. 23]
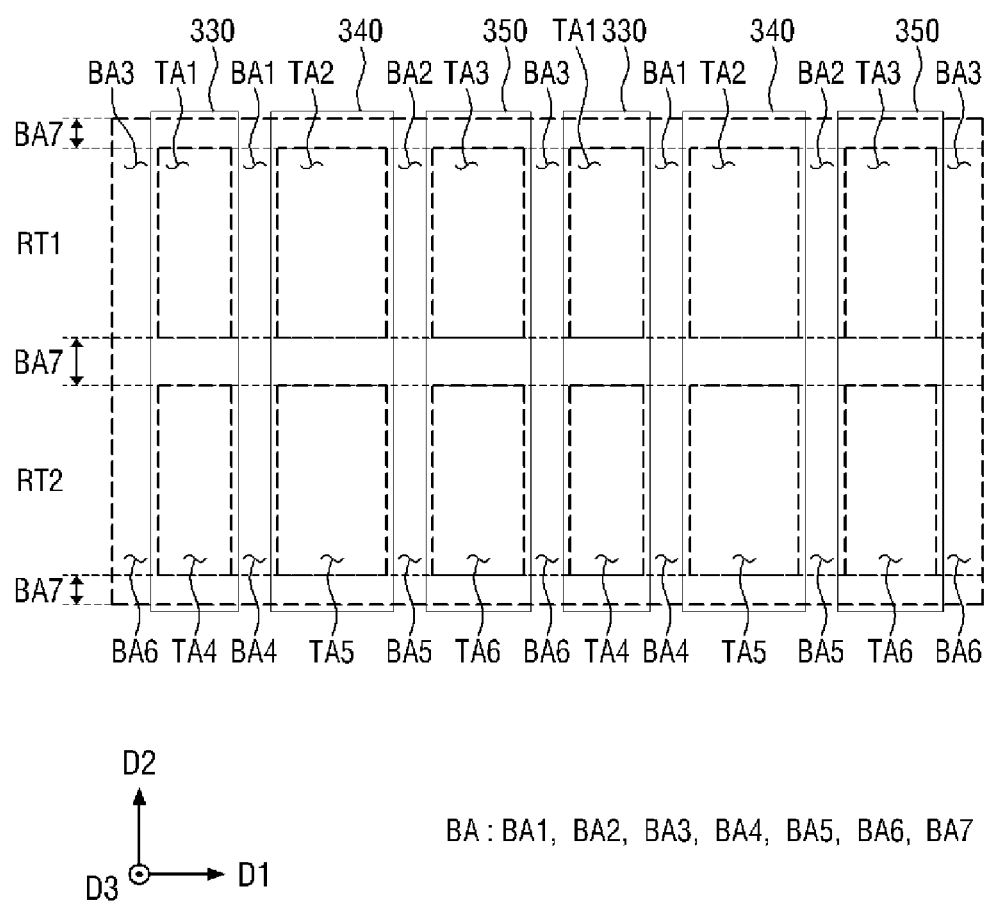

COLOR CONVERSION SUBSTRATE, METHOD OF MANUFACTURING COLOR CONVERSION SUBSTRATE, AND DISPLAY DEVICE

TECHNICAL FIELD

The disclosure relates to a color conversion substrate, a method of manufacturing a color conversion substrate, and a display device including the color conversion substrate.

BACKGROUND ART

The importance of display devices has gradually increased with the development of multimedia. Accordingly, various display devices such as a liquid crystal display device (LCD) and an organic light emitting diode display device (OLED) have been developed.

Among these display devices, a self-light emitting display device includes a self-light emitting element, for example, an organic light emitting element. The self-light emitting element may include two electrodes opposing each other and a light emitting layer interposed between the two electrodes. In a self-light emitting display device where the self-light emitting element is an organic light emitting element, electrons and holes provided from the two electrodes are recombined with each other in the light emitting layer to generate excitons, and light may be emitted while the generated excitons change from an excited state to a ground state.

Since such a self-light emitting display device does not include a separate light source such as a backlight unit, it has low power consumption, may be configured to be lightweight and thin, and has high quality characteristics such as a wide viewing angle, high luminance and contrast, and a fast response speed. Therefore, the self-light emitting display device has attracted attention as the next-generation display device.

DISCLOSURE

Technical Problem

As one method for allowing each pixel of a display device to uniquely display one primary color, there may be a method of arranging a color conversion pattern or a wavelength conversion pattern for each pixel on an optical path from a light source to a viewer.

Embodiments of the disclosure provide a display device capable of improving a display quality.

However, Embodiments of the disclosure are not restricted to those set forth herein. The above and other features of the disclosure will become more apparent to one of ordinary skill in the art to which the disclosure pertains by referencing the detailed description of the disclosure given below.

Technical Solution

According to an embodiment of the disclosure, a color conversion substrate includes: a base part in which a first light-transmitting area and a second light-transmitting area are defined; a first stack disposed on the base part and a second stack disposed on the first stack; a first wavelength conversion pattern overlapping the second light-transmitting area, and disposed on the second stack, where the first wavelength conversion pattern converts light of a first color into light of a second color: and a light-transmitting pattern overlapping the first light-transmitting area and disposed between the first stack and the second stack, where the portions of the first stack and the second stack in the second light-transmitting area are in direct contact with each other to constitute a blue light reflective layer.

In some embodiments, a portion of the first stack in the first light-transmitting area which is not in contact with the second stack and a portion of the second stack in the first light-transmitting area which is not in contact with the first stack may transmit blue light.

In some embodiments, the first stack may include a first layer and a second layer having different refractive indices from each other, and the second stack may include a third layer and a fourth layer having different refractive indices from each other.

In some embodiments, the refractive index of the first layer may be substantially the same as the refractive index of the fourth layer, and the refractive index of the second layer may be substantially the same as the refractive index of the third layer.

In some embodiments, each of the first layer, the second layer, the third layer and the fourth layer may be provided in plural, the first stack may have a structure in which the first layers and the second layers are alternately stacked one on another, and the second stack may have a structure in which the third layers and the fourth layers are alternately stacked one on another.

In some embodiments, portions of the first stack and the second stack in the first light-transmitting area may be in contact with the light-transmitting pattern, and a refractive index of a layer in contact with the light-transmitting pattern among the first layers and the second layers may be different from a refractive index of a layer in contact with the light-transmitting pattern among the third layers and the fourth layers.

In some embodiments, one of portions of the first layers and the second layers in the second light-transmitting area may be in direct contact with the second stack and one of portions of the third layers and the fourth layers in the second light-transmitting area may be in direct contact with the first stack, and a refractive index of a layer in contact with the second stack among the first layers and the second layers may be different from a refractive index of a layer in contact with the first stack among the third layers and the fourth layers.

In some embodiments, the first layer and the second layer may include different inorganic materials from each other, the third layer may include a same material as one of the first layer and the second layer, the fourth layer may include a same material as the other of the first layer and the second layer, portions of the first stack and the second stack in the first light-transmitting area may be in contact with the light-transmitting pattern, and a layer in contact with the light-transmitting pattern among the first layers and the second layers and a layer in contact with the light-transmitting pattern among the third layers and the fourth layers may include different inorganic materials from each other.

In some embodiments, the number of layers included in the first stack may be two or more and nine or less, and the number of layers included in the second stack may be two or more and nine or less.

In some embodiments, the number of layers included in the blue light reflective layer may be 1 t or more and 18 or less.

In some embodiments, a light blocking area may be further defined between the first light-transmitting area and the second light-transmitting area in the base part, and the color conversion substrate may further include: a first color filter overlapping the first light-transmitting area, and disposed between the first stack and the base part, where the first color filter transmits the light of the first color, and blocks the light of the second color; a second color filter overlapping the second light-transmitting area, and disposed between the first stack and the base part, where the second color filter transmits the light of the second color, and blocks the light of the first color; and a light blocking member overlapping the light blocking area and disposed between the first stack and the base part, where the first stack is in contact with the first color filter and the second color filter.

In some embodiments, the color conversion substrate may further include a color pattern positioned in the light blocking area and positioned between the light blocking member and the base part, where the color pattern and the first color filter include a same colorant as each other.

In some embodiments, a third light-transmitting area may be further defined in the base part, the first stack and the second stack may be further disposed in the third light-transmitting area, and the color conversion substrate may further include: a third color filter disposed between the base part and the first stack and overlapping the third light-transmitting area; and a second wavelength conversion pattern overlapping the third light-transmitting area, and disposed on the second stack, where the second wavelength conversion pattern converts the light of the first color into light of a third color different from the light of the second color.

In some embodiments, the color conversion substrate may further include: a capping layer positioned on the first wavelength conversion pattern and covering the first wavelength conversion pattern and the second stack; and a color mixing preventing member positioned on the capping layer and positioned between the light-transmitting pattern and the first wavelength conversion pattern, wherein the capping layer is in contact with the second stack within the first light-transmitting area and in contact with the first wavelength conversion pattern within the second light-transmitting area.

In some embodiments, the color mixing preventing member may include a base resin having light-transmitting properties and scatterers positioned in the base resin.

In some embodiments, the color conversion substrate may further include: a partition wall positioned in the light blocking area and positioned between the first stack and the second stack; and a capping layer positioned on the first wavelength conversion pattern and covering the first wavelength conversion pattern, the second stack, and the partition wall, where the light-transmitting pattern is in contact with the partition wall, the first wavelength conversion pattern is in contact with the capping layer and the second stack covering the partition wall, and the capping layer is in contact with the second stack in the first light-transmitting area and in contact with the first wavelength conversion pattern in the second light-transmitting area.

In some embodiments, the partition wall may include a base resin having light-transmitting properties and scatterers disposed in the base resin.

According to an embodiment of the disclosure, a method of manufacturing a color conversion substrate includes: preparing a base part in which a first light-transmitting area and a second light-transmitting area are defined; providing a first stack on the base part, where the first stack includes a plurality of layers having different refractive indices from each other; providing a light-transmitting pattern on the first stack to overlap the first light-transmitting area; providing a second stack on the first stack to cover the light-transmitting pattern, where the second stack includes a plurality of layers having different refractive indices from each other; forming a wavelength conversion pattern on the second stack to overlap the first light-transmitting area; and providing a capping layer covering the wavelength conversion pattern on the wavelength conversion pattern, where portions of the first stack and the second stack in the second light-transmitting area are in direct contact with each other to constitute a blue light reflective layer.

In some embodiments, of the providing the first stack may include alternately depositing first layers and second layers one on another, where the first layers and the second layers may have different refractive indices from each other, and the forming of the second stack may include alternately depositing third layers and fourth layers one on another, where the third layers and the fourth layers may have different refractive indices from each other.

According to an embodiment of the disclosure, a display device includes: a first base part in which a first emission area and a second emission area are defined: a first light emitting element positioned on the first base part and overlapping the first emission area; a second light emitting element positioned on the first base part and overlapping the second emission area; a thin film encapsulation layer positioned on the first light emitting element and the second light emitting element; a second base part positioned on the thin film encapsulation layer; a blue color filter positioned on one surface of the second base part facing the thin film encapsulation layer and overlapping the first light emitting element; a red color filter positioned on one surface of the second base part and overlapping the second light emitting element; a first stack disposed on the red color filter and a second stack disposed on the first stack; a wavelength conversion pattern overlapping the red color filter and disposed on the second stack; and a light-transmitting pattern overlapping the blue color filter and positioned between the first stack and the second stack, where each of the first light emitting element and the second light emitting element includes a light emitting layer which emits blue light, the wavelength conversion pattern converts the blue light into red light, and portions of the first stack and the second stack in an area overlapping the wavelength conversion pattern are in direct contact with each other to constitute a blue light reflective layer.

In some embodiments, the wavelength conversion pattern may include a base resin, wavelength shifters dispersed in the base resin, and scatterers dispersed in the base resin, and each of the wavelength shifters may be a quantum dot.

In some embodiments, each of the first stack and the second stack may have a structure in which two layers having different refractive indices from each other are alternately stacked one on another.

In some embodiments, a difference in refractive index between the two layers may be about 0.2 or more and about 0.6 or less.

In some embodiments, the sum of the number of layers included in the first stack and the number of layers included in the second stack may be 11 or more and 19 or less.

In some embodiments, the light emitting layer may include a first light emitting layer and a second light emitting layer, where each of the first light emitting layer and the second light emitting layer emits the blue light, and the first light emitting layer and the second light emitting layer may overlap each other.

Detailed contents of other embodiments are described in a detailed description and are illustrated in the drawings.

Advantageous Effects

According to embodiments of the disclosure, a color conversion substrate capable of improving a display quality, and a method of manufacturing the same may be provided.

In addition, according to embodiments of the disclosure, a display device capable of improving a display quality may be provided.

The effects of the disclosure are not limited to the aforementioned effects, and various other effects are included in the specification.

DESCRIPTION OF DRAWINGS

FIG. 1 is a perspective view of a display device according to an embodiment;

FIG. 2 is a schematic cross-sectional view of the display device taken along line Xa-Xa' of FIG. 1, FIG. 3 is a schematic plan view of a display substrate in a display area of the display device illustrated in FIGS. 1 and 2;

FIG. 4 is a schematic plan view of a color conversion substrate in the display area of the display device illustrated in FIGS. 1 and 2;

FIG. 6 is an enlarged cross-sectional view of portion Q1 of FIG. 5;

FIG. 7 is an enlarged cross-sectional view of portion Q2 of FIG. 5;

FIG. 8 is an enlarged cross-sectional view of portion Q3 of FIG. 5;

FIG. 9 is an enlarged cross-sectional view of portion Q4 of FIG. 5;

FIG. 10 is a view illustrating an embodiment of a stacked structure of a first stack of a blue light reflective layer:

FIG. 11 is a view illustrating an embodiment of a stacked structure of a second stack of the blue light reflective layer:

FIG. 12 is a view illustrating an embodiment of a stacked structure of the blue light reflective layer:

FIG. 13 is a view illustrating an alternative embodiment of a stacked structure of the first stack of the blue light reflective layer;

FIG. 14 is a view illustrating an alternative embodiment of a stacked structure of the second stack of the blue light reflective layer:

FIG. 15 is a view illustrating an alternative embodiment of stacked structure of the blue light reflective layer;

FIG. 16 is a cross-sectional view of the display device according to an embodiment taken along line X2-X2' of FIGS. 3 and 4:

FIG. 17 is a cross-sectional view of the display device according to an embodiment taken along line X3-X3' of FIGS. 3 and 4:

FIG. 18 is a cross-sectional view of the display device according to an embodiment taken along line X4-X4' of FIGS. 3 and 4;

FIG. 20 is a plan view illustrating a schematic arrangement of a first color filter and a color pattern in the color conversion substrate of the display device according to an embodiment;

FIG. 21 is a plan view illustrating a schematic arrangement of a light blocking member in the color conversion substrate of the display device according to an embodiment;

FIG. 22 is a plan view illustrating a schematic arrangement of a second color filter and a third color filter in the color conversion substrate of the display device according to an embodiment;

FIG. 23 is a plan view illustrating a schematic arrangement of a first wavelength conversion pattern, a second wavelength conversion pattern, and a light-transmitting pattern in the color conversion substrate of the display device according to an embodiment;

MODE FOR INVENTION

Figure 5:
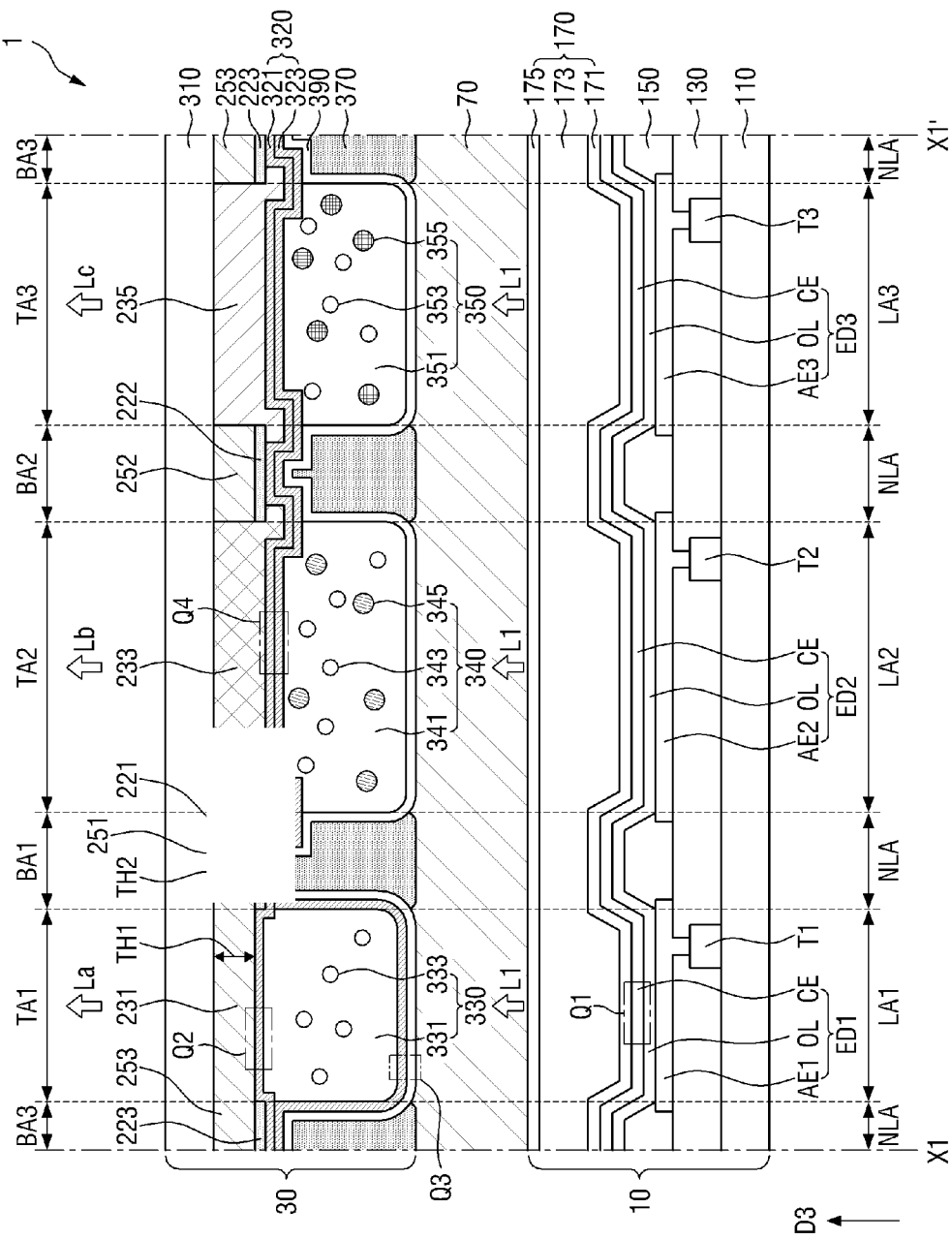
FIG. 5 is a cross-sectional view of the display device according to an embodiment taken along line X1-X1' of FIGS. 3 and 4.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

Spatially relative terms 'below', 'beneath', 'lower', 'above', 'upper', and the like, may be used in order to easily describe correlations between one element or component and other elements or components as illustrated in the drawings. The spatially relative terms are to be understood as terms including different directions of elements at the time of being used in addition to directions illustrated in the drawings. For example, when elements illustrated in the drawings are overturned, an element described as 'below or beneath' of another element may be put 'above' of another element. Accordingly, an exemplary term 'below'" may include both of directions of below and above.

The terms 'first', 'second', 'third', 'fourth', and the like, are used to describe various components, but these components are not limited by these terms. These terms are used only in order to distinguish one component from another component. Accordingly, a first component to be mentioned below may be any one of a second element, a third component, and a fourth component within the technical spirit of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described with reference to plan views and cross-sectional views, which are ideal schematic views of the disclosure. Accordingly, forms of the illustrative drawings may be changed due to manufacturing technology, tolerance, and the like. Accordingly, embodiments of the disclosure are not limited to a specific form illustrated, and also include changes in the form generated according to a manufacturing process. Accordingly, areas illustrated in the drawings have schematic attributes, and shapes of the areas illustrated in the drawings are intended to illustrate specific forms of areas of elements and are not intended to limit the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a perspective view of a display device according to an embodiment, and FIG. 2 is a schematic cross-sectional view of the display device taken along line Xa-Xa' of FIG. 1.

Referring to FIGS. 1 and 2, an embodiment of a display device 1 may be applied to various electronic devices, for example, small and medium electronic devices such as tablet personal computers (PCs), smartphones, vehicle navigation units, cameras, center information displays (CIDs) provided in vehicles, wrist watch-type electronic devices, personal digital assistants (PDAs), portable multimedia players (PMPs), and game machines, and medium and large electronic devices such as televisions, external billboards, monitors, personal computers, and laptop computers, for example, but not being limited thereto. Alternatively, the display device 1 may also be adopted in other electronic devices without departing from the teachings herein.

In some embodiments, the display device 1 may have a rectangular shape in a plan view. The display device 1 may include two first sides extending in a first direction D1 and two second sides extending in a second direction D2 crossing the first direction D1. A corner where the first side and the second side of the display device 1 meet may be right-angled, but is not limited thereto, and may also be curved. In some embodiments, the first side may be shorter than the second side, but is not limited thereto. The shape of the display device 1 in a plan view is not limited to the illustrated shape, and may also be a circular shape or other shape.

The display device 1 may include a display area DA that displays an image and a non-display area NDA that does not display an image. In some embodiments, the non-display area NDA may be positioned around the display area DA, and may surround the display area DA.

Unless otherwise defined, in the specification, the terms "upper", "upper side", "upper portion", "top, and "upper surface" refer to a direction toward which an arrow of a third direction D3 crossing the first direction D1 and the second direction D2 is directed in the drawings, and the terms "lower", "lower side", "lower portion", "bottom, and "lower surface" refer to an opposite direction to the direction toward which the arrow of the third direction D3 is directed in the drawings. Here, the third direction D3 may be a thickness direction of the display device 1.

A schematic stacked structure of the display device 1 will be described. In some embodiments, the display device 1 may include a display substrate 10 and a color conversion substrate 30 facing the display substrate 10, and may further include a sealing part 50 coupling the display substrate 10 and the color conversion substrate 30 to each other, and a filler 70 filled between the display substrate 10 and the color conversion substrate 30.

The display substrate 10 may include elements and circuits for displaying an image, for example, pixel circuits such as switching elements, a pixel defining layer defining an emission area and a non-emission area to be described later in the display area DA, and a self-light emitting element. In an embodiment, the self-light emitting element may include at least one selected from an organic light emitting diode, a quantum dot light emitting diode, an inorganic material-based micro light emitting diode (e.g., a micro LED), and an inorganic material-based light emitting diode (e.g., a nano LED). Hereinafter, for convenience of description, embodiments where the self-light emitting element is an organic light emitting diode will be described by way of example.

The color conversion substrate 30 may be positioned on the display substrate 10 and may face the display substrate 10. In some embodiments, the color conversion substrate 30 may include a color conversion pattern that converts a color of incident light. In some embodiments, the color conversion pattern may include at least one selected from a color filter and a wavelength conversion pattern.

The sealing part 50 may be positioned between the display substrate 10 and the color conversion substrate 30 in the non-display area NDA. The sealing part 50 may be disposed along edges of the display substrate 10 and the color conversion substrate 30 in the non-display area NDA to surround the display area DA in a plan view. The display substrate 10 and the color conversion substrate 30 may be coupled to each other via the sealing part 50.

In some embodiments, the sealing part 50 may include or be made of an organic material. In an embodiment, for example, the sealing part 50 may include or be made of an epoxy-based resin, but is not limited thereto.

The filler 70 may be positioned in a space between the display substrate 10 and the color conversion substrate 30 surrounded by the sealing part 50. The filler 70 may fill the space between the display substrate 10 and the color conversion substrate 30.

In some embodiments, the filler 70 may include or be made of a material that may transmit light. In some embodiments, the filler 70 may include or be made of an organic material. In an embodiment, for example, the filler 70 may include or be made of a silicone-based organic material, an epoxy-based organic material, or the like, but is not limited thereto. In an alternative embodiment, the filler 70 may be omitted.

FIG. 3 is a schematic plan view of a display substrate in a display area of the display device illustrated in FIGS. 1 and 2, and FIG. 4 is a schematic plan view of a color conversion substrate in the display area of the display device illustrated in FIGS. 1 and 2.

Referring to FIGS. 3 and 4 in addition to FIGS. 1 and 2, in the display area DA, a plurality of emission areas LA1, LA2, LA3, LA4, LA5, and LA6 and a non-emission area NLA may be defined in the display substrate 10. The emission areas LA1, LA2, LA3, LA4, LA5, and LA6 may be areas in which light generated by light emitting elements of the display substrate 10 is emitted to the outside of the display substrate 10, and the non-emission area NLA may be an area in which the light is not emitted to the outside of the display substrate 10.

In some embodiments, the light emitted from the display substrate 10 to the color conversion substrate 30 in each of the emission areas LA1, LA2, LA3, LA4, LA5, and LA6 may be light of a first color. In some embodiments, the light of the first color may be blue light, and may have a peak wavelength in the range of about 440 nanometers (nm) to about 480 nm. The peak wavelength may refer to a wavelength of which intensity is peak within a wavelength region.

In some embodiments, in the display area DA, first emission areas LA1, second emission areas LA2, and third emission areas LA3 may be sequentially and repeatedly disposed along the first direction D1 in a first row RL1 of the display substrate 10. In such embodiments, fourth emission areas LA4, fifth emission areas LA5, and sixth emission areas LA6 may be sequentially and repeatedly disposed along the first direction D1 in a second row RL2 adjacent to the first row RL1 along the second direction D2.

In some embodiments, a first width WL1 of the first emission area LA1 measured along the first direction D1 may be smaller than a second width WL2 of the second emission area LA2 and a third width WL3 of the third emission area LA3 measured along the first direction D1. In some embodiments, the second width WL2 of the second emission area LA2 and the third width WL3 of the third emission area LA3 may also be different from each other. In an embodiment, for example, the second width WL2 of the second emission area LA2 may be greater than the third width WL3 of the third emission area LA3. In addition, in some embodiments, an area of the first emission area LA1 may be smaller than an area of the second emission area LA2 and an area of the third emission area LA3. The area of the second emission area LA2 may be smaller than that of the third emission area LA3 or may be greater than the area of the third emission area LA3. However, the disclosure is not limited to the above-described example. In an alternative embodiment, the first width WL1 of the first emission area LA1 measured along the first direction D1, and the second width WL2 of the second emission area LA2 and the third width WL3 of the third emission area LA3 measured along the first direction D1 may also be substantially the same as each other. In an alternative embodiment, the area of the first emission area LA1, the area of the second emission area LA2, and the area of the third emission area LA3 may also be substantially the same as each other.

The fourth emission area LA4 adjacent to the first emission area LA1 along the second direction D2 is substantially the same as the first emission area LA1 except that the fourth emission area LA4 is positioned in the second row RL2, and may be substantially the same as the first emission area LA1 in width, area, and structures of components disposed to overlap the area.

Similarly, the second emission area LA2 and the fifth emission area LA5 adjacent to each other along the second direction D2 may have substantially the same structure as each other, and the third emission area LA3 and the sixth emission area LA6 adjacent to each other along the second direction D2 may have substantially the same structure as each other.

In the display area DA, a plurality of light-transmitting areas TA1, TA2, TA3, TA4, TA5, and TA6 and a light blocking area BA may be defined in the color conversion substrate 30. The light-transmitting areas TA1, TA2, TA3, TA4, TA5, and TA6 may be areas in which the light emitted from the display substrate 10 is transmitted through the color conversion substrate 30 and is provided to the outside of the display device 1. The light blocking area BA may be an area in which the light emitted from the display substrate 10 is not transmitted.

In some embodiments, in the display area DA, first light-transmitting areas TA1, second light-transmitting areas TA2, and third light-transmitting areas TA3 may be sequentially and repeatedly disposed along the first direction D1 in a first row RT1 of the color conversion substrate 30. The first light-transmitting area TAT may correspond to the first emission area LA1 or may overlap the first emission area LA1. Similarly, the second light-transmitting area TA2 may correspond to the second emission area LA2 or overlap the second emission area LA2, and the third light-transmitting area TA3 may correspond to the third emission area LA3 or overlap the third emission area LA3.

In some embodiments, the light of the first color provided from the display substrate 10 may be transmitted through the first light-transmitting area TAT, the second light-transmitting area TA2, and the third light-transmitting area TA3, and be then provided to the outside of the display device 1. When the light emitted from the first light-transmitting area TAT to the outside of the display device 1 is referred to as first emitted light, the light emitted from the second light-transmitting area TA2 to the outside of the display device 1 is referred to as second emitted light, and the light emitted from the third light-transmitting area TA3 to the outside of the display device 1 is referred to as third emitted light, the first emitted light is the light of the first color, the second emitted light may be light of a second color different from the first color, and the third emitted light may be light of a third color different from the first color and the second color. In some embodiments, the light of the first color may be the blue light having the peak wavelength in the range of about 440 nm to about 480 nm as described above, and the light of the second color may be red light having a peak wavelength in the range of about 610 nm to about 650 nm. In such embodiments, the light of the third color may be green light having a peak wavelength in the range of about 510 nm to about 550 nm. However, the disclosure is not limited thereto, and alternatively, the light of the second color may be green light and the light of the third color may be red light.

Fourth light-transmitting area TA4, fifth light-transmitting area TA5, and sixth light-transmitting area TA6 may be sequentially and repeatedly disposed along the first direction D1 in a second row RT2 adjacent to the first row RT1 along the second direction D2. The fourth light-transmitting area TA4 may correspond to or overlap the fourth emission area LA4, the fifth light-transmitting area TA5 may correspond to or overlap the fifth emission area LA5, and the sixth light-transmitting area TA6 may correspond to or overlap the sixth emission area LA6.

Similar to the first emission area LA1, the second emission area LA2, and the third emission area LA3, in some embodiments, a first width WT1 of the first light-transmitting area TA1 measured along the first direction D1 may be smaller than a second width WT2 of the second light-transmitting area TA2 and a third width WT3 of the third light-transmitting area TA3 measured along the first direction D1. In some embodiments, the second width WT2 of the second light-transmitting area TA2 and the third width WT3 of the third light-transmitting area TA3 may also be different from each other. In an embodiment, for example, the second width WT2 of the second light-transmitting area TA2 may be smaller or greater than the third width WT3 of the third light-transmitting area TA3. In addition, in some embodiments, an area of the first light-transmitting area TA1 may be smaller than an area of the second light-transmitting area TA2 and an area of the third light-transmitting area TA3, and the area of the second light-transmitting area TA2 may be smaller or greater than the area of the third light-transmitting area TA3.

However, the disclosure is not limited to the above-described example. In an alternative embodiment, the first width WT1 of the first light-transmitting area TAT measured along the first direction D1, and the second width WT2 of the second light-transmitting area TA2 and the third width WT3 of the third light-transmitting area TA3 measured along the first direction D1 may also be substantially the same as each other. In an alternative embodiment, the area of the first light-transmitting area TAT, the area of the second light-transmitting area TA2, and the area of the third light-transmitting area TA3 may also be substantially the same as each other.

The first light-transmitting area TAT and the fourth light-transmitting area TA4 adjacent to each other along the second direction D2 may be substantially the same as each other in width, area, structures of components disposed to overlap the area, and color of light emitted to the outside of the display device 1.

Similarly, the second light-transmitting area TA2 and the fifth light-transmitting area TA5 adjacent to each other along the second direction D2 may have substantially the same structure as each other, and colors of light emitted from the second light-transmitting area TA2 and the fifth light-transmitting area TA5 to the outside of the display device 1 may also be substantially the same as each other. In addition, the third light-transmitting area TA3 and the sixth light-transmitting area TA6 adjacent to each other along the second direction D2 may have substantially the same structure as each other, and colors of light emitted from the third light-transmitting area TA3 and the sixth light-transmitting area TA6 to the outside of the display device 1 may also be substantially the same as each other.

The light blocking area BA may be positioned around the light-transmitting areas TAT, TA2, TA3, TA4, TA5, and TA6 of the color conversion substrate 30 within the display area DA. In some embodiments, where the light blocking area BA is divided for each area, the light blocking area BA may include first light blocking areas BAT, second light blocking areas BA2, third light blocking areas BA3, fourth light blocking areas BA4, fifth light blocking areas BA5, sixth light blocking areas BA6, and seventh light blocking areas BA7.

The first light blocking area BA1 may be positioned between the first light-transmitting area TA1 and the second light-transmitting area TA2 along the first direction DT, the second light blocking area BA2 may be positioned between the second light-transmitting area TA2 and the third light-transmitting area TA3 along the first direction DT, and the third light blocking area BA3 may be positioned between the third light-transmitting area TA3 and the first light-transmitting area TA1 along the first direction DT.

The fourth light blocking area BA4 may be positioned between the fourth light-transmitting area TA4 and the fifth light-transmitting area TA5 along the first direction DT, the fifth light blocking area BA5 may be positioned between the fifth light-transmitting area TA5 and the sixth light-transmitting area TA6 along the first direction DT, and the sixth light blocking area BA6 may be positioned between the sixth light-transmitting area TA6 and the fourth light-transmitting area TA4 along the first direction DT.

The seventh light blocking area BA7 may be positioned between the first row RT1 and the second row RT2 adjacent to each other along the second direction D2.

Hereinafter, a structure of the display device T will be described in more detail.

Figure 19:
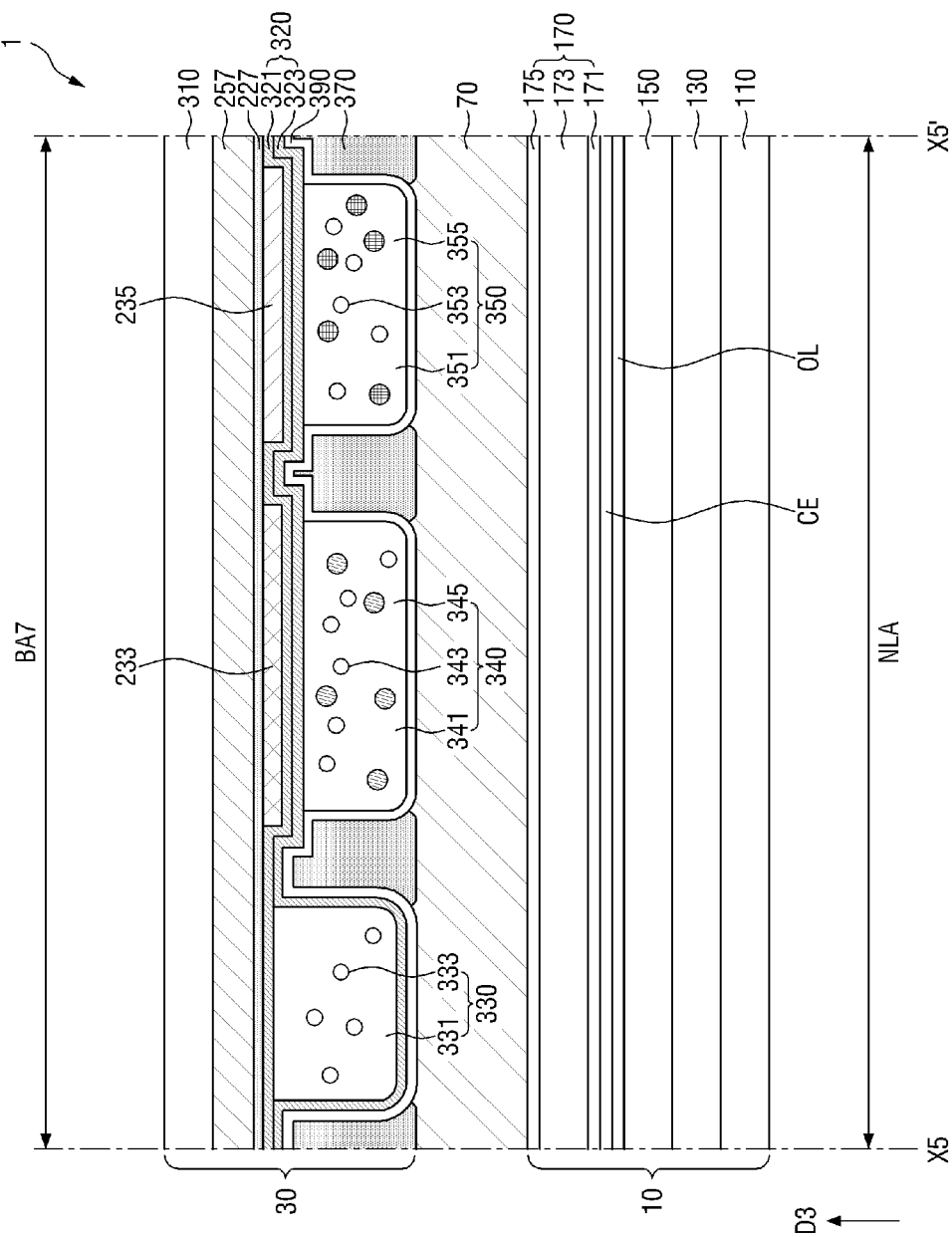
FIG. 19 is a cross-sectional view of the display device according to an embodiment taken along line X5-X5' of FIGS. 3 and 4.

FIG. 5 is a cross-sectional view of the display device according to an embodiment taken along line X1-X1' of FIGS. 3 and 4, FIG. 6 is an enlarged cross-sectional view of portion Q1 of FIG. 5, FIG. 7 is an enlarged cross-sectional view of portion Q2 of FIG. 5, FIG. 8 is an enlarged cross-sectional view of portion Q3 of FIG. 5, FIG. 9 is an enlarged cross-sectional view of portion Q4 of FIG. 5, FIG. 10 is a view illustrating an embodiment of a stacked structure of a first stack of a blue light reflective layer, FIG. 11 is a view illustrating an embodiment of a stacked structure of a second stack of the blue light reflective layer, FIG. 12 is a view illustrating an embodiment of a stacked structure of the blue light reflective layer, FIG. 13 is a view illustrating alternative embodiment of a stacked structure of the first stack of the blue light reflective layer, FIG. 14 is a view illustrating an alternative embodiment of a stacked structure of the second stack of the blue light reflective layer, FIG. 15 is a view illustrating an alternative embodiment of a stacked structure of the blue light reflective layer, FIG. 16 is a cross-sectional view of the display device according to an embodiment taken along line X2-X2' of FIGS. 3 and 4, FIG. 17 is a cross-sectional view of the display device according to an embodiment taken along line X3-X3' of FIGS. 3 and 4, FIG. 18 is a cross-sectional view of the display device according to an embodiment taken along line X4-X4' of FIGS. 3 and 4, and FIG. 19 is a cross-sectional view of the display device according to an embodiment taken along line X5-X5' of FIGS. 3 and 4. Here, positions of lines X1-X1', X2-X2, X3-X3', X4-X4', and X5-X5' of FIG. 3 are the same as positions of lines X1-X1', X2-X2, X3-X3', X4-X4', and X5-X5' of FIG. 4.

Referring to FIGS. 5 to 19 in addition to FIGS. 3 and 4, an embodiment of the display device 1 may include the display substrate 10 and the color conversion substrate 30 as described above, and may further include the filler 70 positioned between the display substrate 10 and the color conversion substrate 30.

Hereinafter, the display substrate 10 will be described in more detail.

A first base part 110 may include or be made of a material having light-transmitting properties. In some embodiments, the first base part 110 may be a glass substrate or a plastic substrate. In an embodiment where the first base part 110 is the plastic substrate, the first base part 110 may have flexibility. In some embodiments, the first base part 110 may further include a separate layer positioned on the glass substrate or the plastic substrate, for example, a buffer layer or an insulating layer.

In some embodiments as described above with reference to FIGS. 3 and 4, the plurality of emission areas LA1, LA2, LA3, LA4, LA5, and LA6 and the non-emission area NLA may be defined in the first base part 110.

As illustrated in FIG. 5, switching elements T1, T2, and T3 may be positioned on the first base part 110. In some embodiments, a first switching element T1 may be positioned in the first emission area LA1, a second switching element T2 may be positioned in the second emission area LA2, and a third switching element T3 may be positioned in the third emission area LA3. However, the disclosure is not limited thereto, and in an alternative embodiment, at least one selected from the first switching element T1, the second switching element T2, and the third switching element T3 may be positioned in the non-emission area NLA.

In some embodiments, each of the first switching element T1, the second switching element T2, and the third switching element T3 may be a thin film transistor including polysilicon or a thin film transistor including an oxide semiconductor.

Although not illustrated in the drawings, a plurality of signal lines (e.g., gate lines, data lines, and power lines) transferring signals to the respective switching elements may be further positioned on the first base part 110.

An insulating layer 130 may be positioned on the first switching element T1, the second switching element T2, and the third switching element T3. In some embodiments, the insulating layer 130 may be a planarization layer. In some embodiments, the insulating layer 130 may be formed as or defined by an organic layer. In an embodiment, for example, the insulating layer 130 may include an acrylic resin, an epoxy-based resin, an imide-based resin, an ester-based resin, or the like. In some embodiments, the insulating layer 130 may include a positive photosensitive material or a negative photosensitive material.

As illustrated in FIGS. 5 and 16 to 18, a first anode electrode AE1, a second anode electrode AE2, and a third anode electrode AE3 may be positioned on the insulating layer 130. The first anode electrode AE1 may be positioned in the first emission area LA1, but at least a portion of the first anode electrode AE1 may extend to the non-emission area NLA. The second anode electrode AE2 may be positioned in the second emission area LA2, but at least a portion of the second anode electrode AE2 may extend to the non-emission area NLA, and the third anode electrode AE3 may be positioned in the third light emission area LA3, but at least a portion of the third anode electrode AE3 may extend to the non-emission area NLA. The first anode electrode AE1 may penetrate or be disposed through the insulating layer 130 and be connected to the first switching element T1, the second anode electrode AE2 may penetrate or be disposed through the insulating layer 130 and be connected to the second switching element T2, and the third anode electrode AE3 may penetrate or be disposed through the insulating layer 130 and be connected to the third switching element T3.

In some embodiments, widths or areas of the first anode electrode AE1, the second anode electrode AE2, and the third anode electrode AE3 may be different from each other. In an embodiment, for example, the width of the first anode electrode AE1 may be smaller than the width of the second anode electrode AE2, and the width of the third anode electrode AE3 may be smaller than the width of the second anode electrode AE2 and greater than the width of the first anode electrode AE1. Alternatively, the area of the first anode electrode AE1 may be smaller than the area of the second anode electrode AE2, and the area of the third anode electrode AE3 may be smaller than the area of the second anode electrode AE2 but greater than the area of the first anode electrode AE1. Alternatively, the area of the first anode electrode AE1 may be smaller than the area of the second anode electrode AE2, and the area of the third anode electrode AE3 may be greater than the area of the second anode electrode AE2 and the area of the first anode electrode AE1. However, the disclosure is not limited to the above-described embodiment. In an alternative embodiment, the widths or the areas of the first anode electrode AE1, the second anode electrode AE2, and the third anode electrode AE3 may also be substantially the same as each other.

In an embodiment, the first anode electrode AE1, the second anode electrode AE2, and the third anode electrode AE3 may be reflective electrodes. In such an embodiment, the first anode electrode AE1, the second anode electrode AE2, and the third anode electrode AE3 may be metal layers including a metal such as Ag, Mg, Al, Pt, Pd, Au, Ni, Nd, Ir, and Cr. In an alternative embodiment, the first anode electrode AE1, the second anode electrode AE2, and the third anode electrode AE3 may further include metal oxide layers stacked on the metal layers. In an embodiment, the first anode electrode AE1, the second anode electrode AE2, and the third anode electrode AE3 may have a multilayer structure, for example, a two-layer structure such as indium tin oxide (ITO)/Ag, Ag/ITO, ITO/Mg, or ITO/MgF, or a three-layer structure such as ITO/Ag/ITO.

A pixel defining layer 150 may be positioned on the first anode electrode AE1, the second anode electrode AE2, and the third anode electrode AE3. in an embodiment, an opening exposing the first anode electrode AE1, an opening exposing the second anode electrode AE2, and an opening exposing the third anode electrode AE3 may be defined through the pixel defining layer 150, and the openings of the pixel defining layer 150 may define the first emission area LA1, the second emission area LA2, the third emission area LA3, and the non-emission area NLA. In such an embodiment, an area of the first anode electrode AE1 exposed without being covered by the pixel defining layer 150 may be the first emission area LA1. Similarly, an area of the second anode electrode AE2 exposed without being covered by the pixel defining layer 150 may be the second emission area LA2, and an area of the third anode electrode AE3 exposed without being covered by the pixel defining layer 150 may be the third emission area LA3. In such an embodiment, an area in which the pixel defining layer 150 is positioned may be the non-emission area NLA.

In some embodiments, the pixel defining layer 150 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB).

In some embodiments, the pixel defining layer 150 may overlap a color pattern 250 (see FIG. 20) and a light blocking member 220 (see FIG. 21) to be described later. In an embodiment, for example, as illustrated in FIG. 5, the pixel defining layer 150 may overlap a first light blocking member 221, a second light blocking member 222, and a third light blocking member 223. In addition, the pixel defining layer 150 may overlap a first color pattern 251, a second color pattern 252, and a third color pattern 253.

The pixel defining layer 150 may also overlap a color mixing preventing member 370 to be described later.

As illustrated in FIGS. 5 and 16 to 19, a light emitting layer OL may be positioned on the first anode electrode AE1, the second anode electrode AE2, and the third anode electrode AE3.

In some embodiments, the light emitting layer OL may have a shape of a continuous layer formed over the plurality of emission areas LA1, LA2, LA3, LA4, LA5, and LA6 and the non-emission area NLA. A more detailed description of the light emitting layer OL will be provided later.

As illustrated in FIGS. 5 and 16 to 19, a cathode electrode CE may be positioned on the light emitting layer OL.

In some embodiments, the cathode electrode CE may have transflective properties or transmissive properties. In an embodiment where the cathode electrode CE has the transflective properties, the cathode electrode CE may include Ag, Mg, Cu, Al, Pt, Pd, Au, Ni, Nd, Ir, Cr, Li, Ca, LiF/Ca, LiF/Al, Mo, Ti or compounds or mixtures thereof, for example, a mixture of Ag and Mg. In an embodiment, a thickness of the cathode electrode CE is several tens to several hundreds of angstroms, such that the cathode electrode CE may have the transflective properties.

In an embodiment where the cathode electrode CE has the transmissive properties, the cathode electrode CE may include transparent conductive oxide (TCO). In an embodiment, for example, the cathode electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

The first anode electrode AE1, the light emitting layer OL, and the cathode electrode CE may constitute a first light emitting element ED1, the second anode electrode AE2, the light emitting layer OL, and the cathode electrode CE may constitute a second light emitting element ED2, and the third anode electrode AE3, the light emitting layer OL, and the cathode electrode CE may constitute a third light emitting element ED3. Each of the first light emitting element ED1, the second light emitting element ED2, and the third light emitting element ED3 may emit emitted light L1, and the emitted light L1 may be provided to the color conversion substrate 30.

As illustrated in FIG. 6, the emitted light L1 finally emitted from the light emitting layer OL may be a mixed light in which a first component L11 and a second component L12 are mixed with each other. A peak wavelength of each of the first component L11 and the second component L12 of the emitted light L1 may be about 440 nm or more and less than about 480 nm. That is, the emitted light L1 may be blue light.

In some embodiments, the light emitting layer OL may have a structure in which a plurality of light emitting layers are disposed to overlap each other, for example, a tandem structure. In an embodiment, for example, the light emitting layer OL may include a first light emitting stack ST1 including a first light emitting layer EML1, a second light emitting stack ST2 positioned on the first light emitting stack ST1 and including a second light emitting layer EML2, a third light emitting stack ST3 positioned on the second light emitting stack ST2 and including a third light emitting layer EML3, a first charge generating layer CGL1 positioned between the first light emitting stack ST1 and the second light emitting stack ST2, and a second charge generating layer CGL2 positioned between the second light emitting stack ST2 and the third light emitting stack ST3. The first light emitting stack ST1, the second light emitting stack ST2, and the third light emitting stack ST3 may be disposed to overlap each other.

The first light emitting layer EML1, the second light emitting layer EML2, and the third light emitting layer EML3 may be disposed to overlap each other.

In some embodiments, all of the first light emitting layer EML1, the second light emitting layer EML2, and the third light emitting layer EML3 may emit the light of the first color, for example, the blue light. In an embodiment, for example, each of the first light emitting layer EML1, the second light emitting layer EML2, and the third light emitting layer EML3 may be a blue light emitting layer, and may include an organic material.

In some embodiments, at least one selected from the first light emitting layer EML1, the second light emitting layer EML2, and the third light emitting layer EML3 may emit first blue light having a first peak wavelength, and at least the other of the first light emitting layer EML1, the second light emitting layer EML2, and the third light emitting layer EML3 may emit second blue light having a second peak wavelength different from the first peak wavelength. In an embodiment, for example, any one of the first light emitting layer EML1, the second light emitting layer EML2, and the third light emitting layer EML3 may emit the first blue light having the first peak wavelength, and the others of the first light emitting layer EML1, the second light emitting layer EML2, and the third light emitting layer EML3 may emit the second blue light having the second peak wavelength. That is, the emitted light L1 finally emitted from the light emitting layer OL may be a mixed light in which the first component L11 and the second component L12 are mixed with each other, the first component L11 may be the first blue light having first peak wavelength, and the second component L12 may be the second blue light having the second peak wavelength.

In some embodiments, a range of one of the first peak wavelength and the second peak wavelength may be about 440 nm or more and less than about 460 nm, and a range of the other of the first peak wavelength and the second peak wavelength may be about 460 nm or more and about 480 nm or less. However, the range of the first peak wavelength and the range of the second peak wavelength are not limited thereto. In an embodiment, for example, both of the range of the first peak wavelength and the range of the second peak wavelength may include about 460 nm. In some embodiments, any one of the first blue light and the second blue light may be light of a deep blue color, and the other of the first blue light and the second blue light may be light of a sky blue color.

According to some embodiments, the emitted light L1 emitted from the light emitting layer OL is blue light and includes a long wavelength component and a short wavelength component. Accordingly, finally, the light emitting layer OL may emit blue light having a broader emission peak as the emitted light L1. Therefore, in such embodiment, color visibility at a side viewing angle may be improved as compared with a conventional light emitting element emitting blue light having a sharp emission peak.

In some embodiments, each of the first light emitting layer EML1, the second light emitting layer EML2, and the third light emitting layer EML3 may include a host and a dopant. The host is not particularly limited as long as it is a commonly used material, and the host may include at least one selected from, for example, tris(8-hydroxyquinolino) aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2"-dimethyl-biphenyl (CDBP), 2-Methyl-9,10-bis(naphthalen-2-yl)anthracene (MADN), and the like.

Each of the first light emitting layer EML1, the second light emitting layer EML2, and the third light emitting layer EML3 for emitting blue light may include, for example, a fluorescent material including at least one selected from spiro-DPVBi, spiro-6P, distyryl-benzene (DSB), distyryl-arylene (DSA), polyfluorene (PFO)-based polymer, and poly (p-phenylene vinylene)-based polymer. In an alternative embodiment, for example, each of the first light emitting layer EML1, the second light emitting layer EML2, and the third light emitting layer EML3 may include a phosphorescent material including an organometallic complex such as (4,6-F2ppy)2Irpic.

As described above, one of the first light emitting layer EML1, the second light emitting layer EML2, and the third light emitting layer EML3 emits blue light of a wavelength band different from that of another of the first light emitting layer EML1, the second light emitting layer EML2, and the third light emitting layer EML3. In such an embodiment, the first light emitting layer EML1, the second light emitting layer EML2, and the third light emitting layer EML3 may include the same material as each other and a method of adjusting a resonance distance may be used to allow at least two selected from the first light emitting layer EML1, the second light emitting layer EML2, and the third light emitting layer EML3 emit blue light of different wavelength bands. Alternatively, one of the first light emitting layer EML1, the second light emitting layer EML2, and the third light emitting layer EML3 and another of the first light emitting layer EML1, the second light emitting layer EML2, and the third light emitting layer EML3 may include different materials from each other to allow at least two selected from the first light emitting layer EML1, the second light emitting layer EML2, and the third light emitting layer EML3 emit blue light of different wavelength bands.

However, the disclosure is not limited thereto, and the blue light emitted from each of the first light emitting layer EML1, the second light emitting layer EML2, and the third light emitting layer EML3 may have a peak wavelength of about 440 nm to about 480 nm, and the first light emitting layer EML1, the second light emitting layer EML2, and the third light emitting layer EML3 may include or be made of the same material as each other.

In another alternative embodiment, at least one selected from the first light emitting layer EML1, the second light emitting layer EML2, and the third light emitting layer EML3 may emit the first blue light having the first peak wavelength described above, another of the first light emitting layer EML1, the second light emitting layer EML2, and the third light emitting layer EML3 may emit second blue light having a second peak wavelength different from the first peak wavelength, and the other of the first light emitting layer EML1, the second light emitting layer EML2, and the third light emitting layer EML3 may emit third blue light having a third peak wavelength different from the first peak wavelength and the second peak wavelength. In some alternative embodiments, a range of any one of the first peak wavelength, the second peak wavelength, and the third peak wavelength may be about 440 nm or more and less than about 460 nm. In such embodiments, a range of another of the first peak wavelength, the second peak wavelength, and the third peak wavelength may be about 460 nm or more and less than about 470 nm, and a range of the other of the first peak wavelength, the second peak wavelength, and the third peak wavelength may be about 470 nm or more and about 480 nm or less.

According to some alternative embodiments, the emitted light L1 emitted from the light emitting layer OL is blue light and includes a long wavelength component, an intermediate wavelength component, and a short wavelength component. Accordingly, finally, the light emitting layer OL may emit blue light having a broader emission peak as the emitted light L1, and color visibility at a side viewing angle may be improved.

According to embodiments as described above, light efficiency is increased and a lifespan of the display device may be improved as compared with a conventional light emitting element that does not adopt the tandem structure, that is, the structure in which the plurality of light emitting layers are stacked.

The first charge generating layer CGL1 may be positioned between the first light emitting stack ST1 and the second light emitting stack ST2. The first charge generating layer CGL1 may serve to inject charges into each light emitting layer. The first charge generating layer CGL1 may serve to adjust a charge balance between the first light emitting stack ST1 and the second light emitting stack ST2. The first charge generating layer CGL1 may include an n-type charge generating layer CGL11 and a p-type charge generating layer CGL12. The p-type charge generating layer CGL12 may be disposed on the n-type charge generating layer CGL11, and may be positioned between the n-type charge generating layer CGL11 and the second light emitting stack ST2.

In the first charge generating layer CGL1, the n-type charge generating layer CGL11 and the p-type charge generating layer CGL12 may have a junction structure. The n-type charge generating layer (CGL11) may be disposed more adjacent to the anode electrodes AE1, AE2 (see FIG. 5), and AE3 (see FIG. 5) of the anode electrodes AE1, AE2 (see FIG. 5), and AE3 (see FIG. 5) and the cathode electrode CE. The p-type charge generating layer CGL12 may be disposed more adjacent to the cathode electrode CE of the anode electrodes AE1, AE2 (see FIG. 5), and AE3 (see FIG. 5) and the cathode electrode CE. The n-type charge generating layer CGL11 supplies electrons to the first light emitting layer EML1 adjacent to the anode electrodes AE1, AE2 (see FIG. 5), and AE3 (see FIG. 5), and the p-type charge generating layer CGL12 supplies holes to the second light emitting layer EML2 included in the second light emitting stack ST2. The first charge generating layer CGL1 may be disposed between the first light emitting stack ST1 and the second light emitting stack ST2 to provide charges to the respective light emitting layers, thereby increasing luminous efficiency and decreasing a driving voltage.

The first light emitting stack ST1 may be positioned on the first anode electrode AE1, the second anode electrode AE2 (see FIG. 5), and the third anode electrode AE3 (see FIG. 5), and may further include a first hole transport layer HTL1, a first electron block layer BIL1, and a first electron transport layer ETL1.

The first hole transport layer HTL1 may be positioned on the first anode electrode AE1, the second anode electrode AE2 (see FIG. 5), and the third anode electrode AE3 (see FIG. 5). The first hole transport layer HTL1 may serve to smoothly transport holes and may include a hole transport material. The hole transport material may include a carbazole-based derivative such as N-phenylcarbazole and polyvinylcarbazole, a fluorene-based derivative, a triphenylamine-based derivative such as N,N'-bis(3-methylphenyl)-N, N'-diphenyl-[1,1-biphenyl]-4,4'-diamine (TPD), 4,4',4"-tris (N-carbazolyl)triphenylamine (TCTA), N,N'-di(1-naphthyl)-N,N'-diphenylbenzidine (NPB), 4,4'-Cyclohexylidene bis[N,N-bis(4-methylphenyl) benzenamine] (TAPC), or the like, but is not limited thereto. In some embodiments, the first hole transport layer HTL1 may be formed as a single layer. Alternatively, in some embodiments, the first hole transport layer HTL1 may be formed as or defined by a plurality of layers. In an embodiment where the first hole transport layer HTL1 is formed as or defined by the plurality of layers, the respective layers may include different materials from each other.

The first electron block layer BIL1 may be positioned on the first hole transport layer HTL1, and may be positioned between the first hole transport layer HTL1 and the first light emitting layer EML1. The first electron block layer BIL1 may include a hole transport material and a metal or a metal compound so as to prevent electrons generated in the first light emitting layer EML1 from flowing into the first hole transport layer HTL1. In some embodiments, each of the first hole transport layer HTL1 and the first electron block layer BIL1 may be formed as or defined by a single layer in which respective materials are mixed with each other. However, the disclosure is not limited thereto. In some alternative embodiments, the first electron block layer BIL1 may be omitted.

The first electron transport layer ETL1 may be positioned on the first light emitting layer EML1, and may be positioned between the first charge generating layer CGL1 and the first light emitting layer EML1. In some embodiments, the first electron transport layer ETL1 may include an electron transport material such as Tris(8-hydroxyquinolinato)aluminum (Alq3), 1,3,5-Tri(1-phenyl-1H-benzo[d]imidazol-2-yl)phenyl(TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di (naphthalene-2-yl)anthracene (ADN), and mixtures thereof. However, the disclosure is not limited to the type of the electron transport material described above. In some embodiments, the first electron transport layer ETL1 may be formed as or defined by a single layer. Alternatively, in some embodiments, the first electron transport layer ETL1 may be formed as or defined by a plurality of layers. In an embodiment where the first electron transport layer ETL1 is formed as or defined by the plurality of layers, the respective layers may include different materials from each other.

The second light emitting stack ST2 may be positioned on the first charge generating layer CGL1, and may further include a second hole transport layer HTL2, a second electron block layer BIL2, and a second electron transport layer ETL1.

The second hole transport layer HTL2 may be positioned on the first charge generating layer CGL1. The second hole transport layer HTL2 may include or be made of the same material as the first hole transport layer HTL1, or may include at least one material selected from the materials listed above as the material included in the first hole transport layer HTL1. The second hole transport layer HTL2 may be formed as or defined by a single layer or a plurality of layers. In an embodiment where the second hole transport layer HTL2 is formed as or defined by the plurality of layers, the respective layers may include different materials from each other.

The second electron block layer BIL2 may be positioned on the second hole transport layer HTL2, and may be positioned between the second hole transport layer HTL2 and the first light emitting layer EML2. The second electron block layer BIL2 may include or be made of the same material as the first electron block layer BIL1 and may have the same structure as the first electron block layer BIL1, or may include at least one material selected from the materials listed above as the material included in the first electron block layer BIL1. In some alternative embodiments, the second electron block layer BIL2 may be omitted.

The second electron transport layer ETL2 may be positioned on the second light emitting layer EML2, and may be positioned between the second charge generating layer CGL2 and the second light emitting layer EML2. The second electron transport layer ETL2 may include or be made of the same material as the first electron transport layer ETL1 and may have the same structure as the first electron transport layer ETL1, or may include at least one material selected from the materials listed above as the material included in the first electron transport layer ETL1. The second electron transport layer ETL2 may be formed as or defined by a single layer or a plurality of layers. In an embodiment where the second electron transport layer ETL2 is formed as or defined by the plurality of layers, the respective layers may include different materials from each other.

The second charge generating layer CGL2 may be positioned on the second light emitting stack ST2, and may be positioned between the second light emitting stack ST2 and the third light emitting stack ST3.

The second charge generating layer CGL2 may have the same structure as the first charge generating layer CGL1 described above. In an embodiment, for example, the second charge generating layer CGL2 may include an n-type charge generating layer CGL21 disposed more adjacent to the second light emitting stack ST2 and a p-type charge generating layer CGL22 disposed more adjacent to the cathode electrode CE. The p-type charge generating layer CGL22 may be disposed on the n-type charge generating layer CGL21.

The second charge generating layer CGL2 may have a structure in which the n-type charge generating layer CGL21 and the p-type charge generating layer CGL22 are in contact with each other. The first charge generating layer CGL1 and the second charge generating layer CGL2 may include or be made of different materials from or the same material as each other.

The third light emitting stack ST3 may be positioned on the second charge generating layer CGL2, and may further include a third hole transport layer HTL3 and a third electron transport layer ETL3.

The third hole transport layer HTL3 may be positioned on the second charge generating layer CGL2. The third hole transport layer HTL3 may include or be made of the same material as the first hole transport layer HTL1, or may include at least one material selected from the materials listed above as the material included in the first hole transport layer HTL1. The third hole transport layer HTL3 may be formed as or defined by a single layer or a plurality of layers. In an embodiment where the third hole transport layer HTL3 is formed as or defined by the plurality of layers, the respective layers may include different materials from each other.

The third electron transport layer ETL3 may be positioned on the third light emitting layer EML3, and may be positioned between the cathode electrode CE and the third light emitting layer EML3. The third electron transport layer ETL3 may include or be made of the same material as the first electron transport layer ETL1 and may have the same structure as the first electron transport layer ETL1, or may include at least one material selected from the materials listed above as the material included in the first electron transport layer ETL1. The third electron transport layer ETL3 may be formed as a single layer or be formed as or defined by a plurality of layers. In an embodiment where the third electron transport layer ETL3 is formed as or defined by the plurality of layers, the respective layers may include different materials from each other.

Although not illustrated in the drawing, a hole injection layer (HIL) may be further positioned between the first light emitting stack ST1 and the first anode electrode AE1, the second anode electrode AE2 (see FIG. 5), and the third anode electrode AE3 (see FIG. 5), between the second light emitting stack ST2 and the first charge generating layer CGL1, or between the third light emitting stack ST3 and the second charge generating layer CGL2. The hole injection layer may serve to more smoothly inject holes into the first light emitting layer EML1, the second light emitting layer EML2, and the third light emitting layer EML3. In some embodiments, the hole injection layer may include or be made of at least one selected from cupper phthalocyanine (CuPc), poly(3,4)-ethylenedioxythiophene (PEDOT), polyaniline (PANI), and N,N-dinaphthyl-N,N'-diphenyl benzidine (NPD), but is not limited thereto. In some embodiments, the hole injection layer may also be positioned between the first light emitting stack ST1 and the first anode electrode AE1, the second anode electrode AE2 (see FIG. 5), and the third anode electrode AE3 (see FIG. 5), between the second light emitting stack ST2 and the first charge generating layer CGL1, and between the third light emitting stack ST3 and the second charge generating layer CGL2.

Although not illustrated in the drawings, an electron injection layer (EIL) may be further positioned between the third electron transport layer ETL3 and the cathode electrode CE, between the second charge generating layer CGL2 and the second light emitting stack ST2, or between the first charge generating layer CGL1 and the first light emitting stack ST1. The electron injection layer may serve to smoothly inject electrons, and may include or be made of tris(8-hydroxyquinolino)aluminum (Alq3), PBD, TAZ, spiro-PBD, BAlq, or SAlq, but is not limited thereto. In addition, the electron injection layer may include a metal halide compound, for example, at least one selected from $MgF_2$, LiF, NaF, KF, RbF, CsF, FrF, LiI, NaI, KI, RbI, CsI, FrI, and $CaF_2$, but is not limited thereto. In addition, the electron injection layer may include a lanthanum-based material such as Yb, Sm, or Eu. Alternatively, the electron injection layer may include both a metal halide material and a lanthanum-based material such as RbI:Yb or KI:Yb. When the electron injection layer includes both the metal halide material and the lanthanum-based material, the electron injection layer may be formed by co-deposition of the metal halide material and the lanthanum-based material. In some embodiments, the electron injection layer may also be positioned between the third electron transport layer ETL3 and the cathode electrode CE, between the second charge generating layer CGL2 and the second light emitting stack ST2, and between the first charge generating layer CGL1 and the first light emitting stack ST1.

In embodiments, a structure of the light emitting layer OL described above may be variously modified. In an alternative embodiment, for example, the light emitting layer OL may include only two light emitting stacks, or may include four or more light emitting stacks.

Referring to FIGS. 5 and 16 to 19, a thin film encapsulation layer 170 is disposed on the cathode electrode CE. The thin film encapsulation layer 170 is disposed in common in the first emission area LA1, the second emission area LA2, the third emission area LA3, and the non-emission area NLA. In some embodiments, the thin film encapsulation layer 170 directly covers the cathode electrode CE. In some embodiments, a capping layer (not illustrated) covering the cathode electrode CE may be further disposed between the thin film encapsulation layer TFE and the cathode electrode CE. In such embodiments, the thin film encapsulation layer TFE may directly cover the capping layer.

In some embodiments, the thin film encapsulation layer 170 may include a first encapsulation inorganic layer 171, an encapsulation organic layer 173, and a second encapsulation inorganic layer 175 sequentially stacked on the cathode electrode CE.

In some embodiments, each of the first encapsulation inorganic layer 171 and the second encapsulation inorganic layer 175 may include or be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

In some embodiments, the encapsulation organic layer 173 may include or be made of an acrylic resin, a methacrylic resin, polyisoprene, a vinyl-based resin, an epoxy-based resin, a urethane-based resin, a cellulose-based resin, a perylene-based resin, or the like.

However, a structure of the thin film encapsulation layer 170 is not limited to those described above, and a stacked structure of the thin film encapsulation layer 170 may be variously modified.

Hereinafter, embodiments of the color conversion substrate 30 will be described with reference to FIGS. 20 to 23 in addition to FIGS. 5 to 19.

FIG. 20 is a plan view illustrating a schematic arrangement of a first color filter and a color pattern in the color conversion substrate of the display device according to an embodiment, FIG. 21 is a plan view illustrating a schematic arrangement of a light blocking member in the color conversion substrate of the display device according to an embodiment, FIG. 22 is a plan view illustrating a schematic arrangement of a second color filter and a third color filter in the color conversion substrate of the display device according to an embodiment, and FIG. 23 is a plan view illustrating a schematic arrangement of a first wavelength conversion pattern, a second wavelength conversion pattern, and a light-transmitting pattern in the color conversion substrate of the display device according to an embodiment.

Referring to FIGS. 5 to 23, a second base part 310 (illustrated in FIGS. 5 and 16 to 19) may include or be made of a material having light-transmitting properties. In some embodiments, the second base part 310 may include a glass substrate or a plastic substrate. In some embodiments, the second base part 310 may further include a separate layer positioned on the glass substrate or the plastic substrate, for example, an insulating layer such as an inorganic layer.

In some embodiments, as illustrated in FIG. 4, the plurality of light-transmitting areas TA1, TA2, TA3, TA4, TA5, and TA6 and the light blocking area BA may be defined in the second base part 310, as described above.

Referring to FIGS. 5 and 16 to 20, first color filters 231 and a color pattern 250 may be positioned on one surface of the second base part 310 facing the display substrate 10.

The first color filters 231 may be positioned on one surface of the second base part 310, and may overlap the first light-transmitting area TA1 and the fourth light-transmitting area TA4. In some embodiments, the first color filter 231 overlapping the first light-transmitting area TA1 and the first color filter 231 overlapping the fourth light-transmitting area TA4 may be spaced apart from each other in the second direction D2. In some embodiments, a seventh color pattern 257 to be described later may be positioned between the first color filter 231 overlapping the first light-transmitting area TA1 and the first color filter 231 overlapping the fourth light-transmitting area TA4. In some embodiments, the seventh color pattern 257 may be connected to the first color filter 231 overlapping the first light-transmitting area TAT and the first color filter 231 overlapping the fourth light-transmitting area TA4.

The first color filter 231 may selectively transmit the light of the first color (e.g., the blue light) and block or absorb the light of the second color (e.g., the red light) and the light of the third color (e.g., the green light). In some embodiments, the first color filter 231 may be a blue color filter, and may include a blue colorant such as a blue dye or a blue pigment. In specification, a colorant may include at least one selected from a dye and a pigment.

The color pattern 250 may absorb a portion of light introduced into the color conversion substrate 30 from the outside of the display device 1 to reduce reflected light due to external light. In the display device 1, the external light is reflected to a large extent, which may cause a distortion of a color gamut of the color conversion substrate 30. However, in embodiments, the color pattern 250 may be disposed on the second base part 310 to reduce an amount of reflected external light and reduce distortion of colors due to the external light.

In some embodiments, the color pattern 250 may include a blue colorant such as a blue dye or a blue pigment. In some embodiments, the color pattern 250 may include or be made of the same material as the first color filter 231, and may be formed simultaneously with the first color filter 231 in a process of forming the first color filter 231. That is, the first color filter 231 and the color pattern 250 may be simultaneously formed by applying a photosensitive organic material including a blue colorant onto one surface of the second base part 310 and exposing and developing the photosensitive organic material.

In some embodiments, a thickness of the color pattern 250 measured along the third direction D3 may be substantially the same as a thickness of the first color filter 231. In an embodiment where the color pattern 250 includes the blue colorant, external light or reflected light transmitted through the color pattern 250 has a blue wavelength band. Color sensibility of user's eyes differs according to a color of light. More specifically, light of a blue wavelength band may be perceived less sensitively by a user than light of a green wavelength band and light of a red wavelength band. Accordingly, the color pattern 250 includes the blue colorant, and thus, the user may relatively less sensitively perceive the reflected light.

The color pattern 250 may be positioned on one surface of the second base part 310, and may overlap the light blocking area BA. In addition, the color pattern 250 may be disposed to overlap the non-emission area NLA. In some embodiments, the color pattern 250 may be in direct contact with one surface of the second base part 310. In an alternative embodiment where a separate buffer layer for preventing introduction of impurities is disposed on one surface of the second base part 310, the color pattern 250 may be in direct contact with the buffer layer.

As illustrated in FIG. 20, in some embodiments, the color pattern 250 may be disposed over the entire light blocking area BA. In some embodiments, the color pattern 250 may include first color patterns 251 overlapping the first light blocking areas BA1, second color patterns 252 overlapping the second light blocking areas BA2, third color patterns 253 overlapping the third light blocking areas BA3, fourth color patterns 254 overlapping the fourth light blocking areas BA4, fifth color patterns 255 overlapping the fifth light blocking areas BA5, sixth color patterns 256 overlapping the sixth light blocking areas BA6, and seventh color patterns 257 overlapping the seventh light blocking areas BA7.

In some embodiments, the seventh color pattern 257 may be connected to the first color pattern 251, the second color pattern 252, the third color pattern 253, the fourth color pattern 254, the fifth color pattern 255, and the sixth color pattern 256.

In such embodiments, the color pattern 250 may be connected to the first color filters 231.

Referring to FIGS. 5, 16 to 19, and 21, the light blocking member 220 may be positioned on one surface of the second base part 310 facing the display substrate 10. The light blocking member 220 may be disposed to overlap the light blocking area BA to block transmission of light. In some embodiments, as illustrated in FIG. 21, the light blocking member 220 may be disposed in an approximately lattice shape in a plan view.

In some embodiments, the light blocking member 220 may include an organic light blocking material, and may be formed by a coating process, an exposing process, and the like, of the organic light blocking material. In some embodiment, the light blocking member 220 may include a dye or a pigment having light blocking properties, and may be a black matrix.

As described above, the external light may cause a distortion of the color gamut of the color conversion panel. In embodiments where the light blocking member 220 is positioned on the second base part 310, at least a portion of the external light is absorbed by the light blocking member 220. Accordingly, distortion of colors due to external light reflection may be reduced. In some embodiments, the light blocking member 220 may prevent the occurrence of color mixing due to permeation of light between adjacent light-transmitting areas, and accordingly, may further improve the color gamut.

As illustrated in FIG. 21, in some embodiments, the light blocking member 220 may include first light blocking areas 221 overlapping the first light blocking areas BA1, second light blocking areas 222 overlapping the second light blocking areas BA2, third light blocking areas 223 overlapping the third light blocking areas BA3, fourth light blocking areas 224 overlapping the fourth light blocking areas BA4, fifth light blocking areas 225 overlapping the fifth light blocking areas BA5, sixth light blocking areas 226 overlapping the sixth light blocking areas BA6, and seventh light blocking areas 227 overlapping the seventh light blocking areas BA7. In some embodiments, the first light blocking member 221, the second light blocking member 222, and the third light blocking member 223 may be connected to the seventh light blocking member 227, and the fourth light blocking member 224, the fifth light blocking member 225, and the sixth light blocking member 226 may also be connected to the seventh light blocking member 227.

The light blocking member 220 may be positioned on the color pattern 250. In some embodiments, the first light blocking member 221 may be positioned on the first color pattern 251, the second light blocking member 222 may be positioned on the second color pattern 252, the third light blocking member 223 may be positioned on the third color pattern 253, the fourth light blocking member 224 may be positioned on the fourth color pattern 254, the fifth light blocking member 225 may be positioned on the fifth color pattern 255, the sixth light blocking member 226 may be positioned on the sixth color pattern 256, and the seventh light blocking member 227 may be positioned on the seventh color pattern 257.

The color pattern 250 may be positioned between the light blocking member 220 and the second base part 310, and thus, in some embodiments, the light blocking member 220 may not be in contact with the second base part 310.

As illustrated in FIGS. 5, 16 to 19, and 22, a second color filter 233 and a third color filter 235 may be positioned on one surface of the second base part 310 facing the display substrate 10.

The second color filter 233 may be disposed to overlap the second light-transmitting area TA2 and the fifth light-transmitting area TA5, and the third color filter 235 may be disposed to overlap the third light-transmitting area TA3 and the sixth light-transmitting area TA6.

As illustrated in FIG. 5, in some embodiments, one side of the second color filter 233 may be disposed to overlap the first light blocking area BA1, and may be positioned on the first color pattern 251 and the first light blocking member 221. The opposing side of the second color filter 233 may be disposed to overlap the second light blocking area BA2, and may be positioned on the second color pattern 252 and the second light blocking member 222.

As illustrated in FIG. 5, in some embodiments, one side of the third color filter 235 may overlap the second light blocking area BA2, and may be positioned on the second color pattern 252 and the second light blocking member 222. In addition, in some embodiments, the opposing side of the third color filter 235 may overlap the third light blocking area BA3, and may be positioned on the third color pattern 253 and the third light blocking member 223.

As illustrated in FIG. 22, in some embodiments, each of the second color filter 233 and the third color filter 235 may have a stripe shape extending along the second direction D2, and may traverse the seventh light blocking area BA7 between the first row RT1 and the second row RT2. Accordingly, the second color filter 233 and the third color filter 235 may be positioned on the seventh light blocking member 227 in the seventh light blocking area BA7, and may cover the seventh color pattern 257 and the seventh light blocking member 227 along the second direction D7 in the seventh light blocking area BA7. However, the disclosure is not limited thereto, and in an alternative embodiment, at least one selected from the second color filter 233 and the third color filter 235 may have a form of island patterns spaced apart from each other along the second direction D2.

In some embodiments, the second color filter 233 may block or absorb the light of the first color (e.g., the blue light). That is, the second color filter 233 may function as a blue light blocking filter blocking the blue light. In some embodiments, the second color filter 233 may selectively transmit the light of the second color (e.g., the red light) and block or absorb the light of the first color (e.g., the blue light) and the light of the third color (e.g., the green light). In an embodiment, for example, the second color filter 233 may be a red color filter, and may include a red colorant such as a red dye or a red pigment.

The third color filter 235 may block or absorb the light of the first color (e.g., the blue light). That is, the third color filter 235 may also function as a blue light blocking filter. In some embodiments, the third color filter 235 may selectively transmit the light of the third color (e.g., the green light) and block or absorb the light of the first color (e.g., the blue light) and the light of the second color (e.g., the red light). In an embodiment, for example, the third color filter 235 may be a green color filter, and may include a green colorant such as a green dye or a green pigment.

As illustrated in FIGS. 5 and 16 to 19, a first stack 321 covering the light blocking member 220 (see FIG. 20), the color pattern 250, the first color filter 231, the second color the filter 233, and the third color filter 235 may be positioned on one surface of the second base part 310. In some embodiments, the first stack 321 may be in direct contact with the first color filter 231, the second color filter 233, and the third color filter 235.

The first stack 321 may be further in contact with the light blocking member 220 (see FIG. 20). In an embodiment, for example, as illustrated in FIG. 5, the first light blocking member 221 may be in direct contact with the first stack 321 in the first light blocking area BA1, the second light blocking member 222 may be in contact with the first stack 321 in the second light blocking area BA2, and the third light blocking member 223 may be in contact with the first stack 321 in the third light blocking area BA3. In such an embodiment, as illustrated in FIG. 19, the seventh light blocking member 227 may be in direct contact with the first stack 321 in the seventh light blocking area BA7.

A portion of the first stack 321 may constitute a blue light reflective layer 320 together with a second stack 323 to be described later.

In some embodiments, the first stack 321 may include two or more layers having different refractive indices from each other, and each of the two or more layers may be a single layer.

In such embodiments, the first stack 321 may include first layers 321a having a first refractive index n1 and second layers 321b having a second refractive index n2 different from the first refractive index n1, as illustrated in FIGS. 7, 9, 10, 12, 13, and 15. In some embodiments, the first refractive index n1 of the first layer 321a may be greater than the second refractive index n2 of the second layer 321b. In an embodiment, for example, a difference between the first refractive index n1 and the second refractive index n2 may be about 0.2 or more and about 0.6 or less.

The first layer 321a and the second layer 321b may include or be made of an inorganic material. In some embodiments, the first layer 321a and the second layer 321b may include different inorganic materials from each other. In an embodiment, for example, the first layer 321a having the first refractive index n1 that is relatively great may include a first inorganic material. Here, the first inorganic material may include at least one selected from $TiO_x$, $TaO_x$, $HfO_x$, $ZrO_x$, and $SiN_x$. The second layer 321b having the second refractive index n2 that is relatively small may include a second inorganic material different from the first inorganic material. Here, the second inorganic material may include at least one selected from $SiO_x$ and $SiCO_x$.

In some embodiments, the first layer 321a and the second layer 321b may be formed by chemical vapor deposition, but are not limited thereto, and may also be formed by other deposition methods.

In some embodiments, the first stack 321 may have a structure in which the first layers 321a and the second layers 321b are alternately stacked one on another. An embodiment where the first stack 321 has a structure including a total of seven layers is illustrated in FIGS. 7 and 9. However, the number of layers included in the first stack 321 is not limited to the seven described above. In some embodiments, as illustrated in FIG. 10, the first stack 321 may include a total of m1 layers. Here, m1 may be an integer of 2 or more and 9 or less.

In an area of the first stack 321 that is not in contact with the second stack 323, for example, the first light-transmitting area TA1, a portion of the blue light transmitted through a light-transmitting pattern 330 may be reflected by the first stack 321, and the other portion of the blue light may be transmitted through the first stack 321 and then emitted to the outside. In an embodiment where the total number of layers included in the first stack 321 is two or more, a portion of the blue light may be reflected and the other of the blue light may be transmitted, and when the total number of layers included in the first stack 321 is nine or less, a portion of the blue light may be transmitted through the light-transmitting pattern 330 and the first stack 321 and then provided to the outside to an enough degree (degree enough to be visually recognizable by a user or enough to implement an image).

In some embodiments, a blue light reflectance of the first stack 321 may be about 20% or more and less than about 50%. The blue light reflectance refers to a ratio of an amount of reflected blue light to an amount of incident blue light.

A layer positioned at the lowermost portion among the first layers 321a and the second layers 321b included in the first stack 321 may be in direct contact with the first color filter 231, the second color filter 233, the third color filter 235, and the light blocking member 220. Here, the layer positioned at the lowermost portion refers to a layer most adjacent to the second base part 310 among the layers included in the first stack 321. In an embodiment, for example, where the first layer 321a is positioned at the lowermost portion of the first stack 321, the first layer 321a positioned at the lowermost portion may be in direct contact with the first color filter 231 in the first light-transmitting area TAT, as illustrated in FIG. 7. In such an embodiment, as illustrated in FIG. 9, the first layer 321a positioned at the lowermost portion may be in direct contact with the second color filter 233 in the second light-transmitting area TA2. In such an embodiment, although not illustrated in the drawing, the first layer 321a positioned at the lowermost portion may be in direct contact with the third color filter 235 in the third light-transmitting area TA3.

A layer positioned at the uppermost portion among the first layers 321a and the second layers 321b included in the first stack 321 may be in direct contact with a light-transmitting pattern 330 to be described later in the first light-transmitting area TAT, and may be in direct contact with a second stack 323 to be described later in the second light-transmitting area TA2 and the third light-transmitting area TA3. Here, the layer positioned at the uppermost portion refers to a layer farthest from the second base part 310 among the layers included in the first stack 321.

In an embodiment, for example, where the first layer 321a is positioned at the uppermost portion of the first stack 321, the first layer 321a positioned at the uppermost portion may be in direct contact with the light-transmitting pattern 330 in the first light-transmitting area TAT, as illustrated in FIG. 7. In such an embodiment, the first layer 321a positioned at the uppermost portion may be in direct contact with the second stack 323 in the second light-transmitting area TA2, as illustrated in FIG. 9, and may also be in direct contact with the second stack 323 in the third light-transmitting area TA3, although not illustrated in the drawing.

However, the stacking order of the first stack 321 is not limited thereto.

As illustrated in FIG. 13, in an alternative embodiment, the second layer 321b may be positioned on the uppermost portion of the first stack 321. In such an embodiment, the second layer 321b may be in direct contact with the light-transmitting pattern 330 in the first light-transmitting area TAT, and may be in direct contact with the second stack 323 in the second light-transmitting area TA2 and the third light-transmitting area TA3.

In an embodiment, although not illustrated in the drawings, the second layer 321b rather than the first layer 321a may be positioned at the lowermost portion of the first stack 321.

In some embodiments, the first layer 321a and the second layer 321b included in the first stack 321 may include or be made of the inorganic material as described above. Accordingly, the first stack 321 may prevent damage to or contamination of the light blocking member 220, the color pattern 250, the first color filter 231, the second color filter 233, the third color filter 235, and the like, due to permeation of impurities such as moisture or air from the outside. In such embodiments, the first stack 321 may prevent the colorants included in the first color filter 231, the second color filter 233, and the third color filter 235 being diffused into components other than the first color filter 231, the second color filter 233, and the third color filter 235, for example, a first wavelength conversion pattern 340, second wavelength conversion pattern 350, and the like.

As illustrated in FIGS. 5, 16 to 19, and 23, the light-transmitting pattern 330 may be positioned on the first stack 321 of the blue light reflective layer 320.

In some embodiments, the light-transmitting pattern 330 may be formed by applying a photosensitive material and exposing and developing the photosensitive material. However, the disclosure is not limited thereto, and the light-transmitting pattern 330, the first wavelength conversion pattern 340, and the second wavelength conversion pattern 350 may also be formed by an inkjet method.

The light-transmitting pattern 330 may be positioned on the first stack 321, and may be positioned in the first light-transmitting area TAT and the fourth light-transmitting area TA4. In some embodiments, the light-transmitting pattern 330 may have a stripe shape extending along the second direction D2 and may traverse the seventh light blocking area BA7 between the first row RT1 and the second row RT2, as illustrated in FIG. 15. However, the disclosure is not limited thereto, and in some other embodiments, the light-transmitting pattern 330 may also have a structure in which a portion positioned in the first light-transmitting area TAT and a portion positioned in the fourth light-transmitting area TA4 are spaced apart from each other, for example, a form of an island pattern.

The light-transmitting pattern 330 may transmit incident light. The emitted light L1 provided from the first light emitting element ED1 may be the blue light, as described above. The emitted light L1, which is the blue light, is transmitted through the light-transmitting pattern 330 and the first color filter 231 and is then emitted to the outside of the display device 1. That is, first light La emitted from the first light-transmitting area TAT may be the blue light.

In some embodiments, the light-transmitting pattern 330 may include a first base resin 331, and may further include first scatterers 333 dispersed in the first base resin 331.

The first base resin 331 may include or be made of a material having high light transmittance. In some embodiments, the first base resin 331 may include or be made of an organic material. In an embodiment, for example, the first base resin 331 may include an organic material such as an epoxy-based resin, an acrylic resin, a cardo-based resin, or an imide-based resin.

The first scatterer 333 may have a refractive index different from that of the first base resin 331, and may form an optical interface with the first base resin 331. In an embodiment, for example, the first scatterers 333 may be light scattering particles. The first scatterer 333 is not particularly limited as long as it is a material capable of scattering at least a portion of transmitted light, but may be, for example, a metal oxide particle or an organic particle. In an embodiment, for example, a metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like. In an embodiment, for example, a material of the organic particle may include an acrylic resin, a urethane-based resin, or the like. The first scatterer 333 may scatter light in a random direction regardless of an incident direction of incident light without substantially converting a wavelength of the light transmitted through the light-transmitting pattern 330.

As described above, the light-transmitting pattern 330 may be in direct contact with the first stack 321 in the first light-transmitting area TA1.

As illustrated in FIGS. 5 and 16 to 19, the second stack 323 covering the light-transmitting pattern 330 and the first stack 321 may be positioned on one surface of the second base part 310. As described above, portions of the first stack 321 and the second stack 323 in contact with each other may constitute the blue light reflective layer 320.

In some embodiments, the second stack 323 may include two or more layers having different refractive indices from each other, and each of the two or more layers may be a single layer.

In some embodiments, the second stack 323 may include third layers 323a and fourth layers 323b having different refractive indices from each other, as illustrated in FIGS. 8, 9, 11, 12, 14, and 15. In some embodiments, the third layer 323a may have a second refractive index n2, and the fourth layer 323b may have a first refractive index n1. As described above, the first refractive index n1 may be greater than the second refractive index n2, and for example, a difference between the first refractive index n1 and the second refractive index n2 may be about 0.2 or more and about 0.6 or less.

In some embodiments, the third layer 323a and the fourth layer 323b may include or be made of different inorganic materials from each other. In an embodiment, for example, the fourth layer 323b having the first refractive index n1 that is relatively greater may include or be made of the first inorganic material that is the same as that of the first layer 321a. The third layer 323a having the second refractive index n2 that is relatively small may include or be made of the second inorganic material that is the same as that of the second layer 321b.

In some embodiments, the third layer 323a and the fourth layer 323b may be formed by chemical vapor deposition, but are not limited thereto, and may also be formed by other deposition methods.

In some embodiments, the second stack 323 may have a structure in which the third layers 323a and the fourth layers 323b are alternately stacked one on another. An embodiment where the second stack 323 has a structure including a total of seven layers is illustrated in FIGS. 8 and 9, but the disclosure is not limited thereto. In some embodiments, as illustrated in FIG. 11, the second stack 323 may include a total of m2 layers. Here, m2 may be an integer of 2 or more and 9 or less.

In an area of the second stack 323 that is not in contact with the first stack 321, for example, the first light-transmitting area TA1, a portion of the blue light, which is the emitted light L1 provided from the first light emitting element ED1, may be reflected by the second stack 323, and the other of the blue light may be transmitted through the second stack 323 and then provided to the light-transmitting pattern 330. In an embodiment where the total number of layers included in the second stack 323 is two or more, a portion of the blue light may be reflected and the other of the blue light may be transmitted, and when the total number of layers included in the second stack 323 is nine or less, a portion of the blue light may be provided through the light-transmitting pattern 330 to an enough degree (degree enough to be visually recognizable by a user or enough to display an image).

In some embodiments, a blue light reflectance of the second stack 323 may be about 20% or more and less than about 50%.

A layer positioned at the lowermost portion among the third layers 323a and the fourth layers 323b included in the second stack 323 may be in direct contact with the light-transmitting pattern 330 in the first light-transmitting area TA1, and may be in direct contact with the first stack 321 in the second light-transmitting area TA2 and the third light-transmitting area TA3. Here, the layer positioned at the lowermost portion refers to a layer most adjacent to the second base part 310 among the layers included in the second stack 323. In an embodiment, for example, where the third layer 323a is positioned at the lowermost portion of the second stack 323, the third layer 323a positioned at the lowermost portion may be in direct contact with the light-transmitting pattern 330 in the first light-transmitting area TAT, as illustrated in FIG. 8.

The uppermost layer of the first stack 321 in contact with the second stack 323 and the lowermost layer of the second stack 323 in contact with the first stack 321 may have different refractive indices from each other.

In an embodiment, for example, in the first light-transmitting area TAT, as illustrated in FIG. 7, the first layer 321a of the first stack 321 having the first refractive index n1 may be in contact with the light-transmitting pattern 330, and as illustrated in FIG. 8, the third layer 323a of the second stack 323 having the second refractive index n2 may be in contact with the light-transmitting pattern 330. That is, the layer of the first stack 321 and the layer of the second stack 323 in contact with the light-transmitting pattern 330 may have different refractive indices and include different materials.

In such an embodiment, as illustrated in FIG. 9, the third layer 323a positioned at the lowermost portion of the second stack 323 in the second light-transmitting area TA2 may be in contact with the first layer 321a positioned at the uppermost portion of the first stack 321 in the second light-transmitting area TA2. In such an embodiment, although not illustrated in the drawing, the third layer 323a positioned at the lowermost portion of the second stack 323 in the third light-transmitting area TA3 may be in contact with the first layer 321a positioned at the uppermost portion of the first stack 321 in the second light-transmitting area TA2.

A layer positioned at the uppermost portion among the third layers 323a and the fourth layers 323b included in the second stack 323 is in direct contact with a first wavelength conversion pattern 340 to be described later in the second light-transmitting area TA2 and is in direct contact with a second wavelength conversion pattern 350 to be described later in the third light-transmitting area TA3. Here, the layer positioned at the uppermost portion refers to a layer farthest from the second base part 310 among the layers included in the first stack 321.

In an embodiment, for example, where the third layer 323a is positioned at the uppermost portion of the second stack 323, the third layer 323a positioned at the uppermost portion may be in direct contact with a capping layer 390 in the first light-transmitting area TAT, as illustrated in FIG. 8, and may be in direct contact with the first wavelength conversion pattern 340 in the second light-transmitting area TA2, as illustrated in FIG. 9. In addition, although not illustrated in the drawings, the third layer 323a positioned at the uppermost portion may be in direct contact with the second wavelength conversion pattern 350 in the third light-transmitting area TA3.

However, the stacking order of the second stack 323 is not limited thereto.

In an embodiment where the second layer 321b having the second refractive index n2 is positioned at the uppermost portion of the first stack 321 as illustrated in FIGS. 13 and 15, the fourth layer 323b having the first refractive index n1 may be positioned at the lowermost portion of the second stack 323 as illustrated in FIGS. 14 and 15. In such an embodiment, the fourth layer 323b may be in direct contact with the light-transmitting pattern 330 in the first light-transmitting area TAT, and may be in direct contact with the second layer 321b of the first stack 321 in the second light-transmitting area TA2 and the third light-transmitting area TA3.

As described above, portions of the first stack 321 and the second stack 323 in contact with each other may constitute the blue light reflective layer 320. The blue light reflective layer 320 may have a structure in which two layers having different refractive indices from each other are alternately stacked one on another. The blue light reflective layer may reflect the blue light and may have low reflectance and high transmittance with respect to visible light (e.g., red light and green light) other than the blue light. That is, in the second light-transmitting area TA2 and the third light-transmitting area TA3, the first stack 321 and the second stack 323 may be in contact with each other to reflect the blue light among incident light and transmit the red light and the green light among the incident light. In addition, in an area in which the light-transmitting pattern 330 is disposed, the first stack 321 and the second stack 323 are not in contact with each other, and may be separated from each other with the light-transmitting pattern 330 interposed therebetween to reflect only a portion of the blue light among the incident light and transmit the other of the blue light and transmit the red light and the green light among the incident light.

That is, in a portion overlapping the light-transmitting pattern 330, the first stack 321 and the second stack 323 are not in contact with each other, and may be separated from each other to transmit the blue light. In addition, in a portion overlapping the first wavelength conversion pattern 340 and a portion overlapping the second wavelength conversion pattern 350, the first stack 321 and the second stack 323 may be in direct contact with each other to constitute the blue light reflective layer 320 and reflect most of the blue light.

In some embodiments, the total number of single layers included in the blue light reflective layer 320 may be 11 or more and 18 or less. That is, the sum of the number m1 of single layers included in the first stack 321 and the number m2 of single layers included in the second stack 323 may be 11 or more and 18 or less.

In an embodiment where the number of stacked single layers included in the blue light reflective layer 320 is 11 or more, the blue light may be reflected at an intended level. In an embodiment, where the number of stacked single layers included in the blue light reflective layer 320 is 18 or less, wavelength dependency of the reflected blue light does not increase and an increase in the entire absorption coefficient may be prevented, and accordingly, an increase in light energy loss may be prevented.

A blue light reflectance in a portion in which the first stack 321 and the second stack 323 are sequentially stacked may increase as compared with the blue light reflectance of each of the first stack 321 and the second stack 323. In some embodiments, the blue light reflectance of the portion in which the first stack 321 and the second stack 323 are continuously stacked, that is, the blue light reflective layer 320 may be about 90% or more, and in some embodiments, the blue light reflective layer 320 may have a blue light reflectance of about 99% or more. The first stack 321 and the second stack 323 are not in contact with each other and may be separated from each other only in the portion where the light-transmitting pattern 330 is positioned, and may be in contact with each other to constitute the blue light reflective layer 320 in an area other than the portion where the light-transmitting pattern 330 is positioned.

Referring to FIGS. 5, 16 to 19, and 23, the first wavelength conversion pattern 340 and the second wavelength conversion pattern 350 may be positioned on the second stack 323 of the blue light reflective layer 320.

The first wavelength conversion pattern 340 may be positioned on the second stack 323 of the blue light reflective layer 320, but may overlap the second light-transmitting area TA2 and the fifth light-transmitting area TA5. In some embodiments, the first wavelength conversion pattern 340 may have a stripe shape extending along the second direction D2 and may traverse the seventh light blocking area BA7 between the first row RT1 and the second row RT2, as illustrated in FIG. 23. However, the disclosure is not limited thereto, and in some alternative embodiments, the first wavelength conversion pattern 340 may also have a structure in which a portion positioned in the second light-transmitting area TA2 and a portion positioned in the fifth light-transmitting area TA5 are spaced apart from each other, for example, a form of an island pattern.

The first wavelength conversion pattern 340 may convert or shift a peak wavelength of the incident light to light having another specific peak wavelength and emit the light having another specific peak wavelength. In some embodiments, the first wavelength conversion pattern 340 may convert the emitted light L1 provided from the second light emitting element ED2 into red light having a peak wavelength in the range of about 610 nm to about 650 nm and emit the red light.

In some embodiments, the first wavelength conversion pattern 340 may include a second base resin 341 and first wavelength shifters 345 dispersed in the second base resin 341, and may further include second scatterers 343 dispersed in the second base resin 341.

The second base resin 341 may include or be made of a material having high light transmittance. In some embodiments, the second base resin 341 may include or be made of an organic material. In some embodiments, the second base resin 341 may include or be made of the same material as the first base resin 331, or may include at least one selected from the materials listed above as the material of the first base resin 331.

The first wavelength shifter 345 may convert or shift the peak wavelength of the incident light to another specific peak wavelength. In some embodiments, the first wavelength shifter 345 may convert the light L1 of the first color, which is the blue light provided from the second light emitting element ED2, into red light having a single peak wavelength in the range of about 610 nm to about 650 nm and emit the red light.

Examples of the first wavelength shifter 345 may include a quantum dot, a quantum rod, a phosphor, or the like. In an embodiment, for example, the quantum dot may be a particulate matter emitting a specific color while electrons are transitioning from a conduction band to a valence band.

The quantum dot may be a semiconductor nanocrystal material. The quantum dot may have a specific bandgap according to its composition and size to absorb light and then emit light having a unique wavelength. In an embodiment, for example, the semiconductor nanocrystal of the quantum dot may include group IV nanocrystals, group II-VI compound nanocrystals, group III-V compound nanocrystals, group IV-VI nanocrystals, or combinations thereof.

A group II-VI compound may be selected from a binary compound selected from the group consisting of CdSe, CdTe, ZnS, ZnSe, ZnTe, ZnO, HgS, HgSe, HgTe, MgSe, MgS, and mixtures thereof; a ternary compound selected InZnP, AgInS, CuInS, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A group III-V compound may be selected from the group consisting of a binary compound selected from GaN, GaP, GaAs, GaSb, AlN, AlP, AlAs, AlSb, InN, InP, InAs, InSb, and mixtures thereof; a ternary compound selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

A group IV-VI compound may be selected from the group consisting of a binary compound selected from SnS, SnSe, SnTe, PbS, PbSe, PbTe, and mixtures thereof; a ternary compound selected from SnSeS, SnSeTe, SnSTe, PbSeS, PbSeTe, PbSTe, SnPbS, SnPbSe, SnPbTe, and mixtures thereof; and a quaternary compound selected from SnPbSSe, SnPbSeTe, SnPbSTe, and mixtures thereof. A group IV element may be selected from the group consisting of Si, Ge, and mixtures thereof. A group IV compound may be a binary compound selected from SiC, SiGe, and mixtures thereof.

In such an embodiment, the binary compound, the ternary compound, or the quaternary compound may be present in a particle at a uniform concentration or may be present in the same particle in a state of partially different concentration distributions. In addition, the quantum dot may have a core/shell structure in which one quantum dot surrounds another quantum dot. An interface between a core and a shell may have a concentration gradient in which a concentration of element present in the shell decreases toward the center.

In some embodiments, the quantum dot may have a core-shell structure including a core including the above-described nanocrystals and a shell surrounding the core. The shell of the quantum dot may serve as a passivation layer for maintaining semiconductor characteristics by preventing chemical modification of the core and/or serve as a charging layer for imparting electrophoretic characteristics to the quantum dot. The shell may be a single layer or multiple layers. An interface between a core and a shell may have a concentration gradient in which a concentration of element present in the shell decreases toward the center. In an embodiment, for example, the shell of the quantum dot may include metal or non-metal oxide, a semiconductor compound, a combination thereof, or the like.

In such an embodiment, the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or a ternary compound such as $MgAl_2O_4$, $CoFe_2O_4$, $NiFe_2O_4$, or $CoMn_2O_4$, for example, but the disclosure is not limited thereto.

In such an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, for example, but the disclosure is not limited thereto.

The light emitted by the first wavelength shifter 345 may have a full width of half maximum (FWHM) of an emission wavelength spectrum of about 45 nm or less, about 40 nm or less, or about 30 nm or less, and therefore, color purity and color reproducibility of colors displayed by the display device 1 may be further improved. In addition, the light emitted by the first wavelength shifter 345 may be emitted toward several directions regardless of an incident direction of the incident light. Therefore, side visibility of the second color displayed in the second light-transmitting area TA2 may be improved.

A portion of the emitted light L1 provided from the second light emitting element ED2 is not converted into the red light by the first wavelength shifter 345, and may be transmitted through the first wavelength conversion pattern 340 and then emitted. As described above, the emitted light L1 may be the blue light, and thus, a component of the emitted light L1 that is not converted by the first wavelength conversion pattern 340 and is incident on the blue light reflective layer 320 may be reflected by the blue light reflective layer 320. In addition, light that is not reflected by the blue light reflective layer 320 and is transmitted through the blue light reflective layer 320 may be blocked by the second color filter 233. On the other hand, the red light converted by the first wavelength conversion pattern 340 among the emitted light L1 is transmitted through the blue light reflective layer 320 and the second color filter 233 and then emitted to the outside. That is, second light Lb emitted from the second light-transmitting area TA2 may be the red light.

The second scatterer 343 may have a refractive index different from that of the second base resin 341, and may form an optical interface with the second base resin 341. In an embodiment, for example, the second scatterers 343 may be light scattering particles. A detailed description of the second scatterer 343 other than that described above is substantially the same as or similar to that of the first scatterer 333, and will thus be omitted.

The second wavelength conversion pattern 350 is positioned on the second stack 323, but may be positioned in the third light-transmitting area TA3 and the sixth light-transmitting area TA6. In some embodiments, the second wavelength conversion pattern 350 may have a stripe shape extending along the second direction D2 and may traverse the seventh light blocking area BA7 between the first row RT1 and the second row RT2, as illustrated in FIG. 23.

However, the disclosure is not limited thereto, and in some alternative embodiments, the second wavelength conversion pattern 350 may also have a structure in which a portion positioned in the third light-transmitting area TA3 and a portion positioned in the sixth light-transmitting area TA6 are spaced apart from each other, for example, a form of an island pattern.

The second wavelength conversion pattern 350 may convert or shift a peak wavelength of the incident light to light having another specific peak wavelength and emit the light having another specific peak wavelength. In some embodiments, the second wavelength conversion pattern 350 may convert the emitted light L1 provided from the third light emitting element ED3 into green light in the range of about 510 nm to about 550 nm and emit the green light.

In some embodiments, the second wavelength conversion pattern 350 may include a third base resin 351 and second wavelength shifters 355 dispersed in the third base resin 351, and may further include second scatterers 353 dispersed in the third base resin 351.

The third base resin 351 may include or be made of a material having high light transmittance. In some embodiments, the third base resin 351 may include or be made of an organic material. In some embodiments, the third base resin 351 may include or be made of the same material as the first base resin 331, or may include at least one selected from the materials exemplified as the material of the first base resin 331.

The second wavelength shifter 355 may convert or shift the peak wavelength of the incident light to another specific peak wavelength. In some embodiments, the second wavelength shifter 355 may convert the blue light having a peak wavelength in the range of 440 nm to 480 nm into green light having a peak wavelength in the range of 510 nm to 550 nm.

In an embodiment, for example, the second wavelength shifter 355 may include a quantum dot, a quantum rod, a phosphor, or the like. A more detailed description of the second wavelength shifter 355 is substantially the same as or similar to that described above in the description of the first wavelength shifter 345, and will thus be omitted.

In some embodiments, both the first wavelength shifter 345 and the second wavelength shifter 355 may be constituted of quantum dots. In such embodiments, a particle size of the quantum dot constituting the first wavelength shifter 345 may be greater than a particle size of the quantum dot constituting the second wavelength shifter 355.

The second scatterer 353 may have a refractive index different from that of the third base resin 351, and may form an optical interface with the third base resin 351. In an embodiment, for example, the second scatterers 353 may be light scattering particles. A detailed description of the second scatterer 353 other than that described above is substantially the same as or similar to that of the second scatterer 343, and will thus be omitted.

The emitted light L1 emitted from the third light emitting element ED3 may be provided to the second wavelength conversion pattern 350, and the second wavelength shifter 355 may convert the emitted light L1 provided from the third light emitting element ED3 into green light having a peak wavelength in the range of about 510 nm to about 550 nm and emit the green light.

A portion of the emitted light L1, which is the blue light, is not converted into the green light by the second wavelength shifter 355, and may be transmitted through the second wavelength conversion pattern 350 and then incident on the blue light reflective layer 320, and may be reflected by the blue light reflective layer 320. In addition, a component transmitted through the blue light reflective layer 320 in the blue light incident on the blue light reflective layer 320 may be blocked by the third color filter 235. On the other hand, the green light converted by the second wavelength conversion pattern 350 among the emitted light L1 is transmitted through the blue light reflective layer 320 and the third color filter 235 and then emitted to the outside. Accordingly, third light Lc emitted from the third light-transmitting area TA3 to the outside of the display device 1 may be the green light.

In an embodiment where the emitted light L1 is mixed light of light of a deep blue color and light of a sky blue color, the emitted light L1 includes both a long wavelength component and a short wavelength component, and thus, a movement path of the emitted light L1 incident on the second wavelength conversion pattern 350 may be further increased. Accordingly, an amount of emitted light L1 provided to the second wavelength shifters 355 may further increase, and light conversion efficiency of the second wavelength conversion pattern 350 may increase. Therefore, the color reproducibility of the display device 1 may be further improved.

As illustrated in FIGS. 5 and 16 to 19, the capping layer 390 may be positioned on the first wavelength conversion pattern 340 and the second wavelength conversion pattern 350. The capping layer 390 may cover the second stack 323 of the blue light reflective layer 320 positioned on the light-transmitting pattern 330, the first wavelength conversion pattern 340, and the second wavelength conversion pattern 350. The capping layer 390 may be in contact with the second stack 323, and may seal the first wavelength conversion pattern 340 and the second wavelength conversion pattern 350. Accordingly, it is possible to prevent damage to or contamination of the light-transmitting pattern 330, the first wavelength conversion pattern 340, and the second wavelength conversion pattern 350 due to permeation of impurities such as moisture or air from penetrating from the outside. In some embodiments, the capping layer 390 may include or be made of an inorganic material. In some embodiments, the capping layer 390 may include or be made of an inorganic material such as $SiO_x$, $SiN_x$, or SiON. In an embodiment where both the second stack 323 and the capping layer 390 includes or are made of the inorganic material, inorganic-inorganic bonding may be performed on portions of the second stack 323 and the capping layer 390 in direct contact with each other, and introduction of moisture, air, or the like from the outside may be effectively blocked.

As illustrated in FIGS. 5 and 16 to 19, a color mixing preventing member 370 may be positioned on the capping layer 390. The color mixing preventing member 370 may be positioned in the light blocking area BA to block transmission of light. More specifically, the color mixing preventing member 370 may be positioned between the light-transmitting pattern 330 and the first wavelength conversion pattern 340 and between the first wavelength conversion pattern 340 and the second wavelength conversion pattern 350 to prevent color mixing between neighboring light-transmitting areas. In some embodiments, the color mixing preventing member 370 may have a stripe shape extending along the second direction D2 (see FIG. 23), and may prevent color mixing between light-transmitting areas neighboring to each other along the first direction D1 (see FIG. 23).

In some embodiments, the color mixing preventing member 370 may include an organic light blocking material, and may be formed by a coating process, an exposing process, and the like, of the organic light blocking material.

In an embodiment, for example, the color mixing preventing member 370 may include a dye or a pigment having light blocking properties, and may be a black matrix.

As described above, the filler 70 may be positioned in the space between the color conversion substrate 30 and the display substrate 10. In some embodiments, the filler 70 may be positioned between the capping layer 390 and the thin film encapsulation layer 170 and between the color mixing preventing member 370 and the thin film encapsulation layer 170, as illustrated in FIGS. 5 and 16 to 19. In some embodiments, the filler 70 may be in direct contact with the capping layer 390 and the color mixing preventing member 370.

Figure 24:
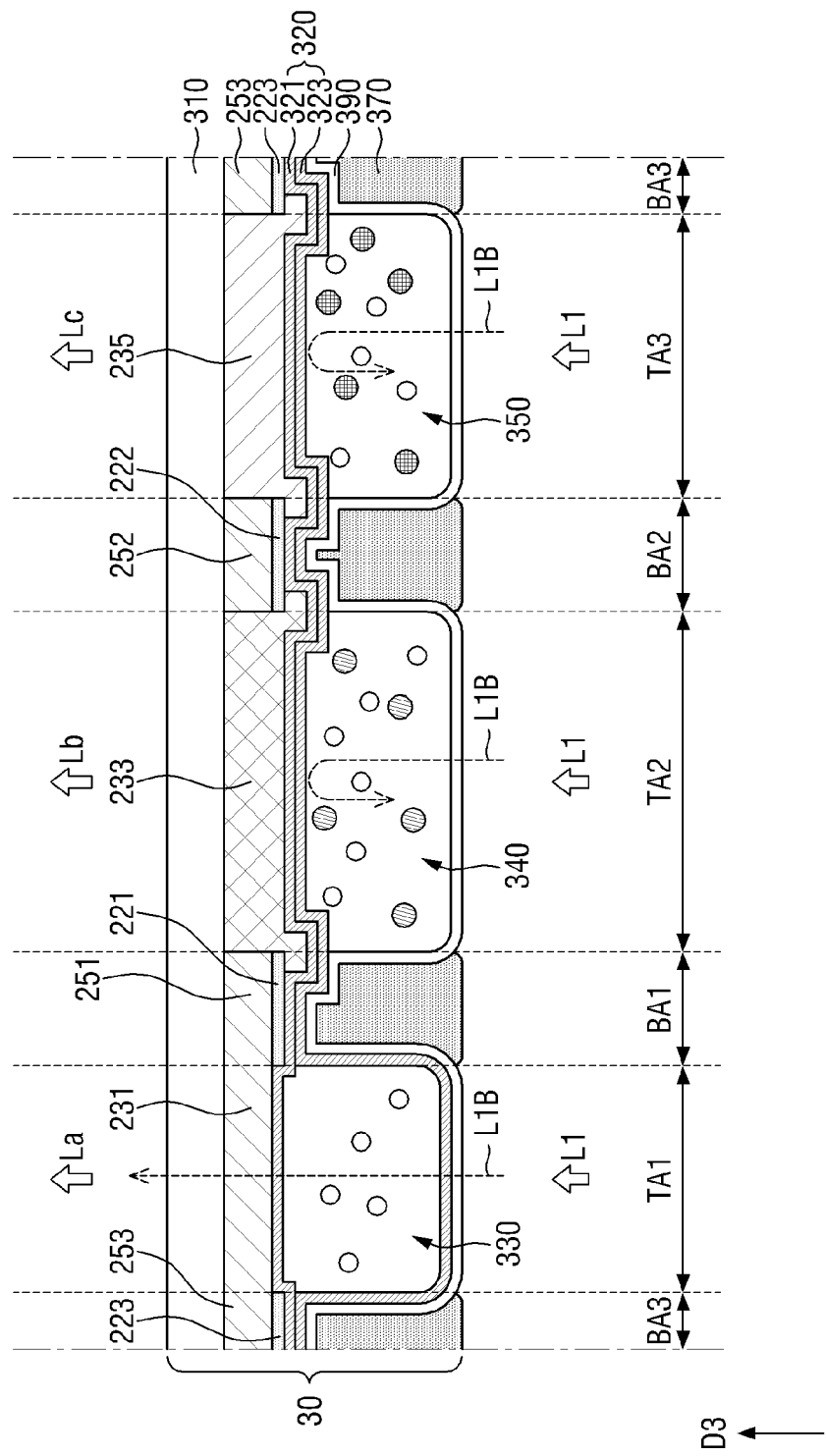
FIGS. 24 and 25 are views for describing a function of the blue light reflective layer illustrated in FIG. 5.
Figure 25:
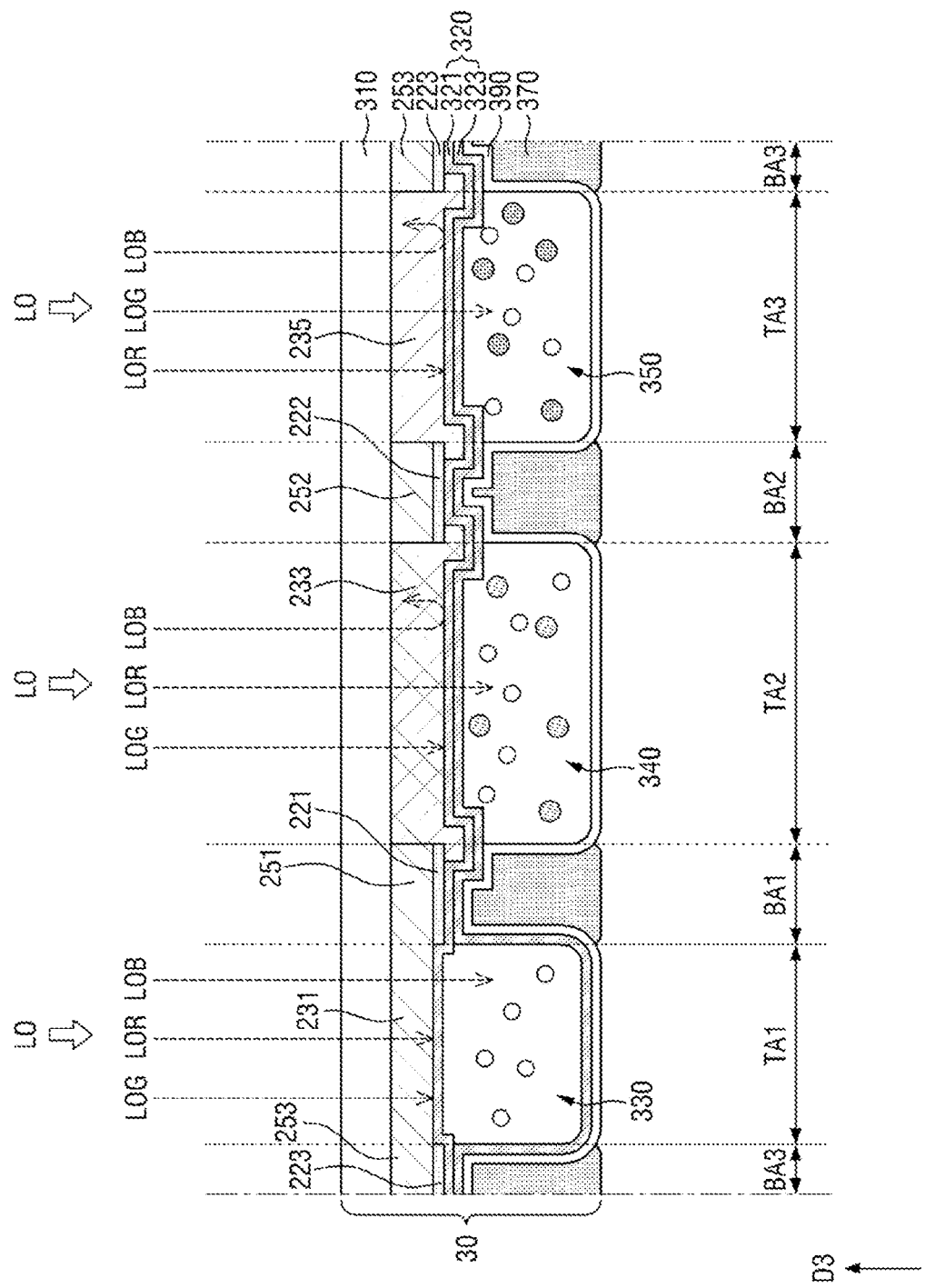

FIGS. 24 and 25 are views for describing a function of the blue light reflective layer illustrated in FIG. 5.

Referring to FIG. 24, as described above, the emitted light L1 provided to the color conversion substrate 30 may be the blue light. The first stack 321 and the second stack 323 of the blue light reflective layer 320 may be separated from each other in an area in which the light-transmitting pattern 330 is positioned, and may be in contact with each other and be continuously stacked in an area in which the light-transmitting pattern 330 is not positioned.

In an embodiment, for example, referring to FIG. 24, the first stack 321 and the second stack 323 may not be in contact with each other only in the first light-transmitting area TAT, and the first stack 321 and the second stack 323 may be in contact with each other to constitute the blue light reflective layer 320 in the second light-transmitting area TA2, the third light-transmitting area TA3, the first light blocking area BA1, the second light blocking area BA2, and the third light blocking area BA3, and the like.

Accordingly, in the first light-transmitting area TAT, blue light L1B, which is the emitted light L1, may be transmitted through the second stack 323 and then incident on the light-transmitting pattern 330, and the blue light L1B transmitted through the light-transmitting pattern 330 may be transmitted through the first stack 321 and the first color filter 231 and then provided to the outside. Accordingly, the first light La, which is the blue light, may be provided from the first light-transmitting area TAT to the outside.

In the second light-transmitting area TA2, the emitted light L1 is transmitted through the capping layer 390 and then provided to the first wavelength conversion pattern 340. The blue light L1B that is not wavelength-converted by the first wavelength conversion pattern 340 among the emitted light L1 may be incident on the blue light reflective layer 320. In the second light-transmitting area TA2, the blue light reflective layer 320 has a structure in which the first stack 321 and the second stack 323 are continuously stacked, and both the first stack 321 and the second stack 323 are positioned between the first wavelength conversion pattern 340 and the second base part 310. Accordingly, the blue light LIB may be reflected by the blue light reflective layer 320 to be incident on the first wavelength conversion pattern 340 again. That is, in the second light-transmitting area TA2, the blue light that is not wavelength-converted may be recycled, and accordingly, light efficiency may be improved. The light wavelength-converted by the first wavelength conversion pattern 340 among the emitted light L1 may be transmitted through the blue light reflective layer 320 and the second color filter 233 and then provided to the outside as the second light Lb, as described above.

Similarly, also in the third light-transmitting area TA3, the first stack 321 and the second stack 323 may be in contact with each other, and both the first stack 321 and the second stack 323 are positioned on the second wavelength conversion pattern 350 and the second base part 310. Accordingly, the blue light LIB that is not wavelength-converted by the second wavelength conversion pattern 350 may be reflected by the blue light reflective layer 320 and recycled.

Referring to FIG. 25, external light LO may be provided to the color conversion substrate 30, and the external light LO may include a red light component LOR, a green light component LOG, and a blue light component LOB.

The red light component LOR and the green light component LOG of the external light LO incident on the first light-transmitting area TA1 may be blocked by the first color filter 231. The blue light component LOB of the external light LO incident on the first light-transmitting area TA1 may be transmitted through the first stack 321 and then incident on the light-transmitting pattern 330, and a portion of the blue light component LOB may be reflected by the first stack 321.

The green light component LOG and the blue light component LOB of the external light LO incident on the second light-transmitting area TA2 may be blocked by the second color filter 233. In addition, even though a portion of the blue light component LOB of the external light LO is transmitted through the second color filter 233, a portion of the blue light component LOB may be reflected by the blue light reflective layer 320 to be incident on the second color filter 233 again, which may be blocked by the second color filter 233. The red light component LOG of the external light LO incident on the second light-transmitting area TA2 may be transmitted through the second color filter 233 and the blue light reflective layer 320 and then incident on the first wavelength conversion pattern 340.

The red light component LOR and the blue light component LOB of the external light LO incident on the third light-transmitting area TA3 may be blocked by the third color filter 235. In addition, even though a portion of the blue light component LOB of the external light LO is transmitted through the third color filter 235, a portion of the blue light component LOB may be reflected by the blue light reflective layer 320 to be incident on the third color filter 235 again, which may be blocked by the third color filter 235. The green light component LOG of the external light LO incident on the third light-transmitting area TA3 may be transmitted through the third color filter 235 and the blue light reflective layer 320 and then incident on the second wavelength conversion pattern 350.

That is, finally, in the first light-transmitting area TAT, only the blue light component LOB of the external light LO may be incident on the light-transmitting pattern 330, in the second light-transmitting area TA2, only the red light component LOR of the external light LO may be incident on the first wavelength conversion pattern 340, and in the third light-transmitting area TA3, only the green light component LOG of the external light LO may be incident on the second wavelength conversion pattern 350. Since the colors of the light that may be incident into the color conversion substrate 30 in the respective light-transmitting areas among the external light LO are the same as the colors of the light emitted from the respective light-transmitting areas to the outside, it is possible to prevent color reproducibility of the display device from being deteriorated by the external light LO.

In addition, it is possible to reduce an amount of light reflected from the color conversion substrate 30 and provided to the outside among the external light LO, and it is thus possible to prevent or reduce deterioration of a display quality of the display device due to the reflected light of the external light LO.

FIGS. 26 to 30 are views for describing processes of an embodiment of a method of manufacturing the color conversion substrate illustrated in FIG. 5.

Figure 26:
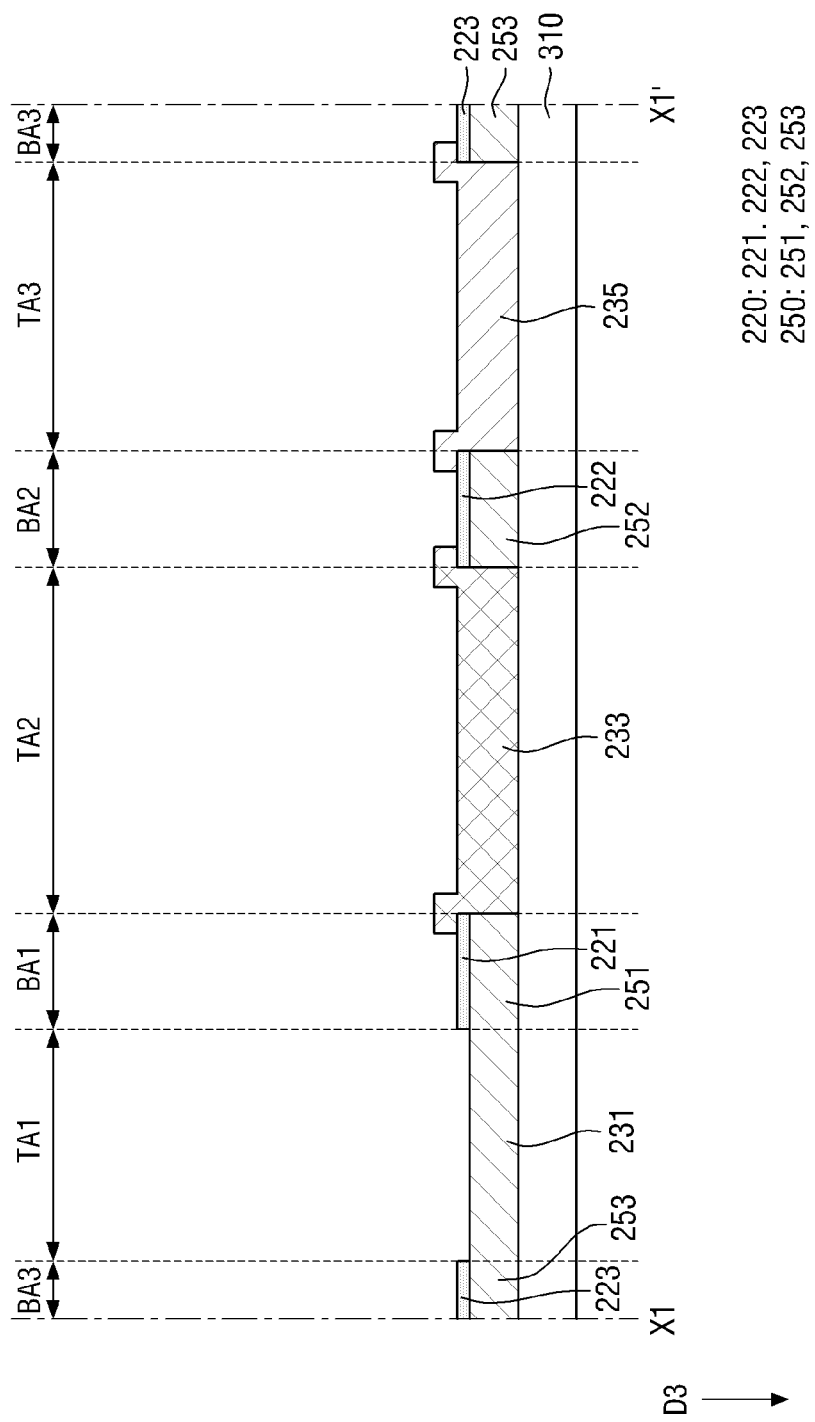
FIGS. 26 to 30 are views for describing processes of an embodiment of a method of manufacturing the color conversion substrate illustrated in FIG. 5.

Referring to FIG. 26, the second base part 310 in which light blocking areas and light-transmitting areas are defined is prepared. FIG. 26 illustrates an embodiment where the first light-transmitting area TAT, the first light blocking area BA1, the second light-transmitting area TA2, the second light blocking area BA2, the third light-transmitting area TA3, and the third light blocking area BA3 are sequentially defined in the second base part 310. Thereafter, the first color filter 231 and the color pattern 250 are simultaneously formed using a process of applying a photosensitive material including a blue colorant onto the second base part 310 and exposing and developing the photosensitive material, for example, a photo process. The positions at which the first color filter 231 and the color pattern 250 are formed are the same as those described above, and any repetitive detailed description thereof will thus be omitted. FIG. 26 illustrates an embodiment where the first color filter 231 is formed to overlap the first light-transmitting area TAT, and the color pattern 250 is formed to overlap the first light blocking area BA1, the second light blocking area BA2, and the third light blocking area BA3.

Thereafter, the light blocking member 220 is formed on the color pattern 250 by applying a photosensitive material including a light blocking material, and exposing and developing the photosensitive material.

Thereafter, the second color filter 233 and the third color filter 235 are formed. In some embodiments, each of the second color filter 233 and the third color filter 235 may be formed through a photo process. FIG. 26 illustrates an embodiment where the second color filter 233 is formed to overlap the second light-transmitting area TA2 and the third color filter 235 is formed to overlap the third light-transmitting area TA3. The third color filter 235 may be formed after the second color filter 233 is first formed, but the disclosure is not limited thereto, and the second color filter 233 may also be formed after the third color filter 235 is formed.

Figure 27:
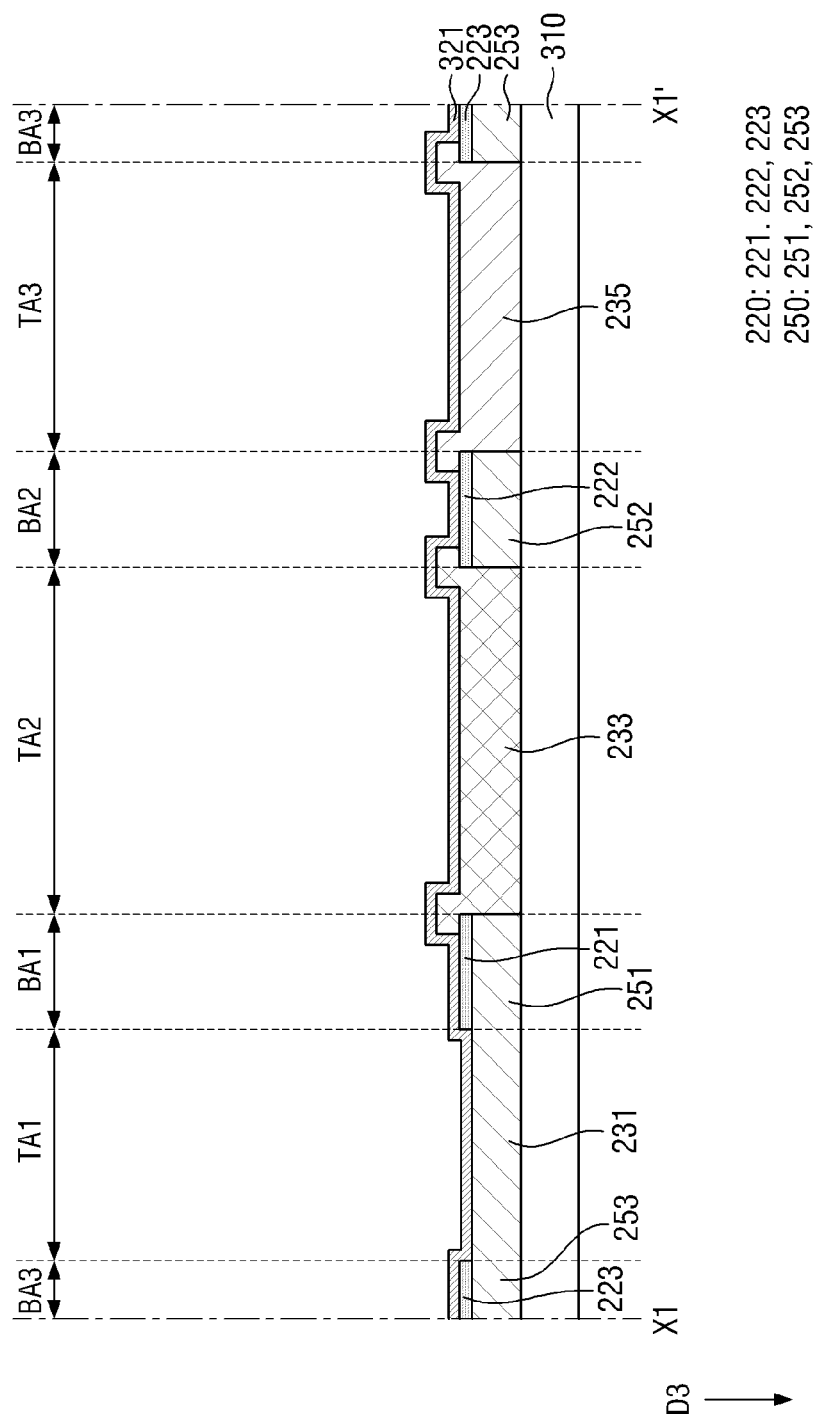

Thereafter, as illustrated in FIG. 27, the first stack 321 covering the light blocking member 220, the first color filter 231, the second color filter 233, and the third color filter 235 is formed. The first stack 321 may include first and second layers having different refractive indices from each other, and each of the first and second layers may be formed by a chemical vapor deposition method.

Figure 28:
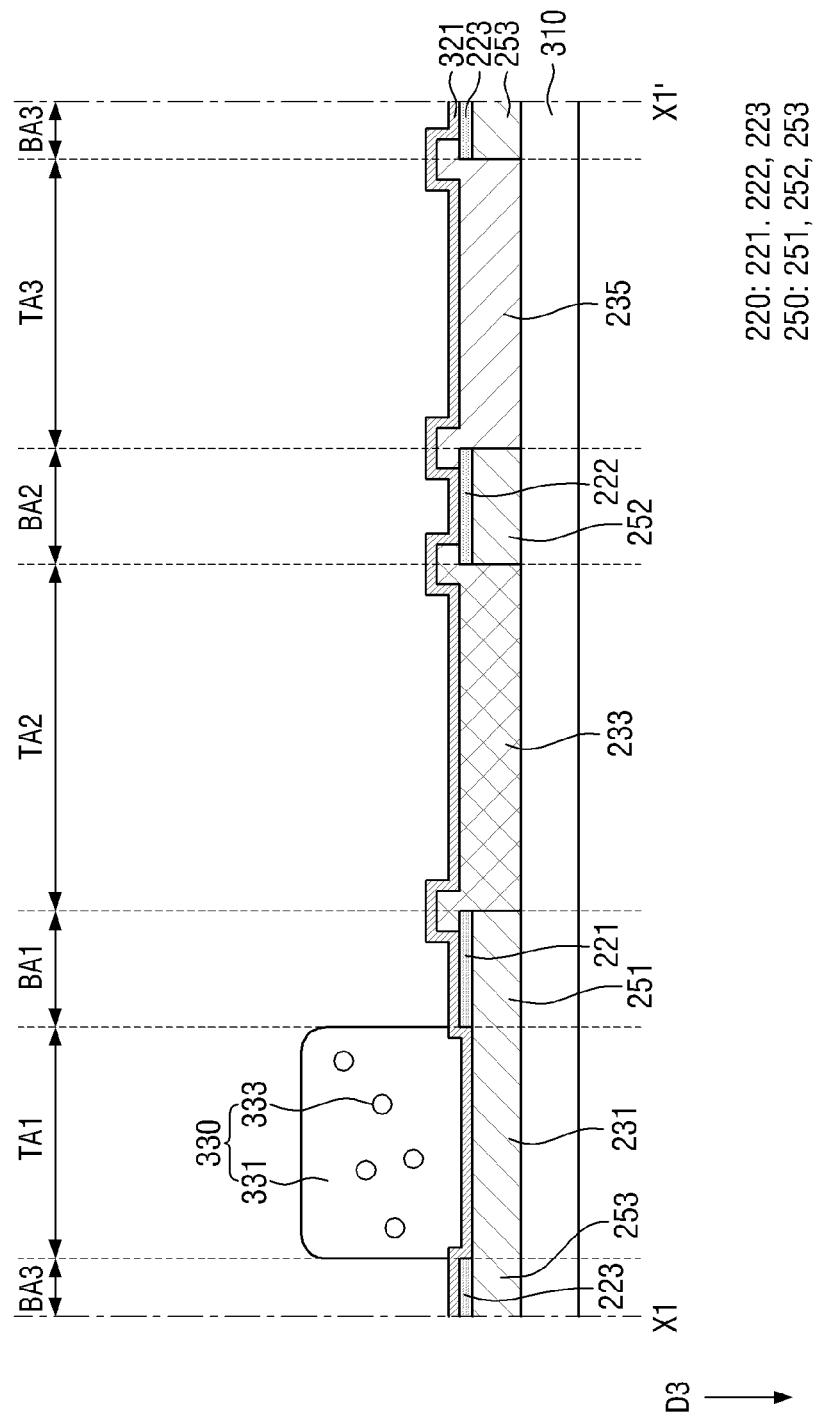

Thereafter, as illustrated in FIG. 28, the light-transmitting pattern 330 is formed on the first stack 321. In some embodiments, the light-transmitting pattern 330 may be formed by a photo process, and may be formed to overlap the first color filter 231.

Figure 29:
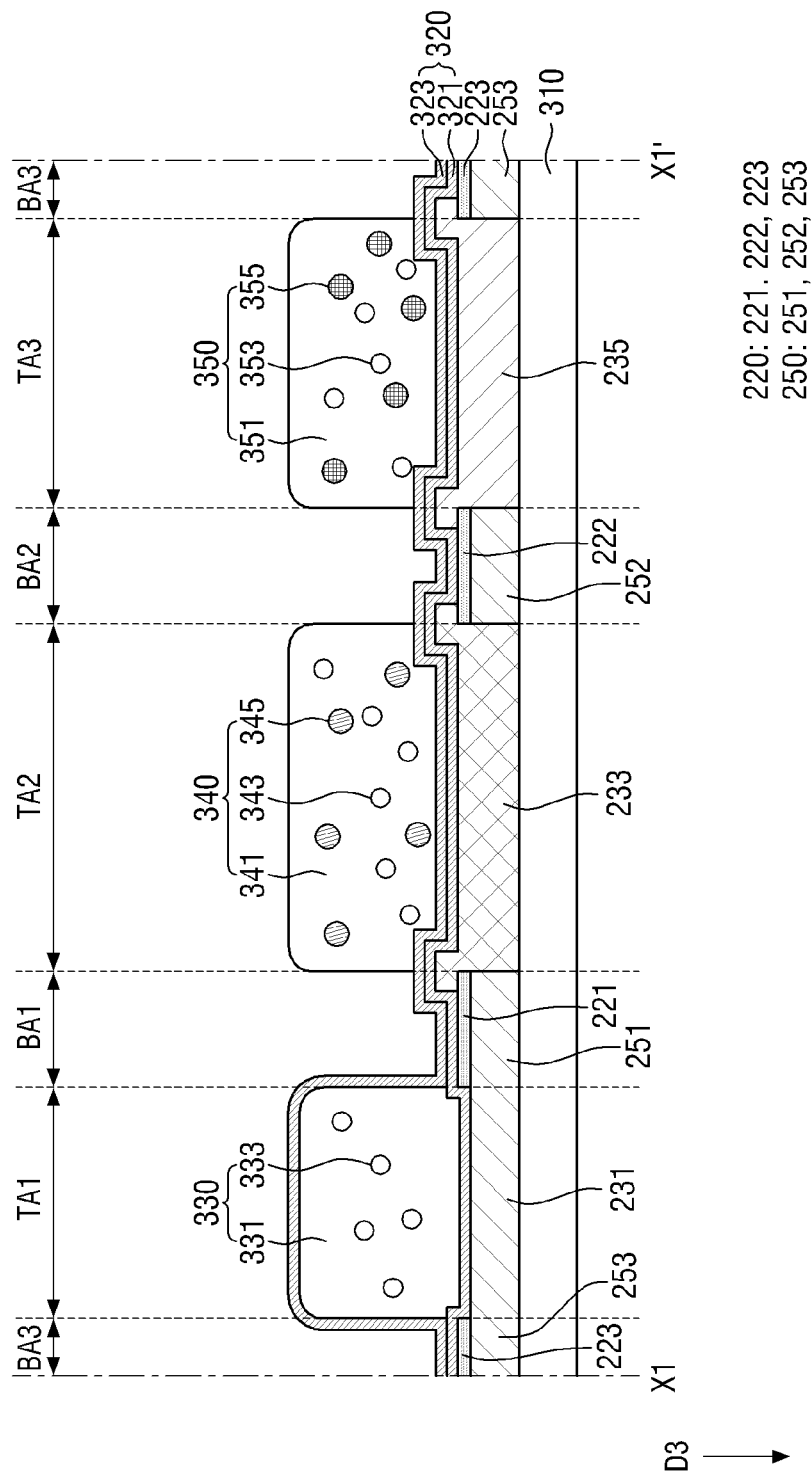

Thereafter, as illustrated in FIG. 29, the second stack 323 covering the light-transmitting pattern 330 and the first stack 321 is formed on the second base part 310. The second stack 323 may include third and fourth layers having different refractive indices from each other, and each of the first and second layers may be formed by a chemical vapor deposition method.

Thereafter, the first wavelength conversion pattern 340 and the second wavelength conversion pattern 350 are formed on the second stack 323. The first wavelength conversion pattern 340 may be formed to overlap the second color filter 233, and the second wavelength conversion pattern 350 may be formed to overlap the third color filter 235. In some embodiments, as described above, each of the first wavelength conversion pattern 340 and the second wavelength conversion pattern 350 may be formed through a photo process, but is not limited thereto.

Figure 30:
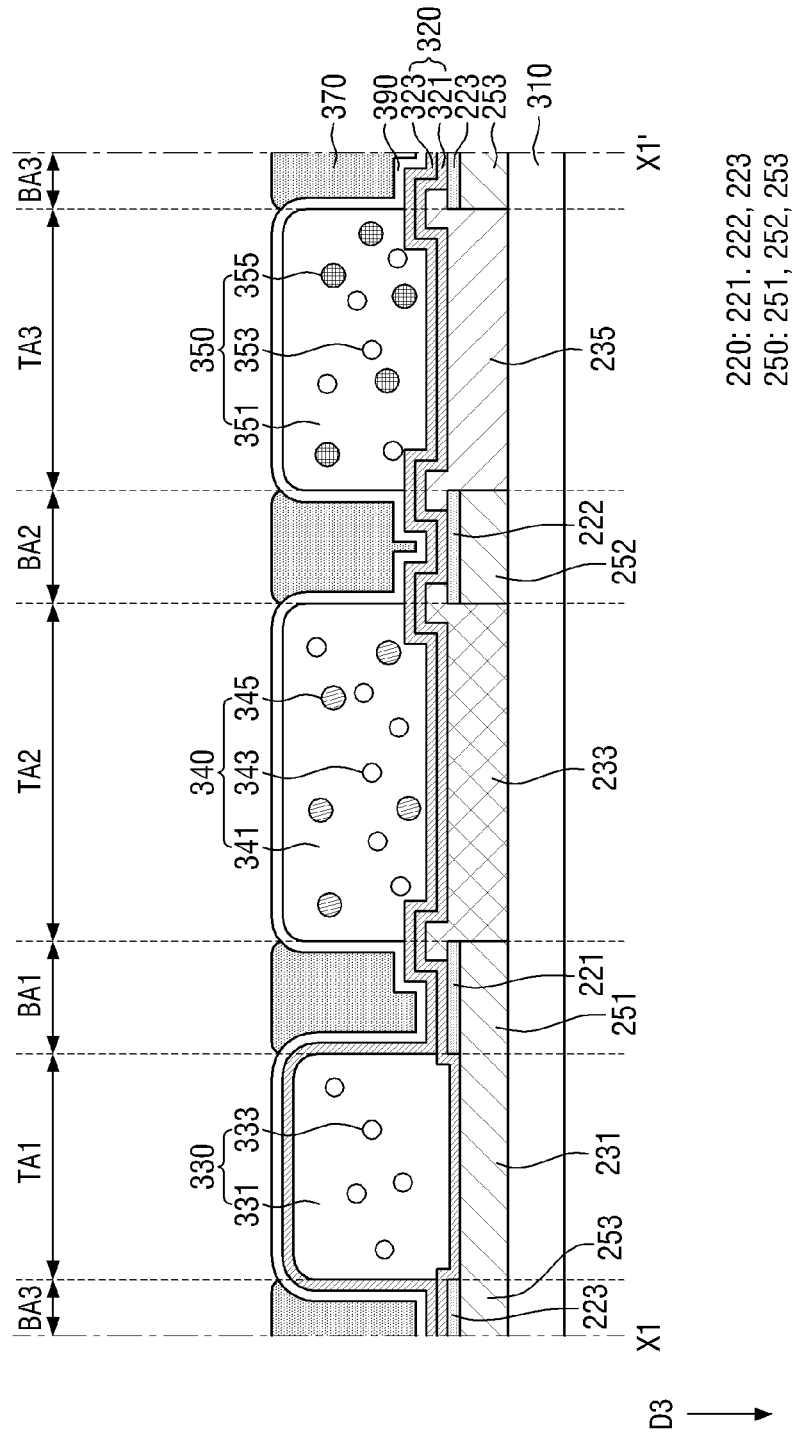

Thereafter, as illustrated in FIG. 30, the capping layer 390 is formed on the entire surface of the second base part 310, and the color mixing preventing member 370 is formed on the capping layer 390. In some embodiments, the capping layer 390 may be formed by a chemical vapor deposition method, and the color mixing preventing member 370 may be formed by a photo process.

Through the above-described processes, the color conversion substrate 30 illustrated in FIG. 5 may be manufactured.

According to an embodiment of the method of manufacturing a color conversion substrate described above, the blue light may be transmitted through the first light-transmitting area TA1 and the blue light reflective layer 320 reflecting the blue light may be formed in the second light-transmitting area TA2 and the third light-transmitting area TA3, without performing an additional photo process using a separate mask, such that the number of photo processes may be reduced.

Figure 31:
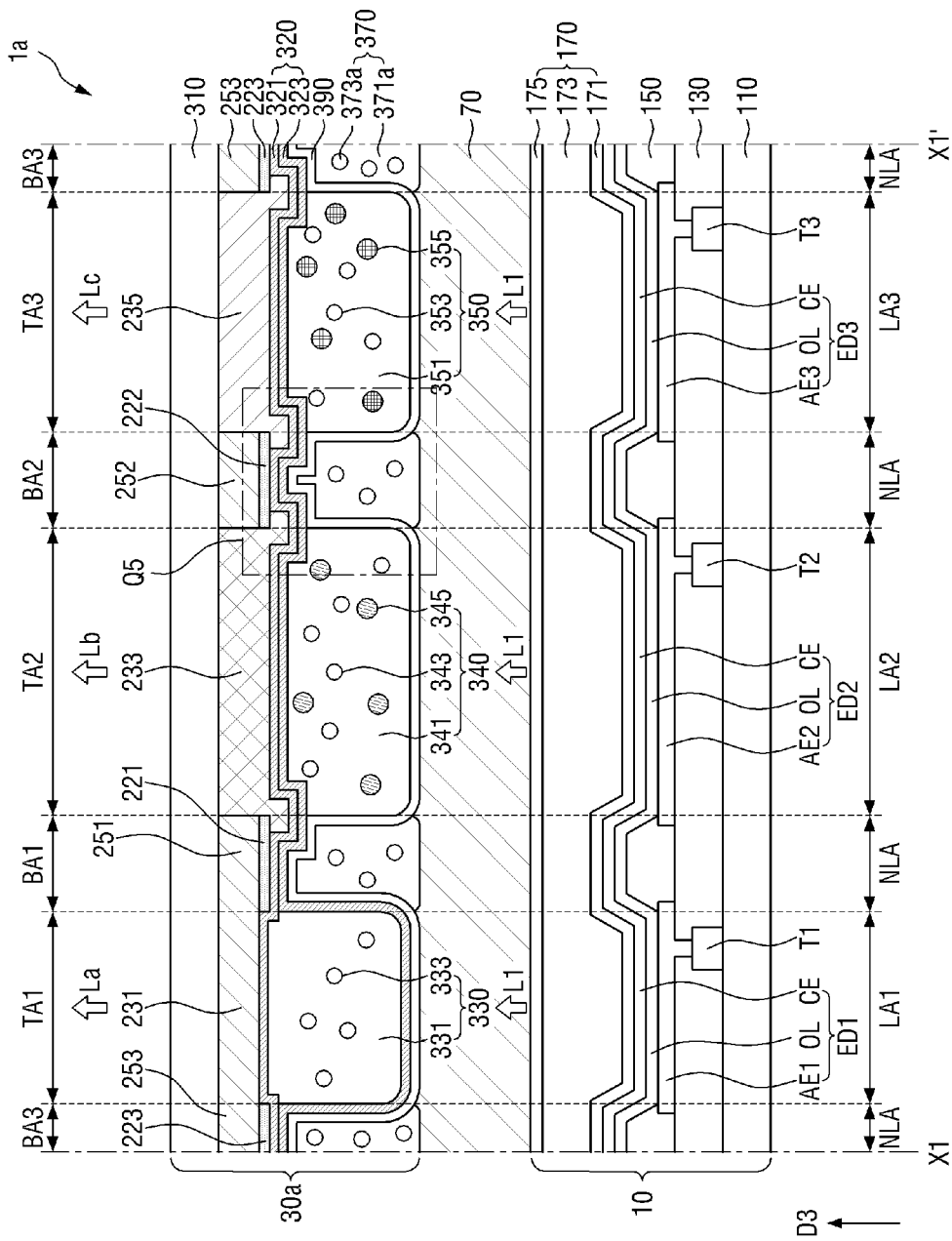
FIG. 31 is a cross-sectional view of a display device according to an alternative embodiment taken along line X1-X1' of FIGS. 3 and 4.
Figure 32:
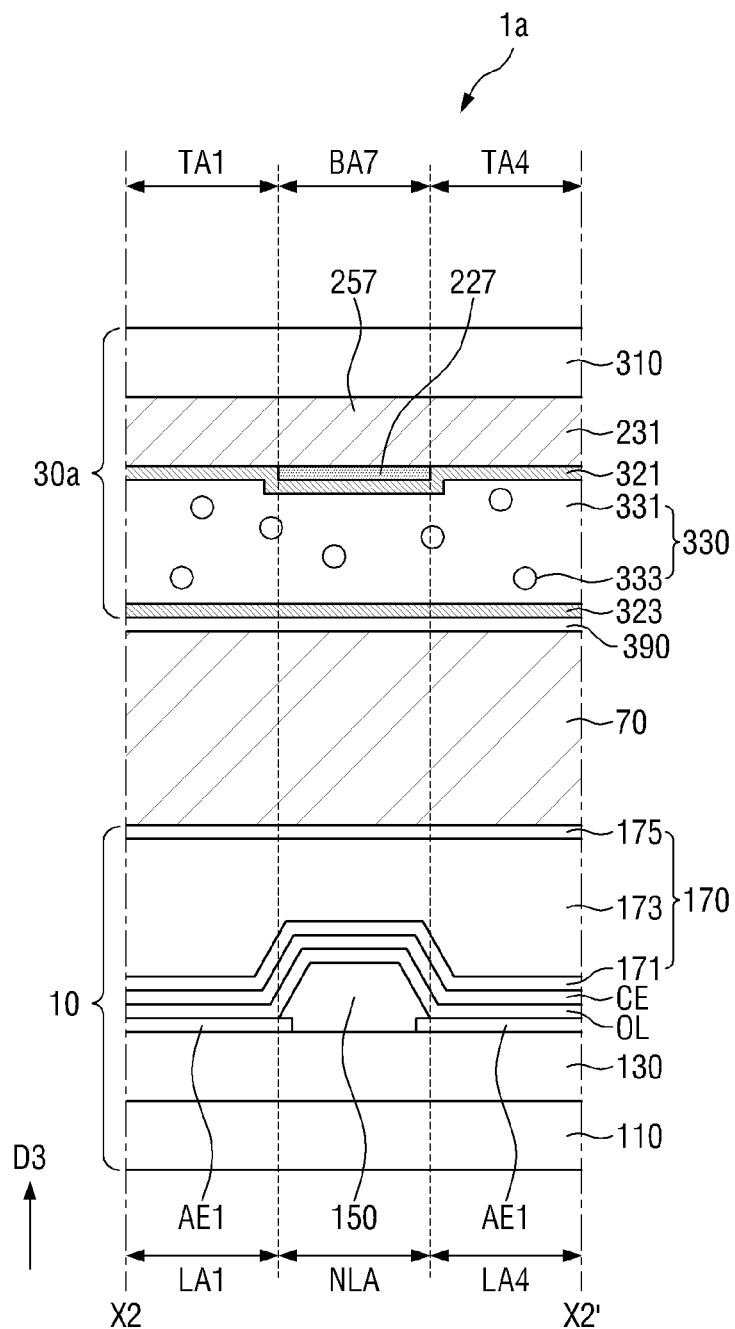
FIG. 32 is a cross-sectional view of the display device according to an alternative embodiment taken along line X2-X2' of FIGS. 3 and 4.
Figure 33:
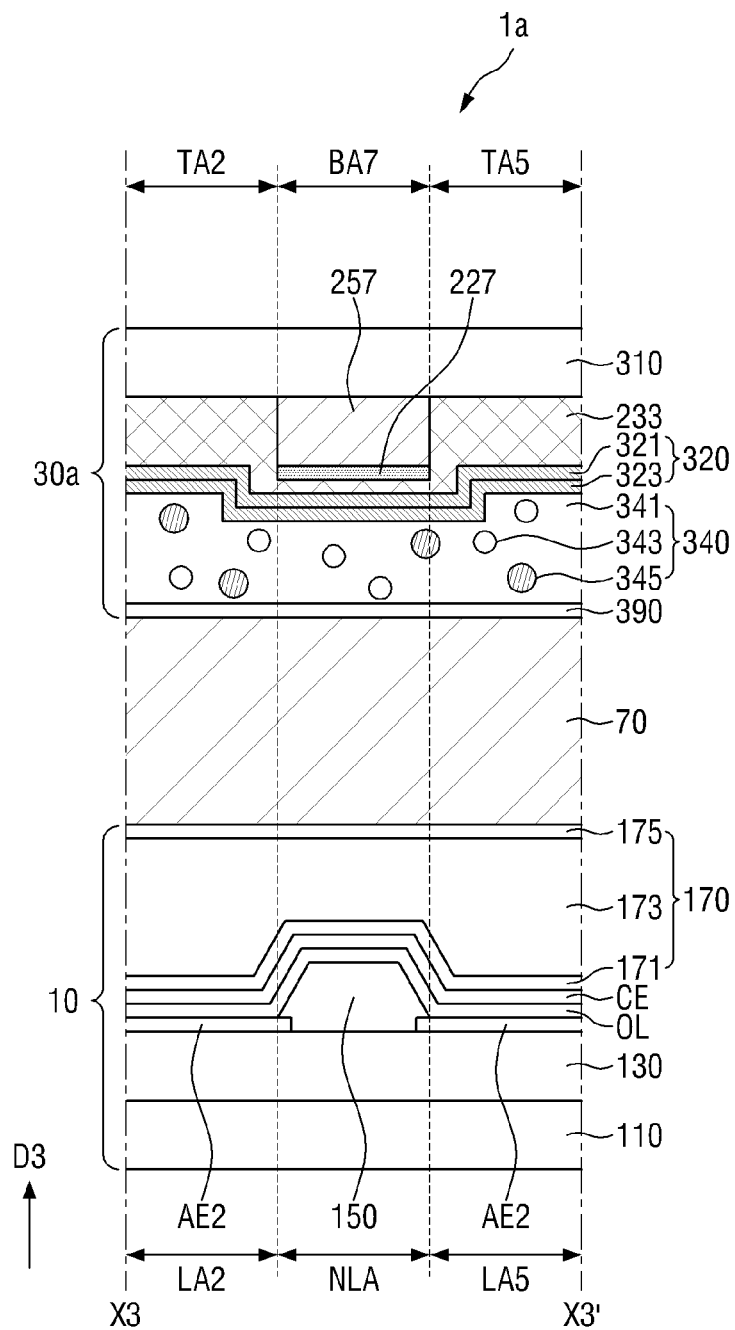
FIG. 33 is a cross-sectional view of the display device according to an alternative embodiment taken along line X3-X3' of FIGS. 3 and 4.
Figure 34:
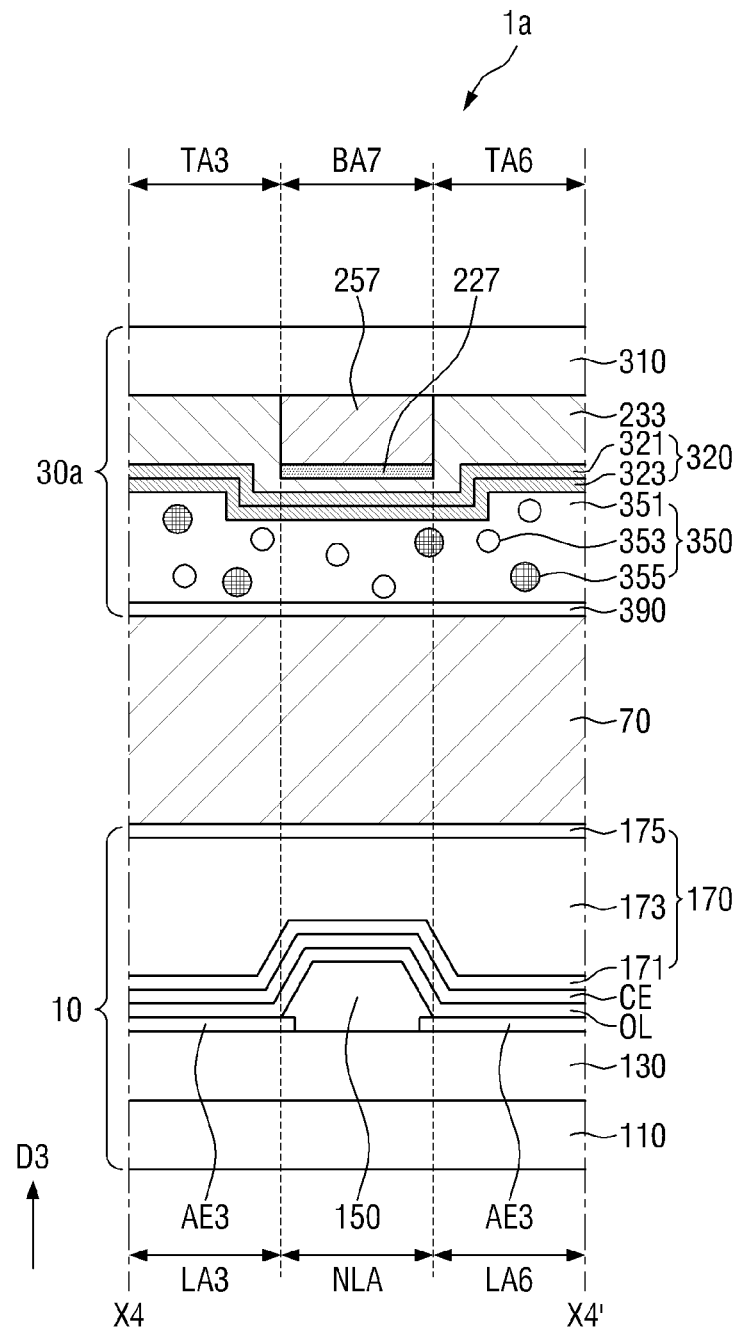
FIG. 34 is a cross-sectional view of the display device according to an alternative embodiment taken along line X4-X4' of FIGS. 3 and 4.
Figure 35:
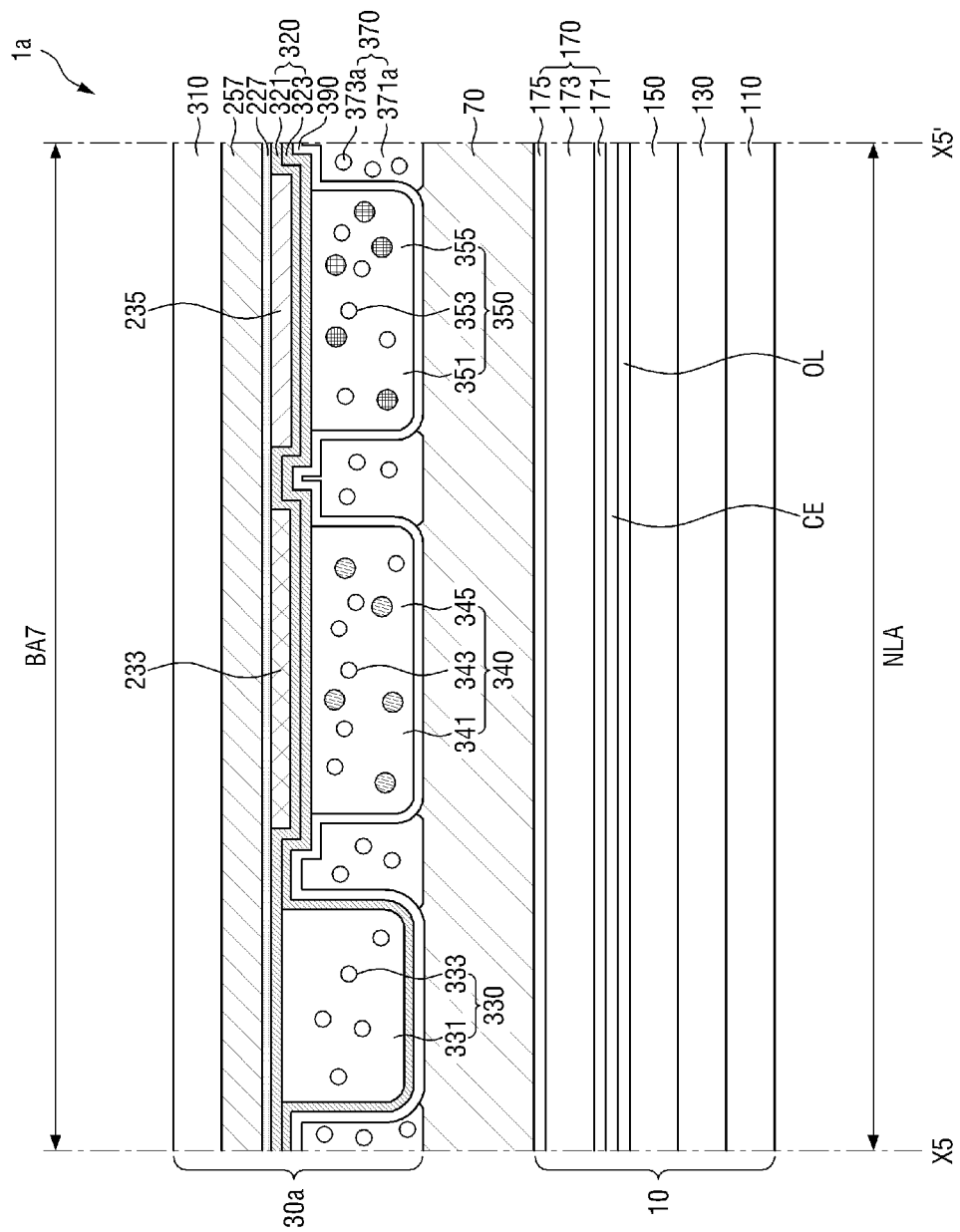
FIG. 35 is a cross-sectional view of the display device according to an alternative embodiment taken along line X5-X5' of FIGS. 3 and 4.
Figure 36:
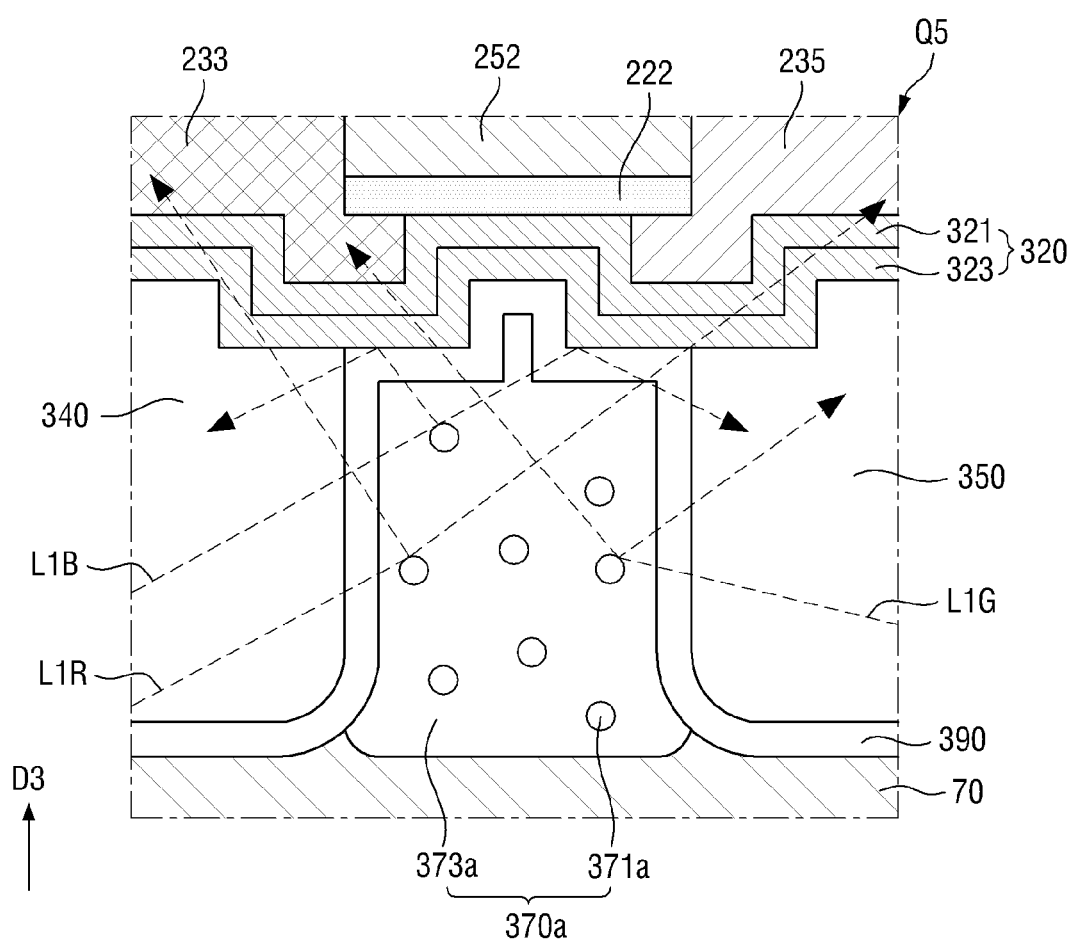
FIG. 36 is an enlarged view of portion Q5 of FIG. 31.

FIG. 31 is a cross-sectional view of a display device according to an alternative embodiment taken along line X1-X1' of FIGS. 3 and 4, FIG. 32 is a cross-sectional view of the display device according to an alternative embodiment taken along line X2-X2' of FIGS. 3 and 4, FIG. 33 is a cross-sectional view of the display device according to an alternative embodiment taken along line X3-X3' of FIGS. 3 and 4, FIG. 34 is a cross-sectional view of the display device according to an alternative embodiment taken along line X4-X4' of FIGS. 3 and 4, FIG. 35 is a cross-sectional view of the display device according to an alternative embodiment taken along line X5-X5' of FIGS. 3 and 4, and FIG. 36 is an enlarged view of portion Q5 of FIG. 31.

Referring to FIGS. 31 to 36, an embodiment of a display device 1a includes a display substrate 10, a color conversion substrate 30a, and a filler 70. The display device 1a of FIGS. 31 to 36 is substantially the same as the display device of FIGS. 5 and 16 to 19 except for the color conversion substrate 30a, in particular, except that the color conversion substrate 30a includes a color mixing preventing member 370a. Therefore, any repetitive detailed description of the same or like elements as those described above will be omitted, and features different from those described above will be mainly described.

The color mixing preventing member 370a may include a base resin 371a and scatterers 373a dispersed in the base resin 371a.

The base resin 371a may include or be made of a material having high light transmittance. In some embodiments, the base resin 371a may include or be made of an organic material. In an embodiment, for example, the first base resin 371a may include an organic material such as an epoxy-based resin, an acrylic resin, a cardo-based resin, or an imide-based resin.

The scatterer 373a may have a refractive index different from that of the base resin 371a, and may form an optical interface with the base resin 371a. In an embodiment, for example, the scatterers 373a may be light scattering particles. The scatterer 373a is not particularly limited as long as capable of scattering at least a portion of transmitted light, but may be, for example, a metal oxide particle or an organic particle.

The color mixing preventing member 370a may prevent the occurrence of color mixing between light-transmitting areas neighboring to each other. In an embodiment, for example, as illustrated in FIG. 36, a portion of light incident toward the third light-transmitting area TA3 (see FIG. 31) among red light L1R wavelength-converted in the first wavelength conversion pattern 340 may be reflected by the scatterer 373a or the like, and accordingly, may not be incident to the third light-transmitting area TA3 (see FIG. 31). In addition, light transmitted through the color mixing preventing member 370a and incident to the third light-transmitting area TA3 (see FIG. 31) among the red light L1R wavelength-converted in the first wavelength conversion pattern 340 is finally blocked by the third color filter 235 and thus, may not be emitted to the outside. Similarly, light incident toward the second light-transmitting area TA2 (see FIG. 31) among green light L1G wavelength-converted in the second wavelength conversion pattern 350 may be reflected by the scatterer 383a and finally blocked by the second color filter 344. A portion of blue light L1B that is not wavelength-converted in the first wavelength conversion pattern 340 may be reflected by the scatterer 373a or the like or be reflected by the blue light reflective layer 320 to be incident to the second light-transmitting area TA2 (FIG. 31) again. In addition, light transmitted through the color mixing preventing member 370a among the blue light LIB that is not wavelength-converted in the first wavelength conversion pattern 340 may be reflected by the blue light reflective layer 320 in the third light-transmitting area TA3 (see FIG. 31), and thus, may not be emitted to the outside. That is, the color mixing preventing member 370a may prevent the occurrence of color mixing between the light-transmitting areas neighboring to each other, and may further increase a recycling effect of the blue light.

Figure 37:
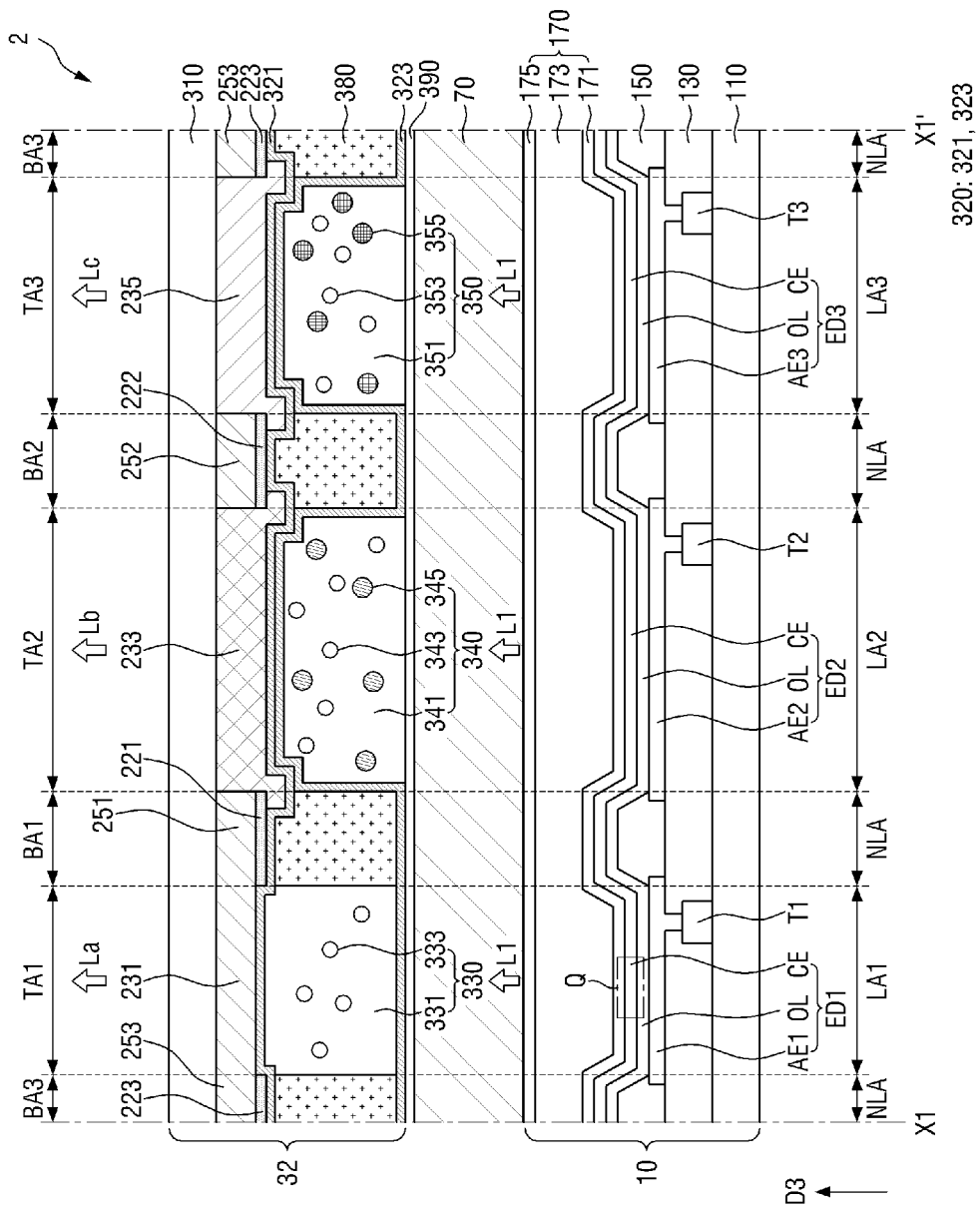
FIG. 37 is a cross-sectional view of a display device according to another alternative embodiment taken along line X1-X1' of FIGS. 3 and 4.
Figure 38:
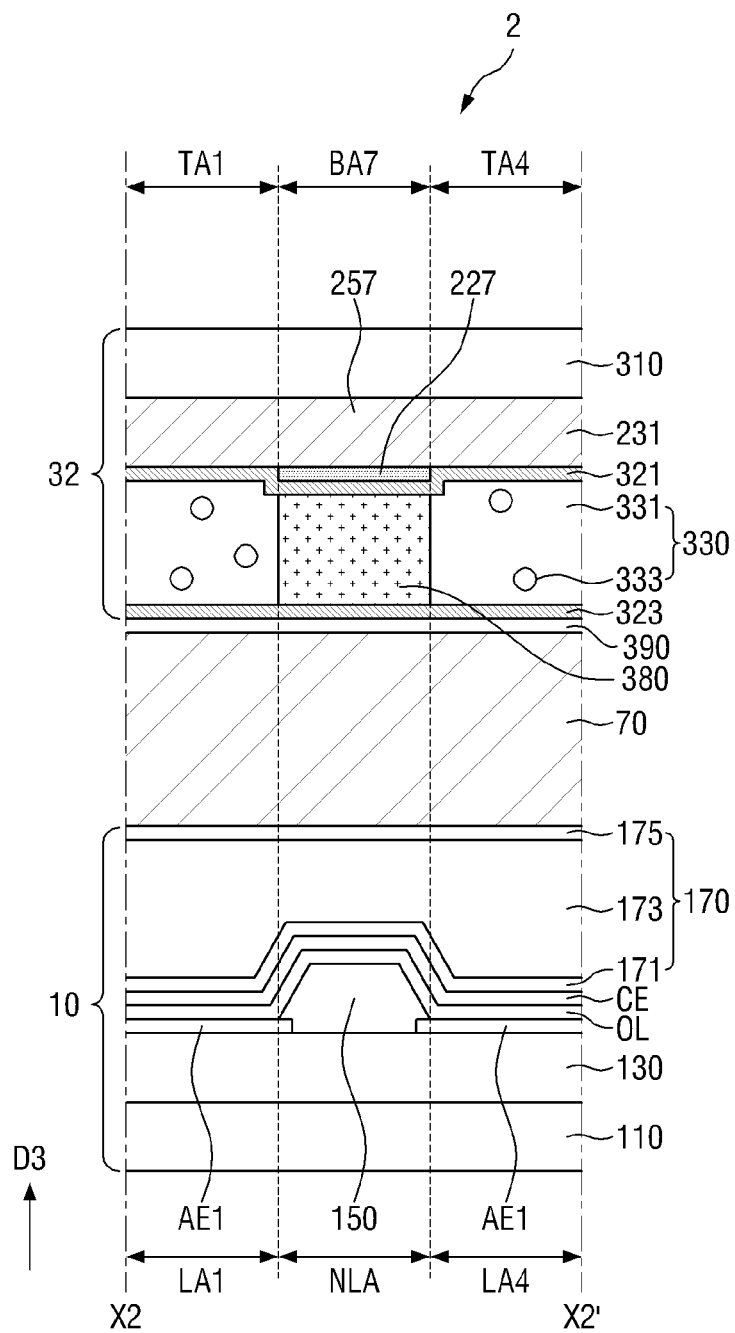
FIG. 38 is a cross-sectional view of the display device according to another alternative embodiment taken along line X2-X2' of FIGS. 3 and 4.
Figure 39:
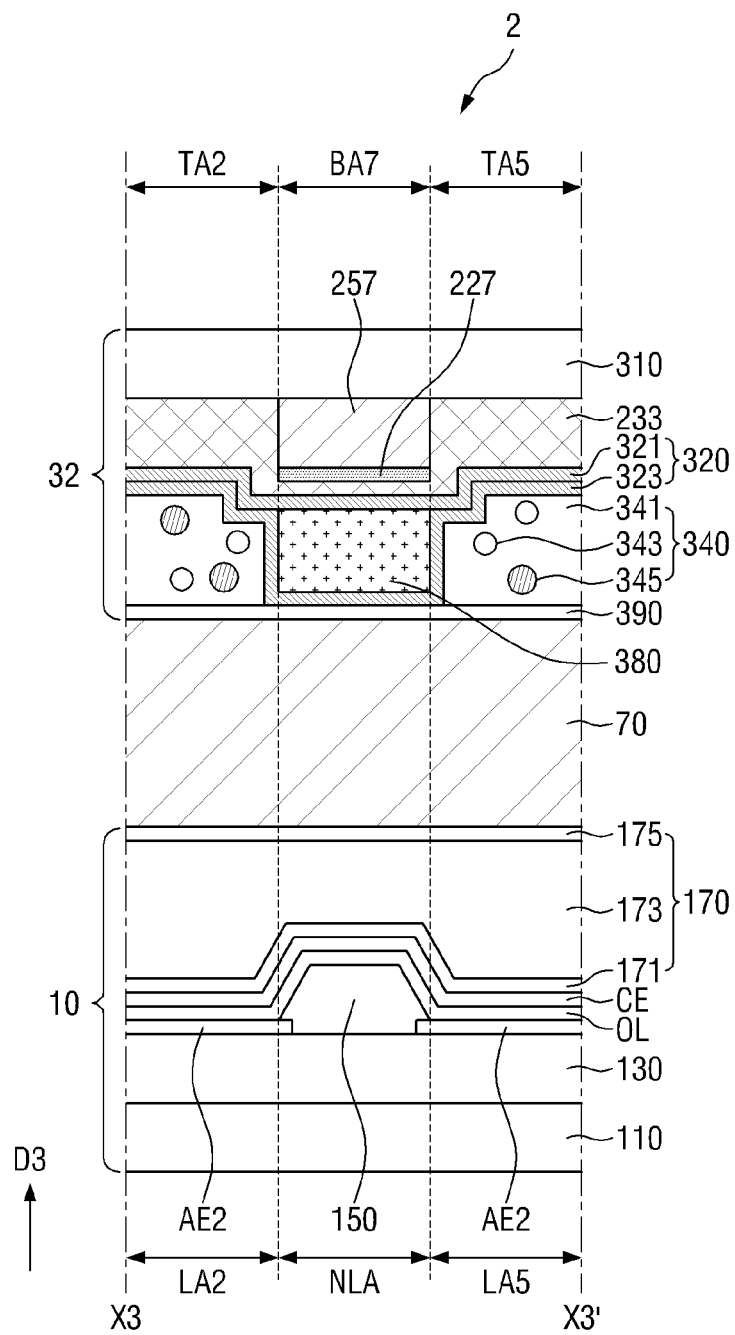
FIG. 39 is a cross-sectional view of the display device according to another alternative embodiment taken along line X3-X3' of FIGS. 3 and 4.
Figure 40:
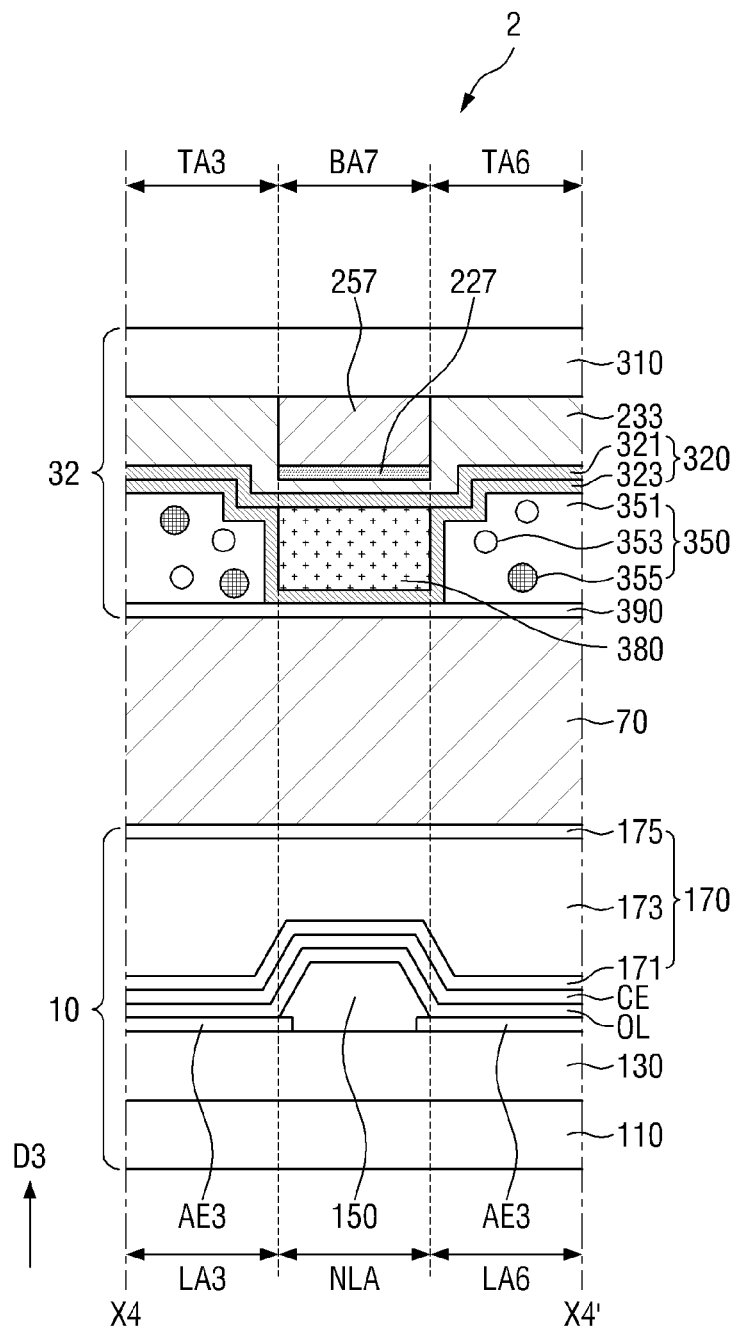
FIG. 40 is a cross-sectional view of the display device according to another alternative embodiment taken along line X4-X4' of FIGS. 3 and 4.
Figure 41:
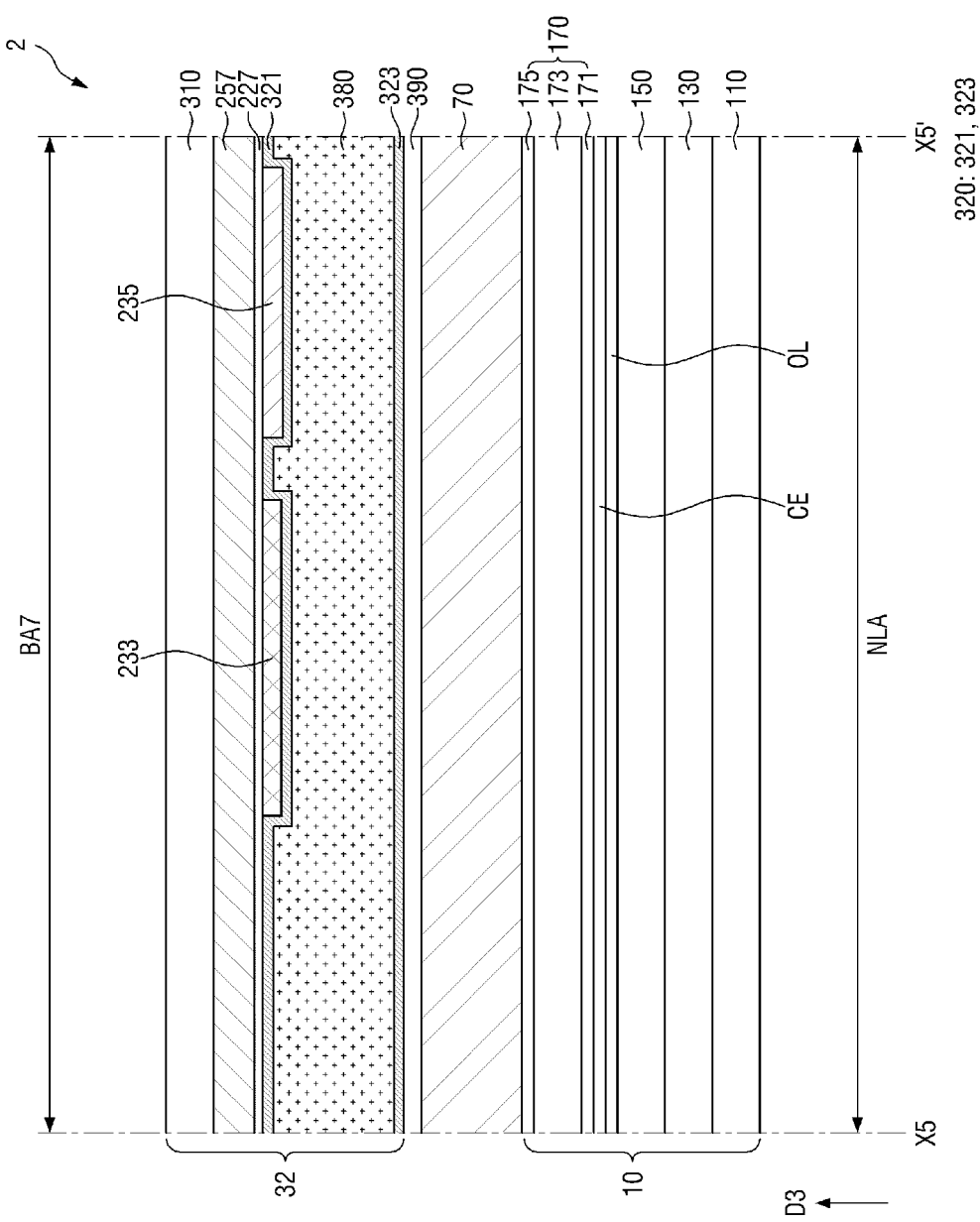
FIG. 41 is a cross-sectional view of the display device according to another alternative embodiment taken along line X5-X5' of FIGS. 3 and 4.
Figure 42:
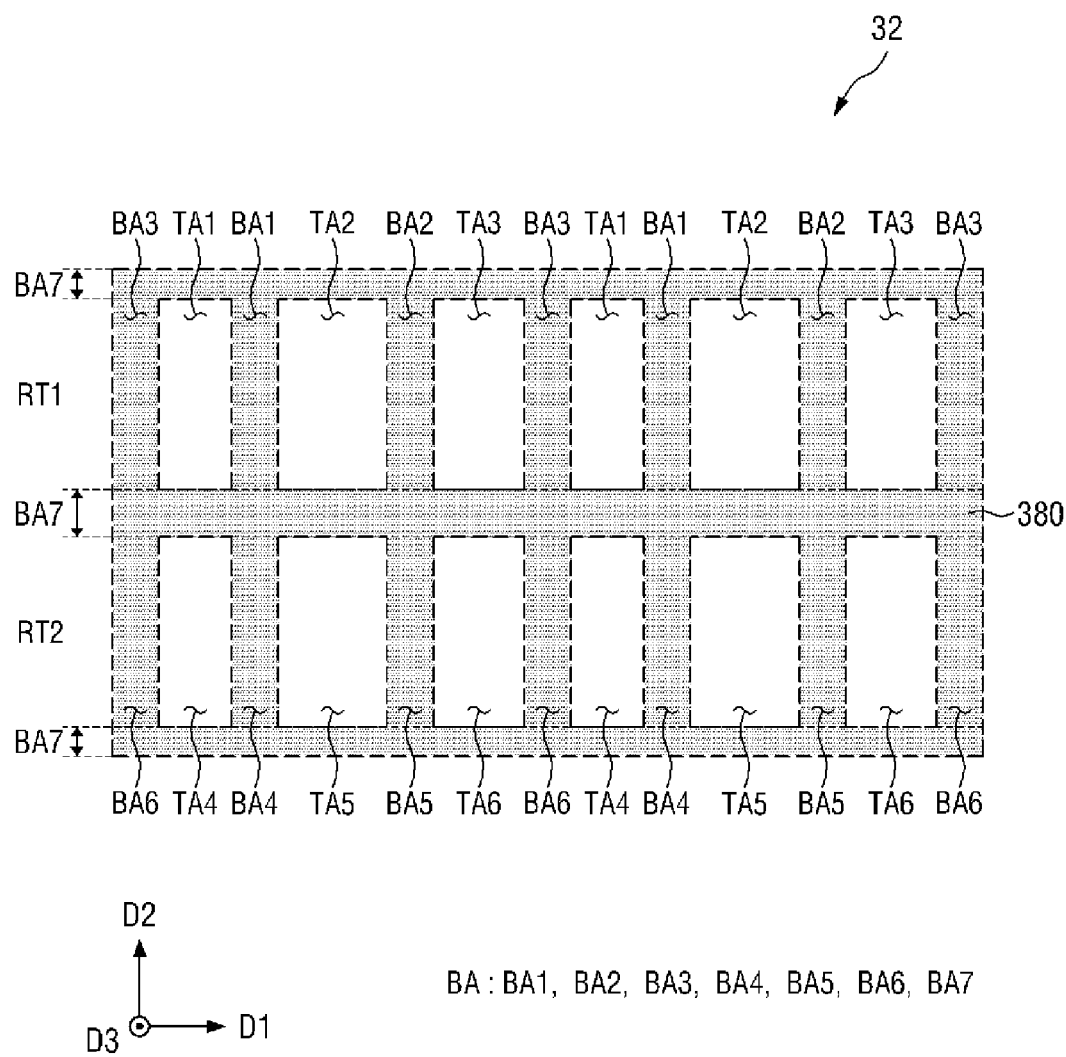
FIG. 42 is a plan view illustrating a schematic arrangement of a partition wall in a color conversion substrate of the display device according to still another alternative embodiment.
Figure 43:
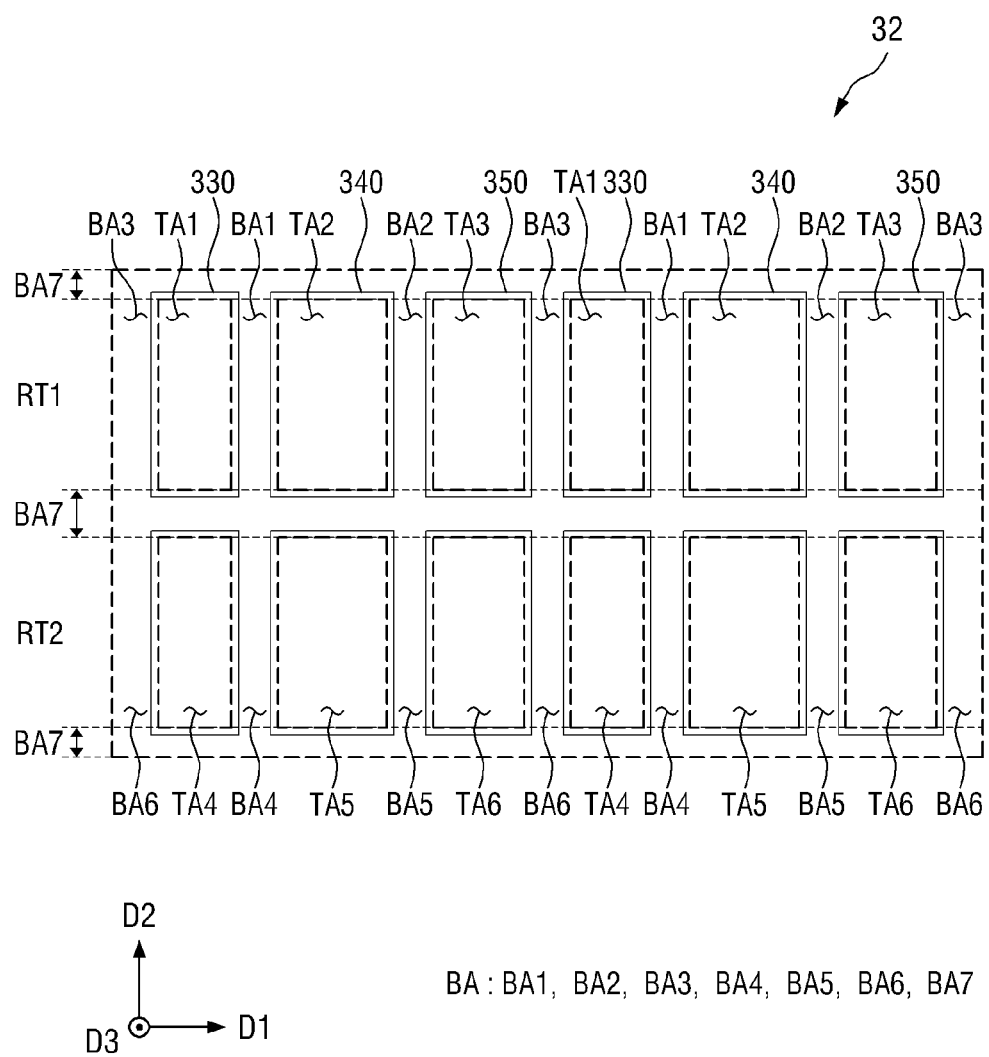
FIG. 43 is a plan view illustrating a schematic arrangement of a first wavelength conversion pattern, a second wavelength conversion pattern, and a light-transmitting pattern in the color conversion substrate of the display device according to still another alternative embodiment.

FIG. 37 is a cross-sectional view of a display device according to another alternative embodiment taken along line X1-X1' of FIGS. 3 and 4, FIG. 38 is a cross-sectional view of the display device according to another alternative embodiment taken along line X2-X2' of FIGS. 3 and 4, FIG. 39 is a cross-sectional view of the display device according to another alternative embodiment taken along line X3-X3' of FIGS. 3 and 4, FIG. 40 is a cross-sectional view of the display device according to another alternative embodiment taken along line X4-X4' of FIGS. 3 and 4, FIG. 41 is a cross-sectional view of the display device according to another alternative embodiment taken along line X5-X5' of FIGS. 3 and 4, FIG. 42 is a plan view illustrating a schematic arrangement of a partition wall in a color conversion substrate of the display device according to another alternative embodiment, and FIG. 43 is a plan view illustrating a schematic arrangement of a first wavelength conversion pattern, a second wavelength conversion pattern, and a light-transmitting pattern in the color conversion substrate of the display device according to another alternative embodiment.

Referring to FIGS. 37 to 43, an embodiment of a display device 2 includes a display substrate 10, a color conversion substrate 32, and a filler 70. The display device 2 of FIGS. 37 to 43 is substantially the same as the display device of FIGS. 5 and 16 to 19 except for the color conversion substrate 32, in particular, except that the color conversion substrate 32 includes a partition wall 380 and does not include the color mixing preventing member. Therefore, any repetitive detailed description of the same or like elements as those will be omitted, and features different from those described above will be mainly described.

As illustrated in FIG. 42, the partition wall 380 may be positioned in the light blocking area BA, and may overlap the non-emission area NLA. The partition wall 380 may be disposed to surround each of the first light-transmitting area TA1, the second light-transmitting area TA2, the third light-transmitting area TA3, the fourth light-transmitting area TA4, the fifth light-transmitting area TA5, and the sixth light-transmitting area TA6. In some embodiments, the partition wall 380 may have a lattice shape in a plan view.

In an embodiment where the light-transmitting pattern 330, the first wavelength conversion pattern 340, and the second wavelength conversion pattern 350 are formed by an inkjet method using an ink composition, the partition wall 380 may serve as a guide for stably positioning the ink composition for forming the light-transmitting pattern 330, the first wavelength conversion pattern 340, and the second wavelength conversion pattern 350 at desired positions.

In some embodiments, the partition wall 380 may include or be made of an organic material or a photosensitive organic material. The photosensitive organic material may be a negative photosensitive material in which curing occurs at a portion irradiated with light, but the disclosure is not limited thereto.

In some embodiments, the partition wall 380 may further include a light blocking material. That is, the partition wall 380 may be positioned in the light blocking area BA to block transmission of light. More specifically, the partition wall 380 may be positioned between the light-transmitting pattern 330 and the first wavelength conversion pattern 340 and between the first wavelength conversion pattern 340 and the second wavelength conversion pattern 350 to prevent color mixing between neighboring light-transmitting areas.

As illustrated in FIG. 43, the light-transmitting pattern 330 may be positioned in the first light-transmitting area TA1 and the fourth light-transmitting area TA4 in a space partitioned by the partition wall 380. The first wavelength conversion pattern 340 may be positioned to overlap the second light-transmitting area TA2 and the fifth light-transmitting area TA5 in the space partitioned by the partition wall 380, and the second wavelength conversion pattern 350 may be positioned to overlap the third light-transmitting area TA3 and the sixth light-transmitting area TA6 in the space partitioned by the partition wall 380.

In some embodiments, the light-transmitting pattern 330, the first wavelength conversion pattern 340, and the second wavelength conversion pattern 350 may have a form of an island pattern.

In some embodiments, as illustrated in FIGS. 37 to 41, the partition wall 380 may be positioned on the first stack 321 of the blue light reflective layer 320, and the second stack 323 of the blue light reflective layer 320 may be positioned on the partition wall 380, the first stack 321, and the light-transmitting pattern 330. In such embodiments, the first wavelength conversion pattern 340 and the second wavelength conversion pattern 350 may be positioned on the second stack 323, and the capping layer 390 may be positioned on the second stack 323, the first wavelength conversion pattern 340 and the second wavelength conversion pattern 350. In such embodiments, the light-transmitting pattern 330 may be in direct contact with the partition wall 380.

In an embodiment illustrated in FIGS. 37 to 41, the first stack 321 and the second stack 323 may not be in direct contact with each other in an area in which the light-transmitting pattern 330 is disposed and an area in which the partition wall 380 is disposed. In addition, the first stack 321 and the second stack 323 may be in direct contact with each other in an area in which the first wavelength conversion pattern 340 and the second wavelength conversion pattern 350 are disposed, and may reflect the blue light among the incident light and transmit the red light and the green light among the incident light.

Figure 44:
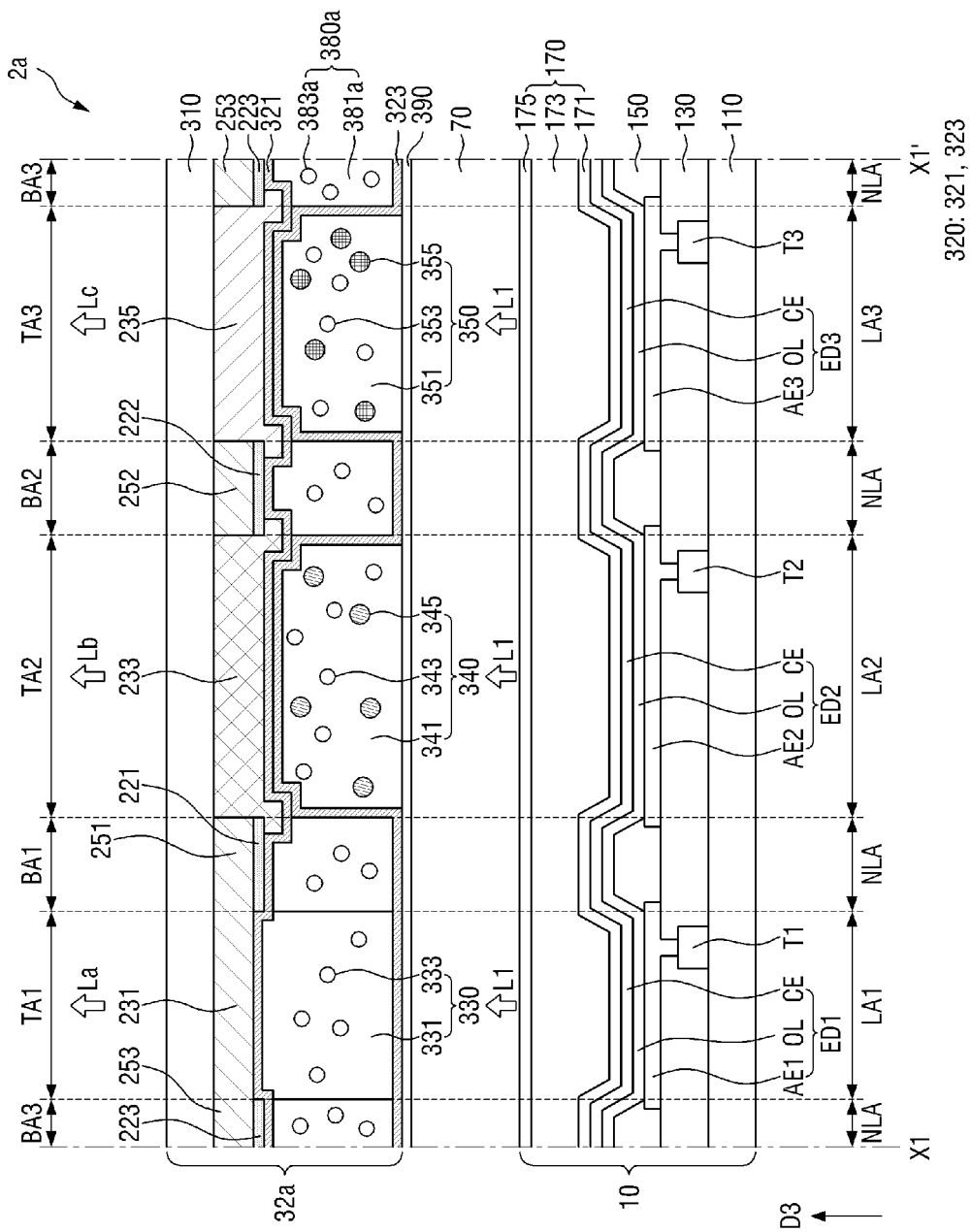
FIG. 44 is a cross-sectional view of a display device according to still another alternative embodiment taken along line X1-X1' of FIGS. 3 and 4.
Figure 45:
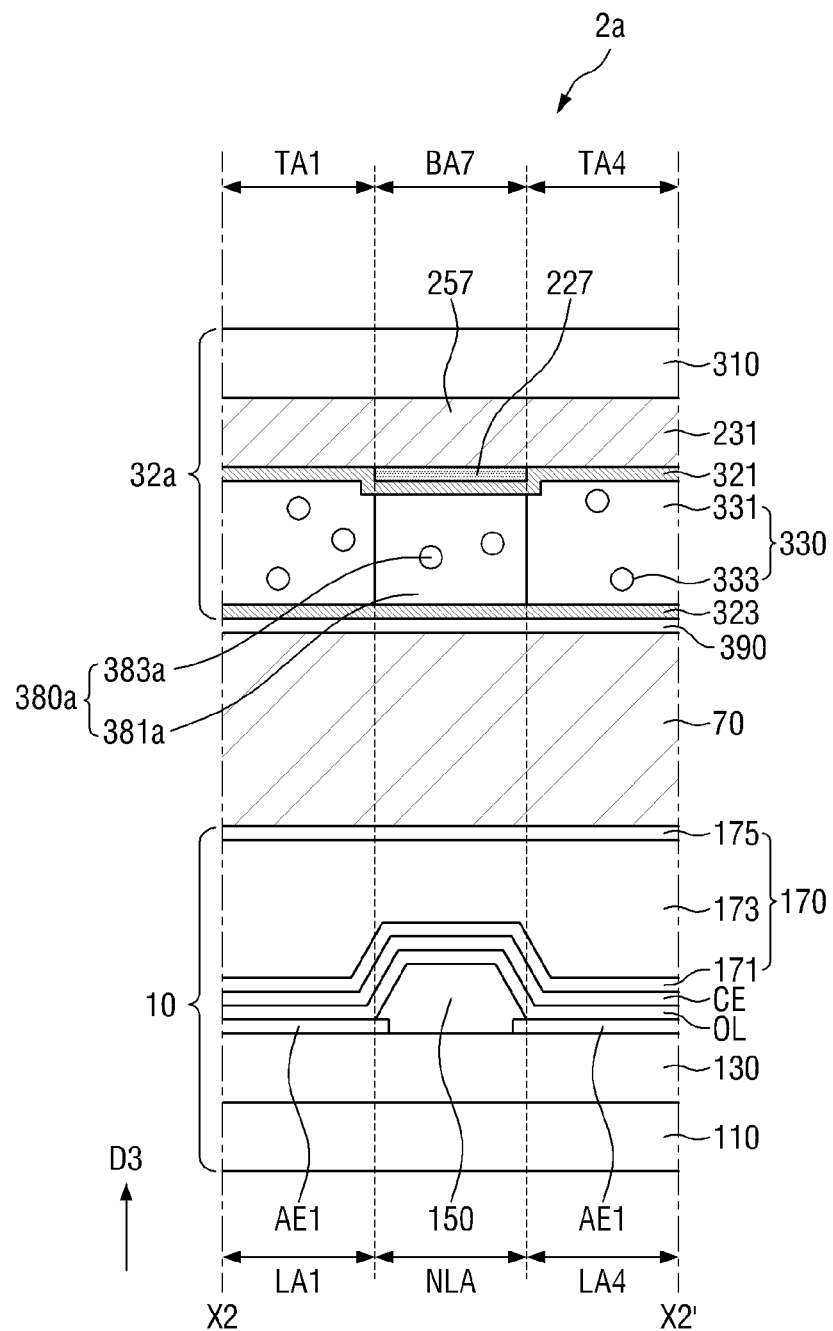
FIG. 45 is a cross-sectional view of the display device according to still another alternative embodiment taken along line X2-X2' of FIGS. 3 and 4.
Figure 46:
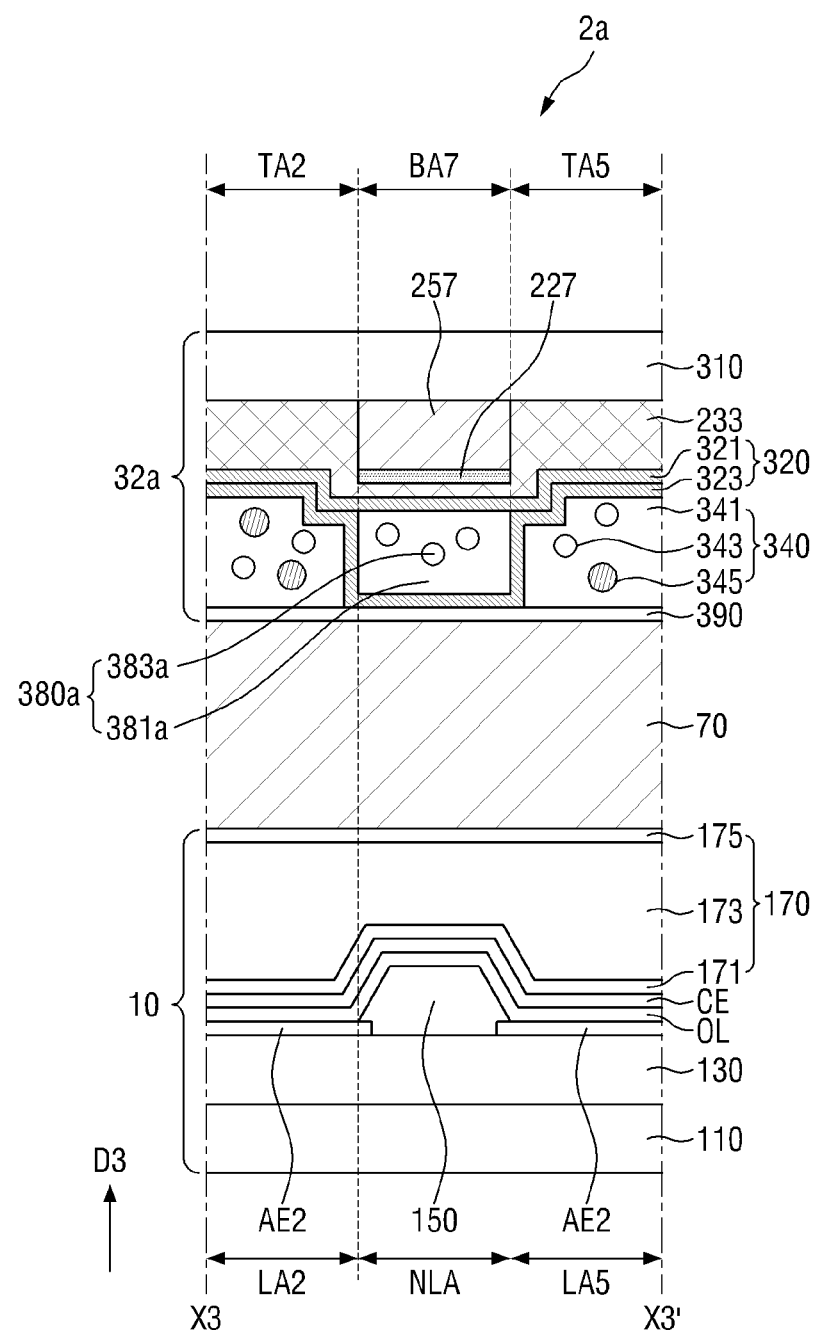
FIG. 46 is a cross-sectional view of the display device according to still another alternative embodiment taken along line X3-X3' of FIGS. 3 and 4.
Figure 47:
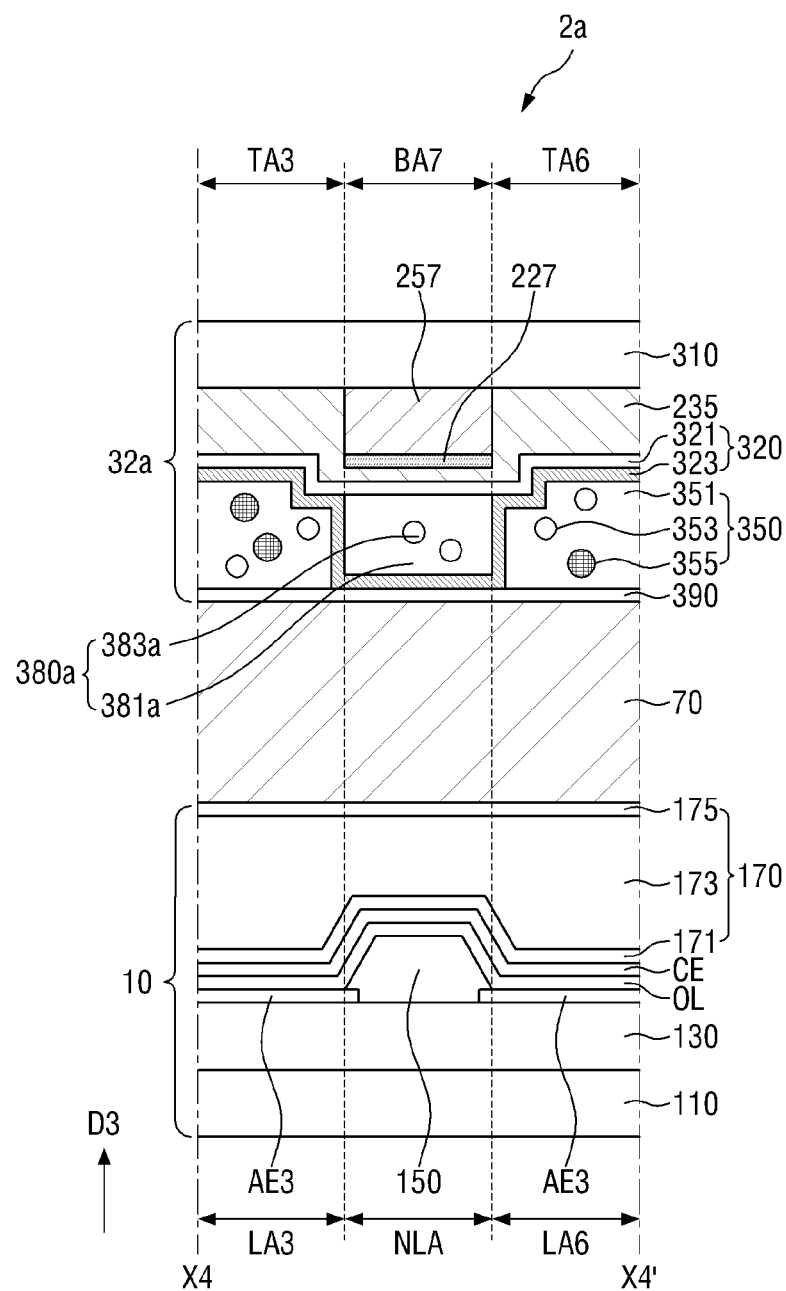
FIG. 47 is a cross-sectional view of the display device according to still another alternative embodiment taken along line X4-X4' of FIGS. 3 and 4.
Figure 48:
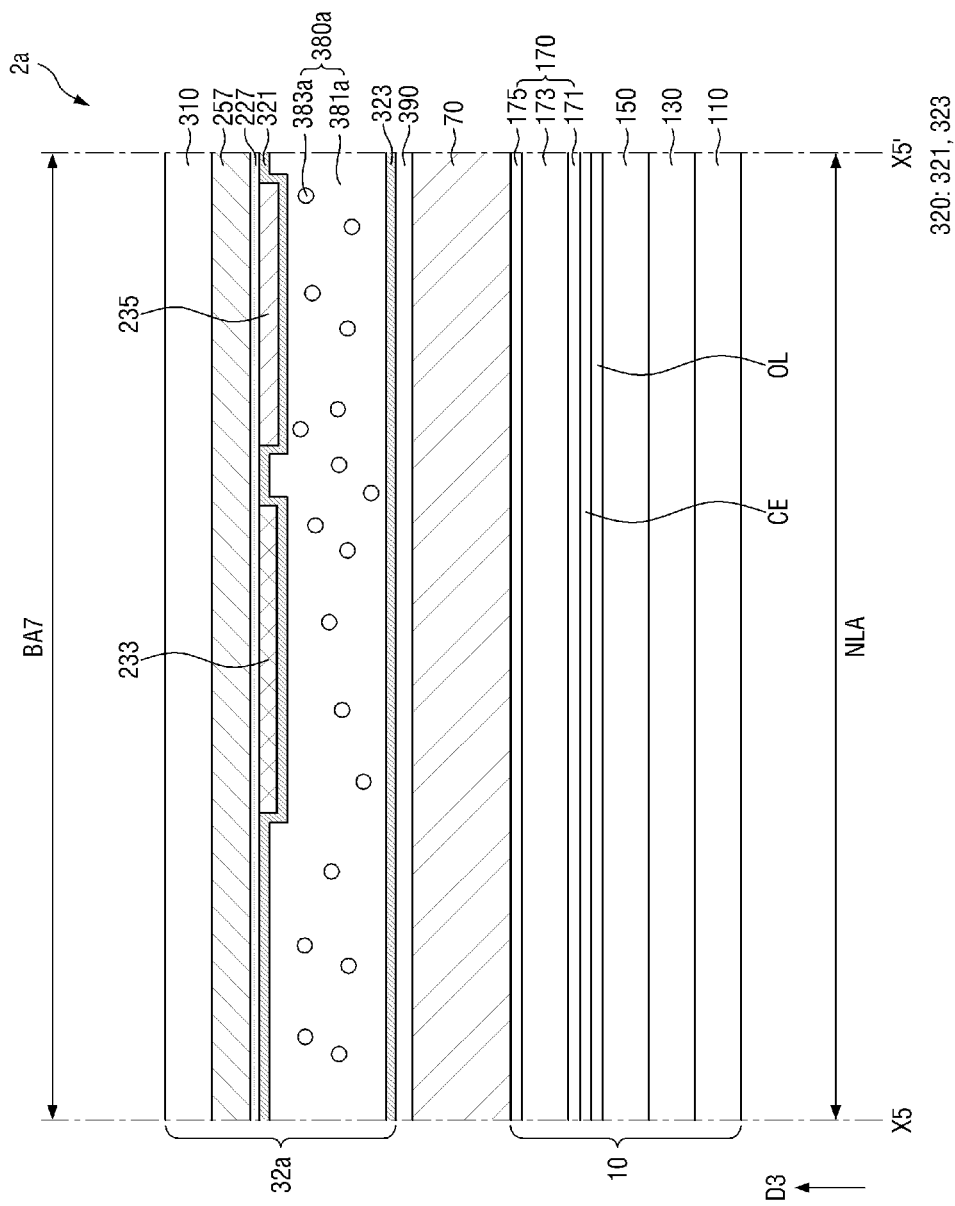
FIG. 48 is a cross-sectional view of the display device according to still another alternative embodiment taken along line X5-X5' of FIGS. 3 and 4.

FIG. 44 is a cross-sectional view of a display device according to still another alternative embodiment taken along line X1-X1' of FIGS. 3 and 4, FIG. 45 is a cross-sectional view of the display device according to still another alternative embodiment taken along line X2-X2' of FIGS. 3 and 4, FIG. 46 is a cross-sectional view of the display device according to still another alternative embodiment taken along line X3-X3' of FIGS. 3 and 4, FIG. 47 is a cross-sectional view of the display device according to still another alternative embodiment taken along line X4-X4' of FIGS. 3 and 4, and FIG. 48 is a cross-sectional view of the display device according to still another alternative embodiment taken along line X5-X5' of FIGS. 3 and 4.

Referring to FIGS. 44 to 48, an embodiment of a display device 2a includes a display substrate 10, a color conversion substrate 32a, and a filler 70. The display device 1a of FIGS. 44 to 48 is substantially the same as the display device of FIGS. 37 to 43 except for the color conversion substrate 32a, in particular, except that the color conversion substrate 32a includes a partition wall 380a. Therefore, any repetitive detailed description of the same or like elements as those described above will be omitted, and features different from those described above will be mainly described.

The partition wall 380a may be positioned over the entire light blocking area BA in a plan view, similar to that described above with reference to FIGS. 37 to 43.

The partition wall 380a may include a base resin 381a and scatterers 383a dispersed in the base resin 381a.

The base resin 381a may include or be made of a material having high light transmittance. In some embodiments, the base resin 381a may include or be made of an organic material.

The scatterer 383a may have a refractive index different from that of the base resin 381a, and may form an optical interface with the base resin 381a. In an embodiment, for example, the scatterers 383a may be light scattering particles. The scatterer 383a is not particularly limited as long as it is a material capable of scattering at least a portion of transmitted light, but may be, for example, a metal oxide particle or an organic particle.

The partition wall 380a may serve as a guide for stably positioning an ink composition for forming the light-transmitting pattern 330, the first wavelength conversion pattern 340, and the second wavelength conversion pattern 350 at desired positions, and prevent the occurrence of color mixing between light-transmitting areas neighboring to each other. A more detailed description of a color mixing preventing function of the partition wall 380a is substantially the same as or similar to the description of the color mixing preventing member described above with reference to FIGS. 31 to 36, and will thus be omitted.

Embodiments of the color conversion substrate and the display device including the color conversion substrate may reduce distortion of colors due to external light reflection and improve a display quality. In such embodiments, the color conversion substrate and the display device including the color conversion substrate may recycle the blue light, and may thus improve light efficiency.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

The invention claimed is:

1. A color conversion substrate comprising:
    a base part in which a first light-transmitting area and a second light-transmitting area are defined;
    a first stack disposed on the base part and a second stack disposed on the first stack;
    a first wavelength conversion pattern overlapping the second light-transmitting area, and disposed on the second stack, wherein the first wavelength conversion pattern converts light of a first color into light of a second color; and
    a light-transmitting pattern overlapping the first light-transmitting area and disposed between the first stack and the second stack,
    wherein portions of the first stack and the second stack in the second light-transmitting area are in direct contact with each other to constitute a blue light reflective layer.

2. The color conversion substrate of claim 1, wherein a portion of the first stack in the first light-transmitting area which is not in contact with the second stack and a portion of the second stack in the first light-transmitting area which is not in contact with the first stack transmit blue light.

3. The color conversion substrate of claim 1, wherein the first stack includes a first layer and a second layer having different refractive indices from each other, and the second stack includes a third layer and a fourth layer having different refractive indices from each other.

4. The color conversion substrate of claim 3, wherein a refractive index of the first layer is substantially the same as a refractive index of the fourth layer, and a refractive index of the second layer is substantially the same as a refractive index of the third layer.

5. The color conversion substrate of claim 3, wherein each of the first layer, the second layer, the third layer and the fourth layer is provided in plural, the first stack has a structure in which the first layers and the second layers are alternately stacked one on another, and wherein the second stack has a structure in which the third layers and the fourth layers are alternately stacked one on another.

6. The color conversion substrate of claim 5, wherein portions of the first stack and the second stack in the first light-transmitting area are in contact with the light-transmitting pattern, and wherein a refractive index of a layer in contact with the light-transmitting pattern among the first layers and the second layers is different from a refractive index of a layer in contact with the light-transmitting pattern among the third layers and the fourth layers.

7. The color conversion substrate of claim 5, wherein one of portions of the first layers and the second layers in the second light-transmitting area is in direct contact with the second stack and one of portions of the third layers and the fourth layers in the second light-transmitting area is in direct contact with the first stack, and wherein a refractive index of a layer in contact with the second stack among the first layers and the second layers is different from a refractive index of a layer in contact with the first stack among the third layers and the fourth layers.

8. The color conversion substrate of claim 5, wherein:
    the first layer and the second layer include different inorganic materials from each other,
    the third layer includes a same material as one of the first layer and the second layer,
    the fourth layer includes a same material as the other of the first layer and the second layer,
    portions of the first stack and the second stack in the first light-transmitting area are in contact with the light-transmitting pattern, and
    a layer in contact with the light-transmitting pattern among the first layers and the second layers and a layer in contact with the light-transmitting pattern among the third layers and the fourth layers include different inorganic materials from each other.

9. The color conversion substrate of claim 3, wherein:
    the number of layers included in the first stack is two or more and nine or less, and
    the number of layers included in the second stack is two or more and nine or less.

10. The color conversion substrate of claim 9, wherein the number of layers included in the blue light reflective layer is 11 or more and 18 or less.

11. The color conversion substrate of claim 1, wherein a light blocking area is further defined between the first light-transmitting area and the second light-transmitting area in the base part, and
    wherein the color conversion substrate further comprises:
    a first color filter overlapping the first light-transmitting area, and disposed between the first stack and the base part, wherein the first color filter transmits the light of the first color, and blocks the light of the second color;
    a second color filter overlapping the second light-transmitting area, and disposed between the first stack and the base part, wherein the second color filter transmits the light of the second color, and blocks the light of the first color; and
    a light blocking member overlapping the light blocking area and disposed between the first stack and the base part,
    wherein the first stack is in contact with the first color filter and the second color filter.

12. The color conversion substrate of claim 11, further comprising:
    a color pattern overlapping the light blocking area and disposed between the light blocking member and the base part,
    wherein the color pattern and the first color filter include a same colorant as each other.

13. The color conversion substrate of claim 12, wherein a third light-transmitting area is further defined in the base part,
    wherein the first stack and the second stack are further disposed in the third light-transmitting area,
    wherein the color conversion substrate further comprises:
    a third color filter disposed between the base part and the first stack and overlapping the third light-transmitting area; and
    a second wavelength conversion pattern overlapping the third light-transmitting area, and disposed on the second stack, wherein the second wavelength conversion pattern converts the light of the first color into light of a third color different from the light of the second color.

14. The color conversion substrate of claim 11, further comprising:
a capping layer disposed on the first wavelength conversion pattern and covering the first wavelength conversion pattern and the second stack; and
a color mixing preventing member disposed on the capping layer and disposed between the light-transmitting pattern and the first wavelength conversion pattern,
wherein the capping layer is in contact with the second stack in the first light-transmitting area and in contact with the first wavelength conversion pattern in the second light-transmitting area.

15. The color conversion substrate of claim 14, wherein the color mixing preventing member includes a base resin having light-transmitting properties and scatterers disposed in the base resin.

16. The color conversion substrate of claim 11, further comprising:
a partition wall disposed in the light blocking area and disposed between the first stack and the second stack; and
a capping layer disposed on the first wavelength conversion pattern and covering the first wavelength conversion pattern, the second stack, and the partition wall,
wherein the light-transmitting pattern is in contact with the partition wall,
wherein the first wavelength conversion pattern is in contact with the capping layer and the second stack covering the partition wall, and
wherein the capping layer is in contact with the second stack in the first light-transmitting area and in contact with the first wavelength conversion pattern in the second light-transmitting area.

17. The color conversion substrate of claim 16, wherein the partition wall includes a base resin having light-transmitting properties and scatterers disposed in the base resin.

18. A display device comprising:
a first base part in which a first emission area and a second emission area are defined;
a first light emitting element disposed on the first base part and overlapping the first emission area;
a second light emitting element disposed on the first base part and overlapping the second emission area;
a thin film encapsulation layer disposed on the first light emitting element and the second light emitting element;
a second base part disposed on the thin film encapsulation layer;
a blue color filter disposed on one surface of the second base part facing the thin film encapsulation layer and overlapping the first light emitting element;
a red color filter disposed on one surface of the second base part and overlapping the second light emitting element;
a first stack disposed on the red color filter and a second stack disposed on the first stack;
a wavelength conversion pattern overlapping the red color filter and disposed on the second stack; and
a light-transmitting pattern overlapping the blue color filter and disposed between the first stack and the second stack,
wherein each of the first light emitting element and the second light emitting element includes a light layer which emits blue light,
wherein the wavelength conversion pattern converts the blue light into red light, and
wherein portions of the first stack and the second stack in an area overlapping the wavelength conversion pattern are in direct contact with each other to constitute a blue light reflective layer.

19. The display device of claim 18, wherein
the wavelength conversion pattern includes a base resin, wavelength shifters dispersed in the base resin, and scatterers dispersed in the base resin, and
wherein each of the wavelength shifters is a quantum dot.

20. The display device of claim 18, wherein each of the first stack and the second stack has a structure in which two layers having different refractive indices from each other are alternately stacked one on another.

21. The display device of claim 20, wherein a difference in refractive index between the two layers is about 0.2 or more and about 0.6 or less.

22. The display device of claim 20, wherein the sum of the number of layers included in the first stack and the number of layers included in the second stack is 11 or more and 19 or less.

23. The display device of claim 18, wherein
the light emitting layer includes a first light emitting layer and a second light emitting layer, wherein each of the first light emitting layer and the second light emitting layer emits the blue light, and
wherein the first light emitting layer and the second light emitting layer overlap each other.

* * * * *